United States Patent
Lee et al.

(10) Patent No.: US 11,720,022 B2
(45) Date of Patent: Aug. 8, 2023

(54) RESIST COMPOUND, METHOD OF FORMING PATTERN USING THE SAME, AND METHOD OF MANUFACTURING SEMICONDUCTOR DEVICE USING THE SAME

(71) Applicant: Inha University Research and Business Foundation, Incheon (KR)

(72) Inventors: Jin-Kyun Lee, Incheon (KR); Hyun-Taek Oh, Incheon (KR); Seok-Heon Jung, Incheon (KR); Jeong-Seok Mun, Gochang-gun (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 477 days.

(21) Appl. No.: 16/788,467

(22) Filed: Feb. 12, 2020

(65) Prior Publication Data
US 2020/0257200 A1    Aug. 13, 2020

(30) Foreign Application Priority Data

Feb. 12, 2019  (KR) .................. 10-2019-0016033
Sep. 16, 2019  (KR) .................. 10-2019-0113359
Jan. 17, 2020  (KR) .................. 10-2020-0006852

(51) Int. Cl.
*G03F 7/039*     (2006.01)
*G03F 7/32*      (2006.01)
(Continued)

(52) U.S. Cl.
CPC ............ *G03F 7/0392* (2013.01); *G03F 7/027* (2013.01); *G03F 7/2004* (2013.01); *G03F 7/325* (2013.01)

(58) Field of Classification Search
CPC ...... G03F 7/0392; G03F 7/027; G03F 7/2004; G03F 7/325; H01L 21/02123;
(Continued)

(56) References Cited

U.S. PATENT DOCUMENTS 7,235,347 B2   6/2007  Wagner et al.
7,410,751 B2   8/2008  DeYoung et al.
(Continued)

FOREIGN PATENT DOCUMENTS

CN    106916180 A    7/2017
JP    2006178004 A   7/2006
(Continued)

OTHER PUBLICATIONS

De Silva, Anuja et al. "Study of the Structure-Properties Relationship of Phenolic Molecular Glass Resists for Next Generation Photolithography." *Chem Mater*. 20 (2008): pp. 1606-1613.
(Continued)

*Primary Examiner* — Pamela H Weiss
*Assistant Examiner* — Richard David Champion
(74) *Attorney, Agent, or Firm* — Cantor Colburn LLP

(57) ABSTRACT

Provided is a resist compound, a method for forming a pattern using the same, and a method for manufacturing a
(Continued)

semiconductor device. According to the present disclosure, the compound may be represented by Formula 1.

[Formula 1]

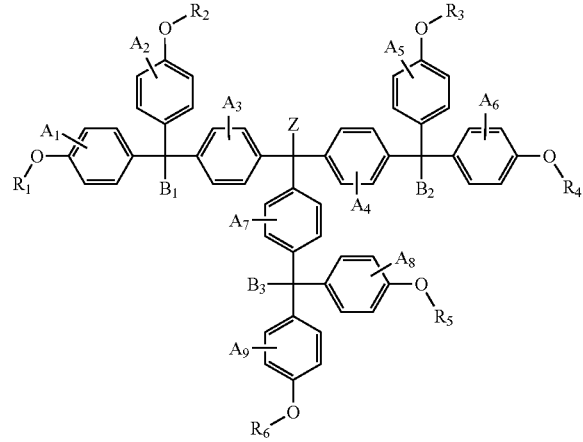

20 Claims, 3 Drawing Sheets

(51) Int. Cl.
*G03F 7/20* (2006.01)
*G03F 7/027* (2006.01)
(58) Field of Classification Search
CPC ............... H01L 51/052; H01L 21/3121; H01L 51/0545; H01L 51/0043; H01L 51/0036; H01L 51/0073; H01L 51/005; H01L 51/0094; H01L 51/0074; H01B 3/38
See application file for complete search history.

(56) References Cited

U.S. PATENT DOCUMENTS

| | | |
|---|---|---|
| 8,703,386 B2 | 4/2014 | Bass et al. |
| 9,057,960 B2 | 6/2015 | Bozano et al. |
| 9,182,662 B2 | 11/2015 | Ongayi et al. |
| 10,007,182 B2 | 6/2018 | Park et al. |
| 2002/0115022 A1* | 8/2002 | Messick .................. G03F 7/322 430/311 |
| 2005/0008976 A1 | 1/2005 | Sakamizu et al. |
| 2011/0260114 A1 | 10/2011 | Wu et al. |
| 2016/0116839 A1 | 4/2016 | Meyers et al. |
| 2017/0199456 A1 | 7/2017 | Park et al. |
| 2017/0271150 A1 | 9/2017 | Chang et al. |
| 2018/0305483 A1 | 10/2018 | Lannuzel et al. |

FOREIGN PATENT DOCUMENTS

| | | |
|---|---|---|
| JP | 2013166931 A | 8/2013 |
| KR | 1020050005779 | 1/2005 |
| KR | 1020140121826 | 10/2014 |
| KR | 1020170074953 | 6/2017 |
| KR | 10-2018-0068991 A | 6/2018 |
| KR | 101901522 B1 | 9/2018 |
| KR | 101923182 B1 | 11/2018 |
| KR | 1020190141895 | 12/2019 |
| WO | WO-2014204516 A1 | 12/2014 |

OTHER PUBLICATIONS

Ouyang, Christine Y. et al. "Environmentally friendly patterning of thin films in linear methyl siloxanes." *J. Mater. Chem.* 22 (2012): pp. 5746-5750.

* cited by examiner

RESIST COMPOUND, METHOD OF FORMING PATTERN USING THE SAME, AND METHOD OF MANUFACTURING SEMICONDUCTOR DEVICE USING THE SAME

CROSS-REFERENCE TO RELATED APPLICATIONS

This U.S. non-provisional patent application claims priority under 35 U.S.C. § 119 of Korean Patent Application Nos. 10-2019-0016033, filed on Feb. 12, 2019, 10-2019-0113359, Sep. 16, 2019, and 10-2020-0006852, filed on Jan. 17, 2020 the entire contents of which are hereby incorporated by reference

BACKGROUND

The present disclosure herein relates to a resist compound, and more particularly to a resist compound used in the manufacture of a semiconductor device.

Photolithography may include a process which causes a chemical structure change in a resist layer by irradiating the resist layer with light of a specific wavelength and selectively removes either an exposed portion or a non-exposed portion by using a difference in solubility between the exposed portion and the non-exposed portion of the resist layer.

In recent years, as semiconductor devices have been highly integrated and miniaturized, there is a demand for semiconductor device components having a fine pitch and width. There is a growing importance of resist compounds for forming fine patterns.

SUMMARY

The present disclosure provides a method for forming a fine width pattern and a resist compound used therein.

The present disclosure is not limited to the subject matter mentioned above, and other matters that are not mentioned above will be clearly understood by those skilled in the art from the following description.

The present disclosure relates to a resist compound, a method for forming a pattern using the same, and a method for manufacturing a semiconductor device using the same. According to the inventive concept, the compound may be represented by Formula 1.

[Formula 1]

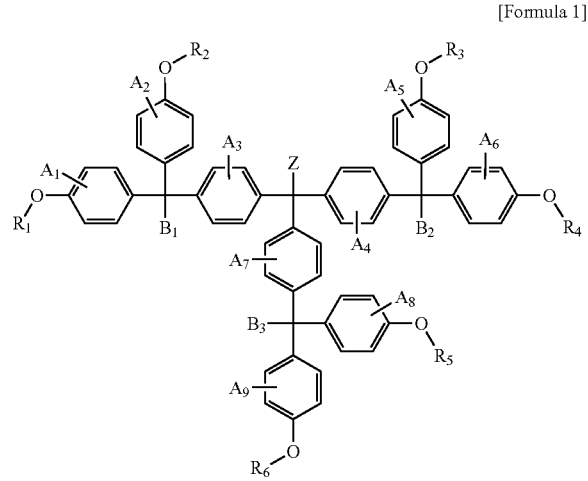

In Formula 1, $A_1$, $A_2$, $A_3$, $A_4$, $A_5$, $A_6$ $A_7$, $A_8$, and $A_9$ are each independently any one of hydrogen, deuterium, and an alkyl group having 1 to 5 carbon atoms, $B_1$, $B_2$, and $B_3$ are each independently any one of hydrogen, deuterium, and an alkyl group having 1 to 5 carbon atoms, Z is any one of hydrogen, deuterium, an alkyl group having 1 to 5 carbon atoms, and a substituted or unsubstituted hydrocarbon ring having 5 to 30 carbon atoms, and $R_1$, $R_2$, $R_3$, $R_4$, $R_5$, and $R_6$ each independently include any one of hydrogen, deuterium, a halogen-substituted alkyl group having 3 to 20 carbon atoms, an alkenyl group having 3 to 20 carbon atoms, a silyl group having 1 to 10 carbon atoms, a carbonyl group having 2 to 10 carbon atoms, and a halogen-substituted hydrocarbon ring having 5 to 20 carbon atoms.

According to the inventive concept, a pattern forming method may include applying a compound represented Formula 1 on a substrate to form a resist layer and patterning the resist layer.

[Formula 1]

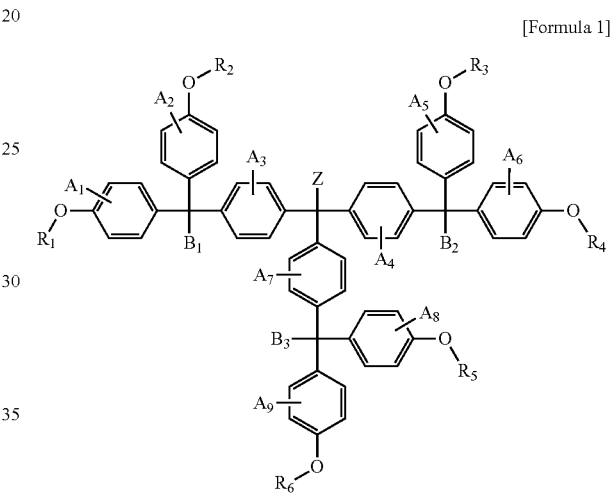

In Formula 1, $A_1$, $A_2$, $A_3$, $A_4$, $A_5$, $A_6$ $A_7$, $A_8$, and $A_9$ are each independently any one of hydrogen, deuterium, and an alkyl group having 1 to 5 carbon atoms, $B_1$, $B_2$, and $B_3$ are each independently any one of hydrogen, deuterium, and an alkyl group having 1 to 5 carbon atoms, Z is any one of hydrogen, deuterium, an alkyl group having 1 to 5 carbon atoms, and a substituted or unsubstituted hydrocarbon ring having 5 to 30 carbon atoms, and $R_1$, $R_2$, $R_3$, $R_4$, $R_5$, and $R_6$ each independently include any one of hydrogen, deuterium, a halogen-substituted alkyl group having 3 to 20 carbon atoms, an alkenyl group having 3 to 20 carbon atoms, a silyl group having 1 to 10 carbon atoms, a carbonyl group having 2 to 10 carbon atoms, and a halogen-substituted hydrocarbon ring having 5 to 20 carbon atoms.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
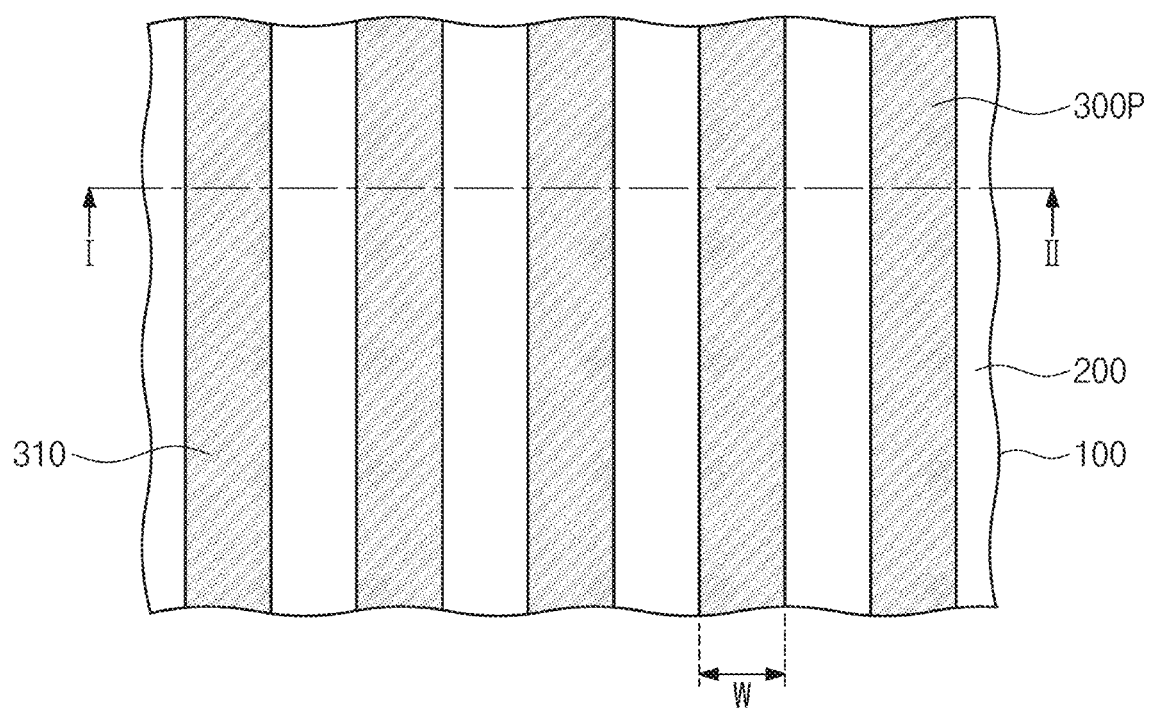
FIG. 1 is a plan view illustrating a resist pattern according to an embodiment of the inventive concept.

In order to help fully understand the configuration and effects of the present disclosure, preferred embodiments of the present disclosure will be explained with reference to the accompanying drawings. However, the present disclosure should not be construed as limited to the embodiments set forth herein and may be embodied in different forms and various changes can be made. These embodiments are provided so that this disclosure will be thorough and complete, and will fully convey the scope of the invention to those skilled in the art. Those skilled in the art will appreciate that the concept of the present disclosure may be carried out in a certain suitable environment.

The terms used in the present disclosure are for explaining the exemplary embodiments rather than limiting the present disclosure. Unless particularly stated otherwise in the present specification, a singular form also includes a plural form. The meaning of "comprises" and/or "comprising" used in this specification does not exclude the existence or addition of one or more other elements in addition to the mentioned elements.

In the description, an alkyl group may be a linear alkyl group, a branched alkyl group, or a cyclic alkyl group. The number of carbon atoms in the alkyl group is not specifically limited, but it may be an alkyl group having 1 to 5 carbon atoms. Examples of the alkyl group include a methyl group, an ethyl group, a n-propyl group, an isopropyl group, a n-butyl group, a t-butyl group, an i-butyl group, a 2-ethyl-butyl group, a 3,3-dimethylbutyl group, a n-pentyl group, an i-pentyl group, a neopentyl group, a t-pentyl group, a cyclopentyl group, etc., but are not limited thereto.

In the description, an alkenyl group may be a linear alkenyl group or a branched alkenyl group. The number of carbon atoms in the alkenyl group is not specifically limited, but may be 1 to 20. Examples of the alkenyl group include a vinyl group, a 1-butenyl group, a 1-pentenyl group, a 1,3-butadienyl aryl group, a styryl group, a styryl vinyl group, etc., but are not limited thereto.

In the description, the alkenyl group may include an allyl group.

In the description, a silyl group may include a silyl group substituted with alkyl and/or an alkenyl group. The number of carbon atoms in the silyl group is not specifically limited, but may be 1 to 10. Examples of the silyl group include a vinyl silyl group and derivatives thereof, but are not limited thereto.

In the description, a carbonyl group may include a carbonyl group substituted with alkyl and/or an alkenyl group. The number of carbon atoms in the carbonyl group is not specifically limited, but may be 2 to 10. Examples of the carbonyl group include a substituted or unsubstituted acrylic group, etc., but are not limited thereto.

In the description, a hydrocarbon ring includes an aliphatic hydrocarbon ring and an aromatic hydrocarbon ring. The hydrocarbon ring may be monocyclic or polycyclic. The carbon number of the aromatic hydrocarbon ring is not specifically limited, but may be 5 to 20. In the description, the aromatic ring may include an aromatic hydrocarbon ring. The heterocycle includes an aliphatic heterocycle and an aromatic heterocycle. The heterocycle may be monocyclic or polycyclic.

In the description, examples of halogen may include fluorine (F), chlorine (Cl), bromine (Br), and iodine (I), etc., but are not limited thereto.

In the description, the term "substituted or unsubstituted" may indicate that one is substituted or unsubstituted with at least one substituent selected from the group consisting of a hydrogen atom, a deuterium atom, a halogen atom, a hydroxyl group, an alkoxy group, an ether group, a halogenated alkyl group, a halogenated alkoxy group, a halogenated ether group, an alkyl group, an alkenyl group, an aryl group, a hydrocarbon ring group, and a heterocyclic group. In addition, each of the substituents exemplified above may be substituted or unsubstituted. For example, a halogenated alkoxy group may be interpreted as an alkoxy group.

Unless otherwise defined in formulas of the description, when a chemical bond is not drawn at a position where the chemical bond is to be drawn, it may indicate that a hydrogen atom is bonded at the position.

In the description, like numbers refer to like elements throughout.

Hereinafter, a resist compound according to the inventive concept of the present disclosure will be described.

According to the present disclosure, the resist compound may be used for forming a pattern or manufacturing a semiconductor device. For example, the resist compound may be used in a patterning process for manufacturing a semiconductor device. The resist compound may be an extreme ultraviolet (EUV) resist compound or an electron beam resist compound. The extreme ultraviolet ray may refer to an ultraviolet ray having a wavelength of about 10 nm to about 124 nm, specifically, a wavelength of about 13.0 nm to about 13.9 nm, and more particularly, a wavelength of about 13.4 nm to about 13.6 nm. According to an embodiment, the resist compound may be represented by Formula 1 below.

[Formula 1]

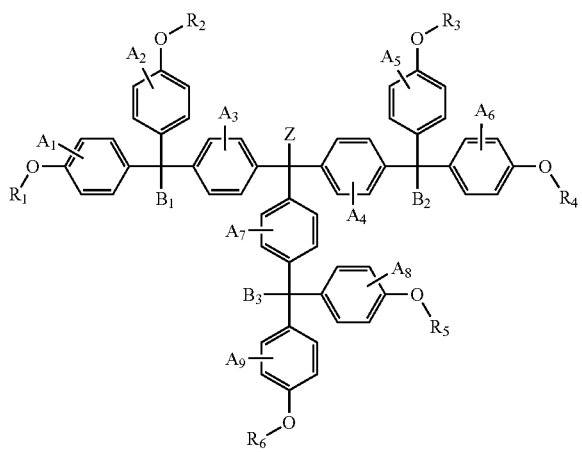

In Formula 1, $A_1$, $A_2$, $A_3$, $A_4$, $A_5$, $A_6$ $A_7$, $A_8$, and $A_9$ are each independently any one of hydrogen, deuterium, and an alkyl group having 1 to 5 carbon atoms, $B_1$, $B_2$, and $B_3$ are each independently any one of hydrogen, deuterium, and an alkyl group having 1 to 5 carbon atoms, Z is any one of hydrogen, deuterium, an alkyl group having 1 to 5 carbon atoms, and a substituted or unsubstituted hydrocarbon ring having 5 to 30 carbon atoms, and $R_1$, $R_2$, $R_3$, $R_4$, $R_5$, and $R_6$ each independently include any one of hydrogen, deuterium, a halogen-substituted alkyl group having 3 to 20 carbon atoms, an alkenyl group having 3 to 20 carbon atoms, a silyl group having 1 to 10 carbon atoms, a carbonyl group having 2 to 10 carbon atoms, and a halogen-substituted hydrocarbon ring having 5 to 20 carbon atoms.

According to an embodiment, at least one of $R_1$, $R_2$, $R_3$, $R_4$, $R_5$, or $R_6$ of Formula 1 may include perhalogenated alkyl or perhalogenated alkyl ether halogenated alkyl, having 1 to 20 carbon atoms. More specifically, at least one of $R_1$, $R_2$, $R_3$, $R_4$, $R_5$, or $R_6$ may include perflouro-alkyl or perflouroalkyl ether halogenated alkyl, having 3 to 20 carbon atoms. In the description, an ether group may include a monoether group and a polyether group.

According to an embodiment, at least one of $R_1$, $R_2$, $R_3$, $R_4$, $R_5$, or $R_6$ may include a functional group represented by Formula 2 below.

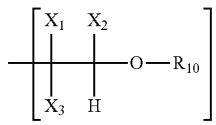

[Formula 2]

In Formula 2, $X_1$, $X_2$, and $X_3$ are each independently halogen, and $R_{10}$ may include perhalogenated alkyl having 1 to 18 carbon atoms or perhalogenated alkyl ether halogenated alkyl having 1 to 18 carbon atoms.

For example, $X_1$, $X_2$, and $X_3$ of Formula 2 may be fluorine. $R_{10}$ of Formula 2 may be perflouroalkyl having 1 to 18 carbon atoms or perflouroalkyl ether flouroalkyl having 1 to 18 carbon atoms.

The material represented by Formula 2 may be any one selected from the materials represented by Formulas 2-1 to 2-3 below.

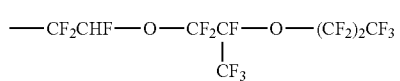

[Formula 2-1]

[Formula 2-2]

[Formula 2-3]

According to another embodiment, at least one of $R_1$, $R_2$, $R_3$, $R_4$, $R_5$, or $R_6$ may include a functional group represented by Formula 2 below.

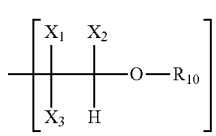

[Formula 2]

According to an embodiment, in Formula 1, at least one of $R_1$, $R_2$, $R_3$, $R_4$, $R_5$, or $R_6$ may include an allyl group.

According to an embodiment, in Formula 1, at least one of $R_1$, $R_2$, $R_3$, $R_4$, $R_5$, or $R_6$ may be represented by Formula 3. For example, in Formula 1, at least one of $R_1$, $R_2$, $R_3$, $R_4$, $R_5$, or $R_6$ may be represented by Formula 2, and another one may be represented by Formula 3.

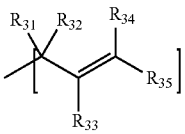

[Formula 3]

In Formula 3, $R_{31}$, $R_{32}$, $R_{33}$, $R_{34}$, and $R_{35}$ are each independently hydrogen, deuterium, or an alkyl group having 1 to 3 carbon atoms.

For example, Formula 3 may include a material represented by Formula 3-1 below.

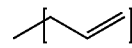

[Formula 3-1]

A carbonyl group having 1 to 10 carbon atoms may be represented by Formula 4. In Formula 1, a silyl group having 1 to 10 carbon atoms may be represented by Formula 5. That is, in Formula 1, at least one of $R_1$, $R_2$, $R_3$, $R_4$, $R_5$, or $R_6$ may be represented by Formula 4 or Formula 5.

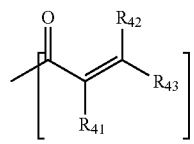

[Formula 4]

In Formula 4, $R_{41}$, $R_{42}$, and $R_{43}$ may be each independently hydrogen, deuterium, or an alkyl group having 1 to 3 carbon atoms.

Formula 4 may include a substituted or unsubstituted acrylic group. Formula 4 may include a material represented by Formula 4-1 or Formula 4-2 below.

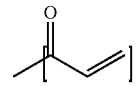

[Formula 4-1]

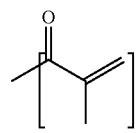

[Formula 4-2]

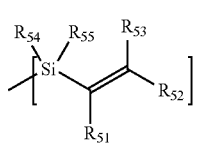

[Formula 5]

In Formula 5, $R_{51}$, $R_{52}$, $R_{53}$, $R_{54}$, and $R_{55}$ may be each independently hydrogen, deuterium, or an alkyl group having 1 to 3 carbon atoms. Formula 5 may include a vinyl silyl group and derivatives thereof.

Formula 5 may include a material represented by Formula 5-1 below.

[Formula 5-1]

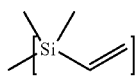

When at least one of $R_1$, $R_2$, $R_3$, $R_4$, $R_5$, or $R_6$ of Formula 1 is represented by Formula 5, a resist layer including the resist compound may have improved sensitivity in an exposure process. Accordingly, efficiency in a manufacturing process of semiconductor devices may be improved.

In an embodiment, in Formula 1, at least one of $R_1$, $R_2$, $R_3$, $R_4$, $R_5$, or $R_6$ may be represented by Formula 2, and another one may be represented by Formula 3, Formula 4, or Formula 5. More specifically, in Formula 1, four of $R_1$, $R_2$, $R_3$, $R_4$, $R_5$, and $R_6$ may be represented by Formula 2, and the remaining two of $R_1$, $R_2$, $R_3$, $R_4$, $R_5$, and $R_6$ may be represented by Formula 3, Formula 4, or Formula 5. For example, in Formula 1, $R_1$, $R_2$, $R_3$, and $R_4$ may be represented by Formula 2, and $R_5$ and $R_6$ may be represented by Formula 3, Formula 4, or Formula 5.

According to other embodiments, in Formula 1, a carbonyl group having 1 to 10 carbon atoms may be represented by Formula 6. That is, in Formula 1, at least one of $R_1$, $R_2$, $R_3$, $R_4$, $R_5$, or $R_6$ may include a group represented by Formula 6.

[Formula 6]

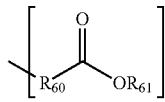

In Formula 6, $R_{60}$ may be a single bond or an alkyl group having 1 to 3 carbon atoms, and $R_{61}$ may be an alkyl group having 1 to 10 carbon atoms.

For example, Formula 6 may include a material represented by Formula 6-1 or 6-2 below.

[Formula 6-1]

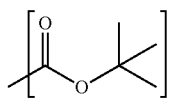

[Formula 6-2]

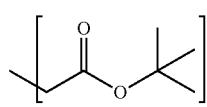

According to an embodiment, at least one of $R_1$, $R_2$, $R_3$, $R_4$, $R_5$, or $R_6$ of Formula 1 may include a halogen-substituted hydrocarbon ring having 5 to 20 carbon atoms.

According to an embodiment, in Formula 1, the halogen-substituted hydrocarbon ring having 5 to 20 carbon atoms may include a halogen-substituted aromatic ring having 5 to 20 carbon atoms.

According to an embodiment, at least one of $R_1$, $R_2$, $R_3$, $R_4$, $R_5$, or $R_6$ of Formula 1 may include a halogen-substituted arene group. For example, the halogen-substituted arene group may include a fluorine-based arene group (fluoroarene).

According to an embodiment, at least one of $R_1$, $R_2$, $R_3$, $R_4$, $R_5$, or $R_6$ may include a functional group represented by Formula 7 below.

[Formula 7]

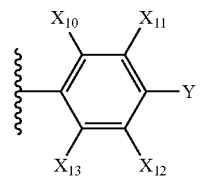

In Formula 7, $X_{10}$, $X_{11}$, $X_{12}$, $X_{13}$, and Y may each independently include halogen, substituted or unsubstituted alkyl having 1 to 5 carbon atoms, and a substituted or unsubstituted alkenyl group having 1 to 5 carbon atoms.

According to an embodiment, in Formula 7, $X_{10}$, $X_{11}$, $X_{12}$, and $X_{13}$ may each independently include halogen and Y may include halogen, substituted or unsubstituted alkyl having 1 to 5 carbon atoms, and a substituted or unsubstituted alkenyl group having 1 to 5 carbon atoms. According to an embodiment, $X_{10}$, $X_{11}$, $X_{12}$, and $X_{13}$ may include the same group as each other. Y may include the same or a different group as $X_{10}$, $X_{11}$, $X_{12}$, and $X_{13}$.

According to an embodiment, in Formula 7, Y may include halogen-substituted alkyl having 1 to 5 carbon atoms. The halogen-substituted alkyl may include perhalogenated alkyl. Specifically, Y may include —$CX_4X_5X_6$, and $X_4$, $X_5$, and $X_6$ may each independently include any one of fluorine, chlorine, bromine, and iodine. According to an embodiment, in Formula 7, Y may include perflouroalkyl having 1 to 5 carbon atoms. In Formula 7, the alkenyl group may include a vinyl group. The vinyl group may be unsubstituted or halogen-substituted.

According to another embodiment, the material represented by Formula 7 may include at least one selected from materials represented by Formulas 7-1, 7-2, 7-3, and 7-4.

[Formula 7-1]

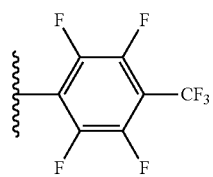

[Formula 7-2]

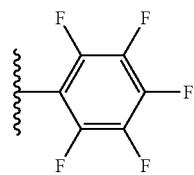

-continued

[Formula 7-3]

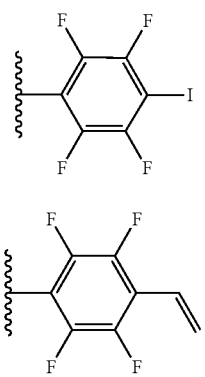

[Formula 7-4]

According to another embodiment, at least one of $R_1$, $R_2$, $R_3$, $R_4$, $R_5$, or $R_6$ may include a functional group represented by Formula 7-5 or Formula 7-6 below.

[Formula 7-5]

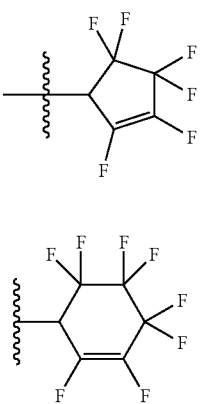

[Formula 7-6]

The functional group represented by Formula 7, the functional group represented by Formula 7-5, and the functional group represented by Formula 7-6 may include an arene group and a halogen element (e.g., fluorine). The arene structure may be a rigid structure. Accordingly, glass transition temperature and physical/chemical properties of a resist compound may be improved. The physical/chemical properties of the resist compound may include etch resistance. The resist compound may have a high absorption property for extreme ultraviolet and high energy electron beams.

According to an embodiment, in Formula 1, Z may be any one of hydrogen, deuterium, an alkyl group having 1 to 5 carbon atoms, and a substituted or unsubstituted aromatic ring having 5 to 15 carbon atoms.

According to other embodiments, in Formula 1, Z may include a substituted or unsubstituted aromatic ring having 20 to 50 carbon atoms. For example, in Formula 1, Z may include at least three substituted or unsubstituted aromatic rings. In Formula 1, Z may be represented by Formula Z below.

[Formula Z]

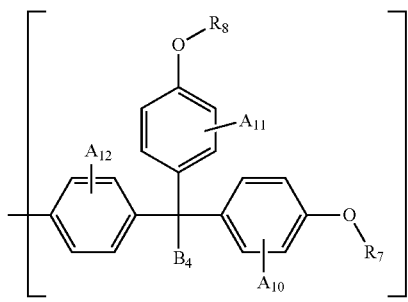

In Formula Z, $R_7$ and $R_8$ are each independently at least one of hydrogen, deuterium, a halogen-substituted alkyl group having 3 to 20 carbon atoms, an alkenyl group having 3 to 20 carbon atoms, a silyl group having 1 to 10 carbon atoms, or a carbonyl group having 1 to 10 carbon atoms, $A_{10}$, $A_{11}$, and $A_{12}$ are each independently any one of hydrogen, deuterium, and an alkyl group having 1 to 5 carbon atoms, and B4 may be independently hydrogen, deuterium, or an alkyl group having 1 to 5 carbon atoms.

Formula A may include a material represented by Formula Z1 below

[Formula Z1]

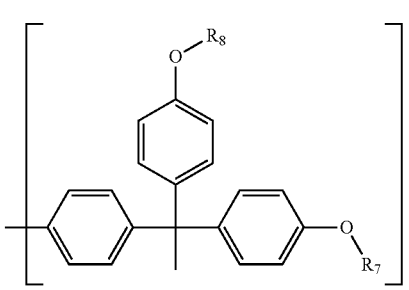

In Formula Z, $R_7$ and $R_8$ may be each independently any one of Formulas 2-2 and 2-3.

In Formula 1, Z may include a functional group represented by Formula Z, so that the glass transition temperature of the compound may increase.

According to an embodiment, the resist compound represented by Formula 1 may include materials represented by Formulas 8A, 8B, 8C, 8D, 8E, 8F, 8G, 8H, and/or 8I below.

[Formula 8A]

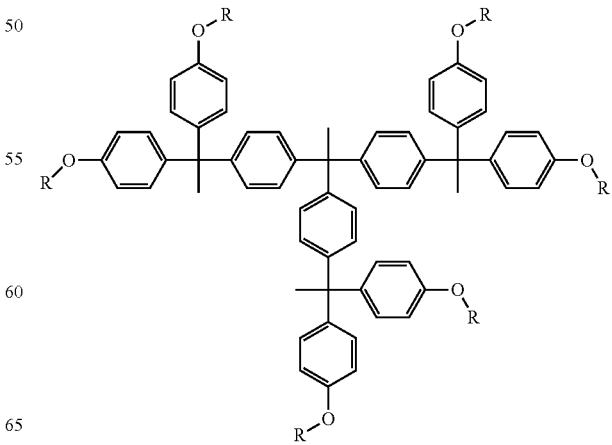

In Formula 8A, R may be represented by Formula 2-1.

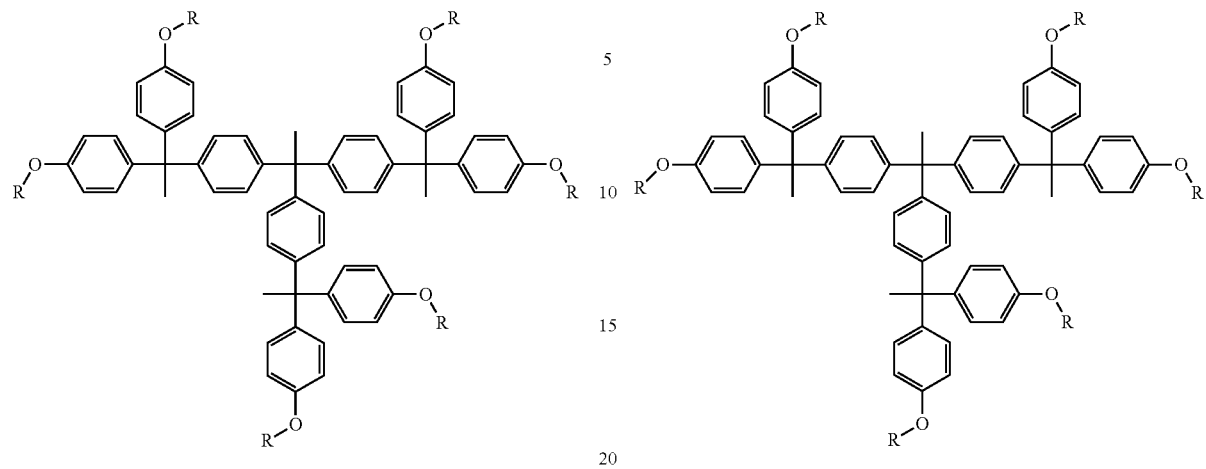

In Formula 8B, R may be represented by Formula 2-2.

In Formula 8C, R may be represented by Formula 2-3.

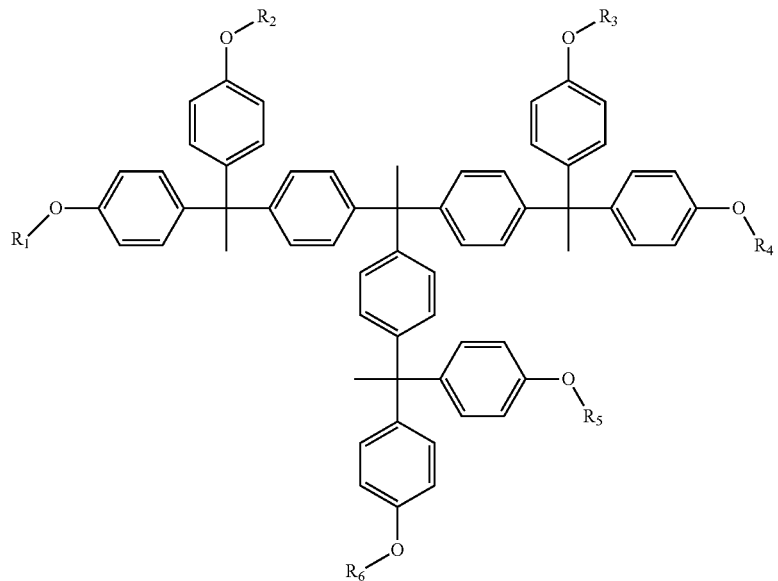

In Formula 8D, $R_1$, $R_2$, $R_3$, $R_4$, $R_5$, and $R_6$ may be each independently represented by Formula 2-1 or Formula 3-1. In this case, at least one of $R_1$, $R_2$, $R_3$, $R_4$, $R_5$, or $R_6$ may include a functional group represented by Formula 2-1 and another one of $R_1$, $R_2$, $R_3$, $R_4$, $R_5$, or $R_6$ may include a functional group represented by Formula 3-1.

[Formula 8E]

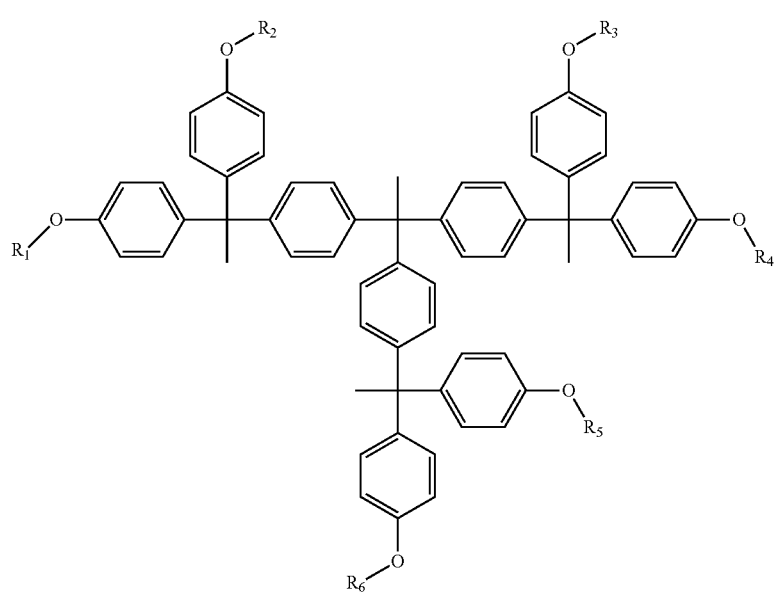

In Formula 8E, $R_1$, $R_2$, $R_3$, $R_4$, $R_5$, and $R_6$ may be each independently represented by Formula 2-2 or Formula 3-1. In this case, at least one of $R_1$, $R_2$, $R_3$, $R_4$, $R_5$, or $R_6$ may include a functional group represented by Formula 2-2 and another one of $R_1$, $R_2$, $R_3$, $R_4$, $R_5$, or $R_6$ may include a functional group represented by Formula 3-1.

[Formula 8F]

[Formula 8G]

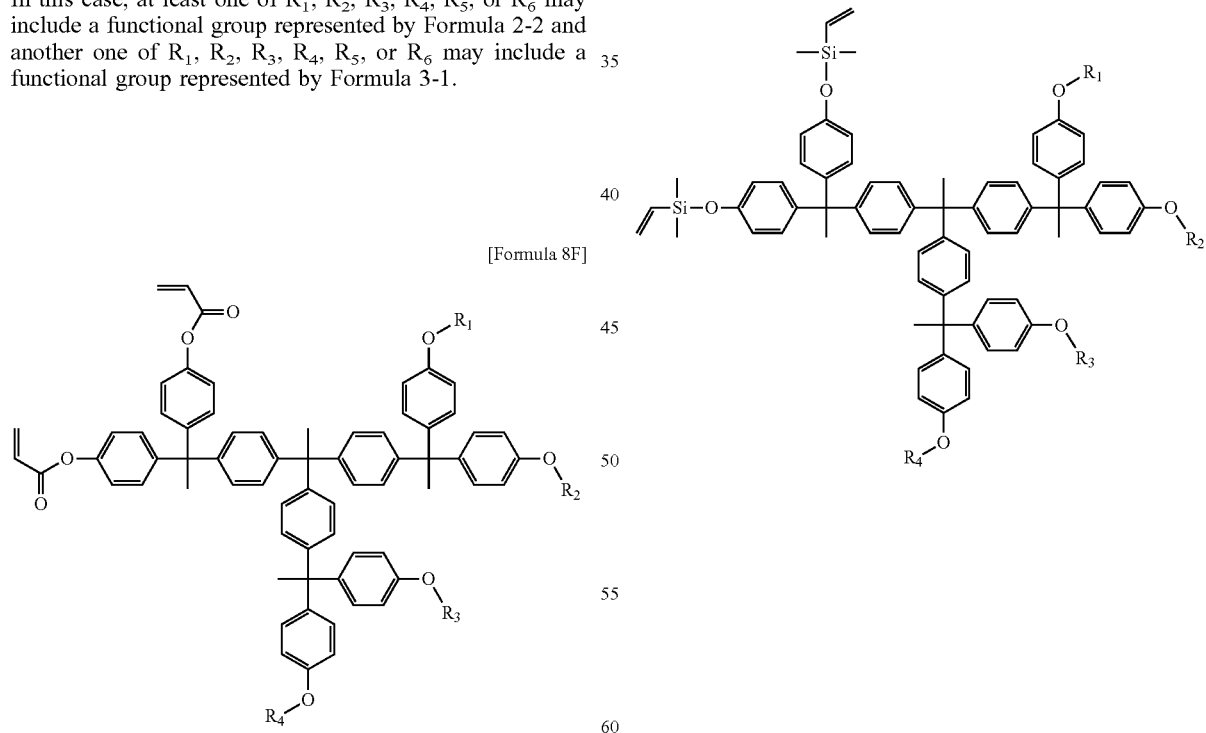

In Formula 8F, $R_1$, $R_2$, $R_3$, and $R_4$ may be represented by Formula 2-2.

In Formula 8G, $R_1$, $R_2$, $R_3$, and $R_4$ may be represented by Formula 2-2.

[Formula 8H]

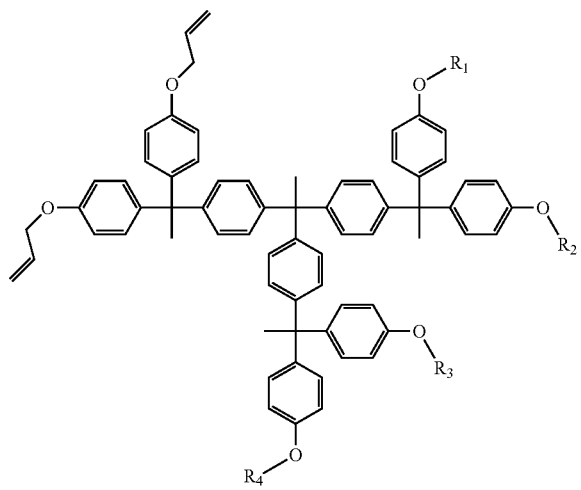

In Formula 8H, $R_1$, $R_2$, $R_3$, and $R_4$ may be represented by Formula 2-2.

[Formula 8I]

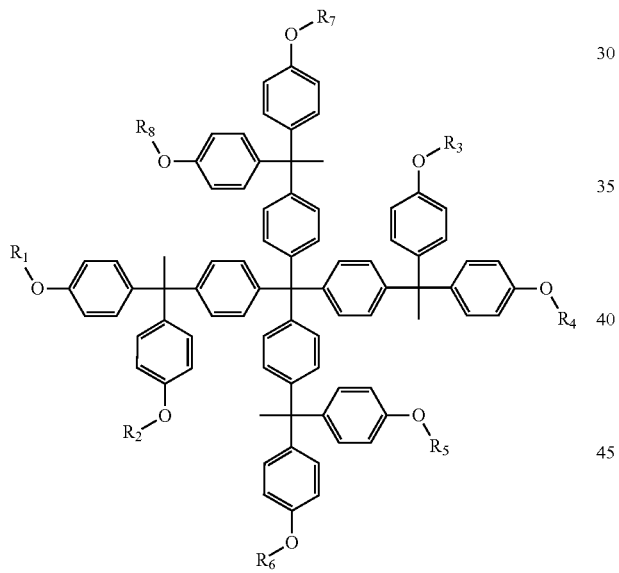

In Formula 8I, $R_1$, $R_2$, $R_3$, $R_4$, $R_5$, $R_6$, $R_7$, and $R_8$ may be each independently represented by hydrogen, Formula 2-2, Formula 2-3, Formula 6-1, or Formula 6-2.

The resist compound may include a core and a functional group. The core of the resist compound may be a single molecule. The core of the resist compound may have a dendrimer shape. For example, the core of the resist compound may include at least 12 hydrocarbon cyclic compounds, specifically, at least 12 benzene rings. Since the core of the resist compound includes a single molecule, the resist compound may have a relatively small molecular weight. For example, the resist compound may have a molecular weight of about 800 to about 3500. Accordingly, the unexposed region of the resist layer manufactured using the resist compound may have high solubility for a developing solution.

The resist compound includes the core to have a relatively high glass transition temperature. For example, the resist compound may have a glass transition temperature of about 130° C. or higher, more specifically, about 130° C. to about 180° C. Accordingly, the pattern formed using the resist compound may have high durability and stability.

The functional group of the resist compound may be bonded to the core. For example, the functional group may be bonded to any one of the benzene rings. The functional group of the resist compound may include a halogen-substituted alkyl group having 3 to 20 carbon atoms, an alkenyl group having 3 to 20 carbon atoms, a silyl group having 1 to 10 carbon atoms, a carbonyl group having 1 to 10 carbon atoms, and a halogen-substituted hydrocarbon ring having 5 to 20 carbon atoms.

Hereinafter, a method for manufacturing a resist compound according to an embodiment will be described.

Manufacturing a resist compound according to an embodiment may include synthesizing a core and bonding functional groups to the core. Synthesizing the core may be performed by Reaction Formula 1 below.

[Reaction Formula 1]

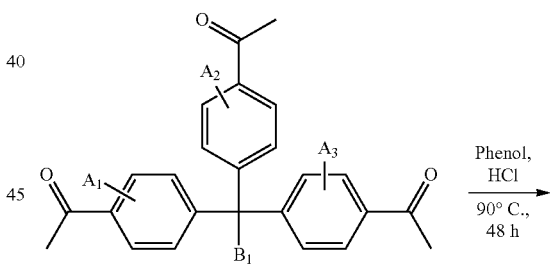

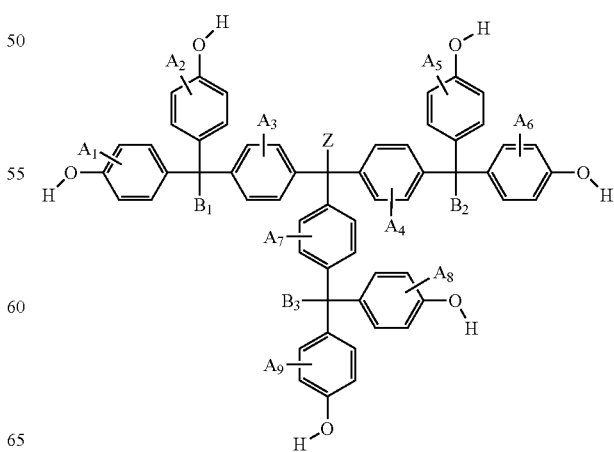

In Reaction Formula 1, $A_1$, $A_2$, $A_3$, $A_4$, $A_5$, $A_6$ $A_7$, $A_8$, and $A_9$ may be each independently any one of hydrogen, deuterium, and an alkyl group having 1 to 5 carbon atoms, $B_1$ and $B_3$ may be each independently any one of hydrogen, deuterium, and an alkyl group having 1 to 5 carbon atoms, and Z may be any one of hydrogen, deuterium, an alkyl group having 1 to 5 carbon atoms, and a substituted or unsubstituted hydrocarbon ring having 5 to 15 carbon atoms.

For example, Formula 1 may be performed by Reaction Formula 1-1 below.

[Reaction Formula 1-1]

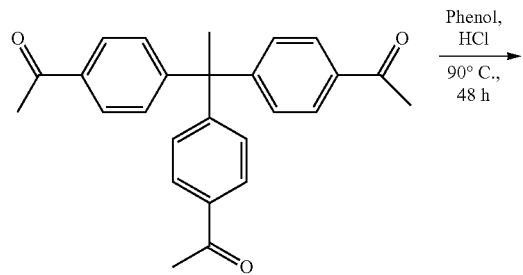

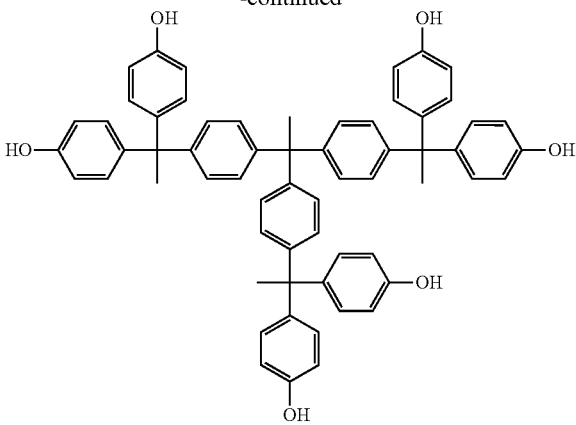

Synthesis of the core may be performed using hydrochloric acid as a single solvent in a pressure reactor such as a seal tube. Other solvents such as acetic acid may not be used in the synthesis of the core. Accordingly, side reactions may be prevented due to using hydrochloric acid as a single solvent and by the help of using a pressure reactor. Thus, according to an embodiment, volatilization of hydrochloric acid may be prevented in the synthesis of the core. As a result, precipitation of an intermediate product may be prevented, and the synthesis yield of the core may increase. For example, the synthetic yield of the core may be about 40% or more, more specifically about 45% to about 100%.

A first resist core may be produced by Reaction Formula 1-1.

Bonding functional groups to the core may be performed by Reaction Formula 2-1 or Formula 2-2 below.

[Reaction Formula 2-1]

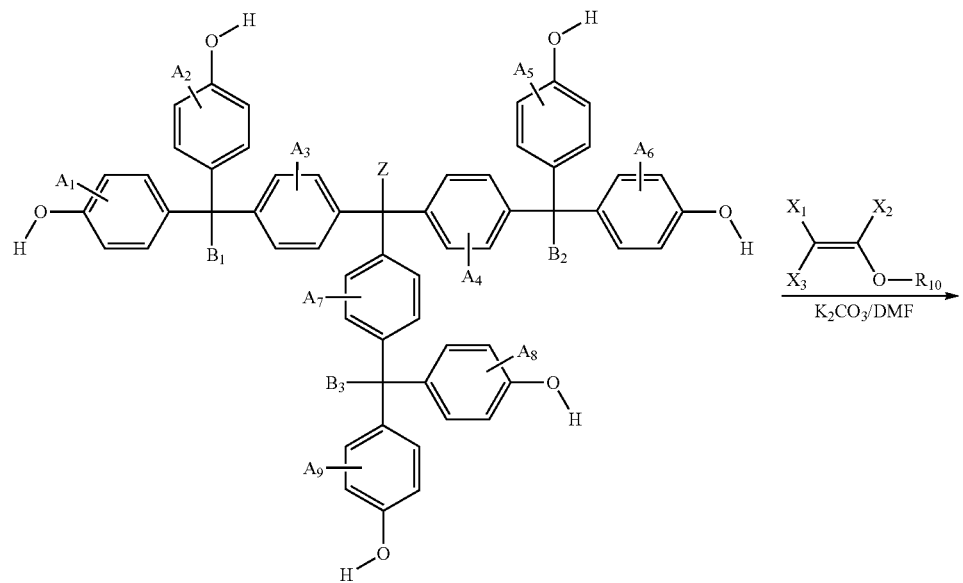

-continued
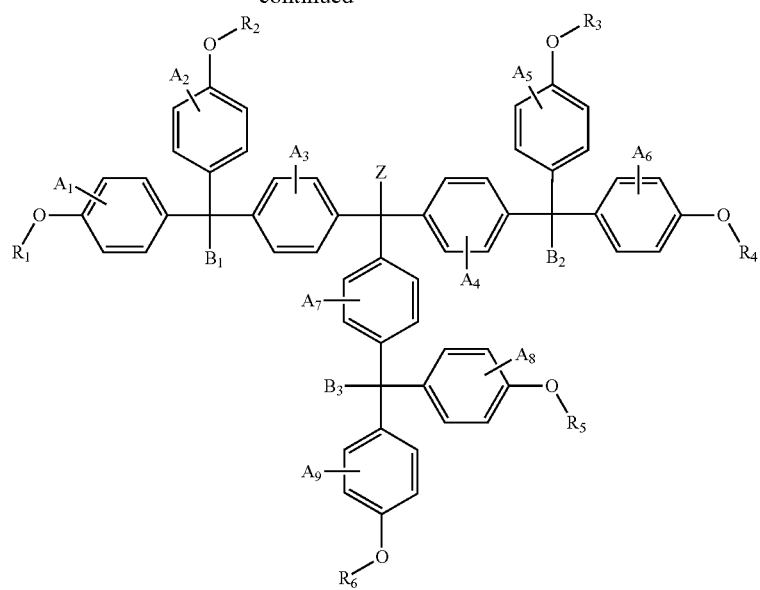
[Reaction Formula 2-2]
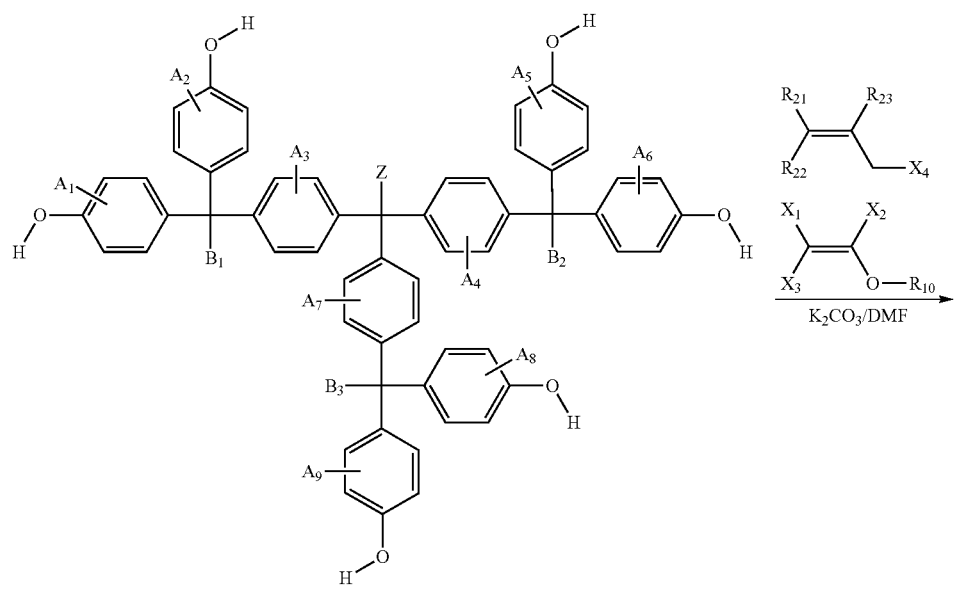

-continued

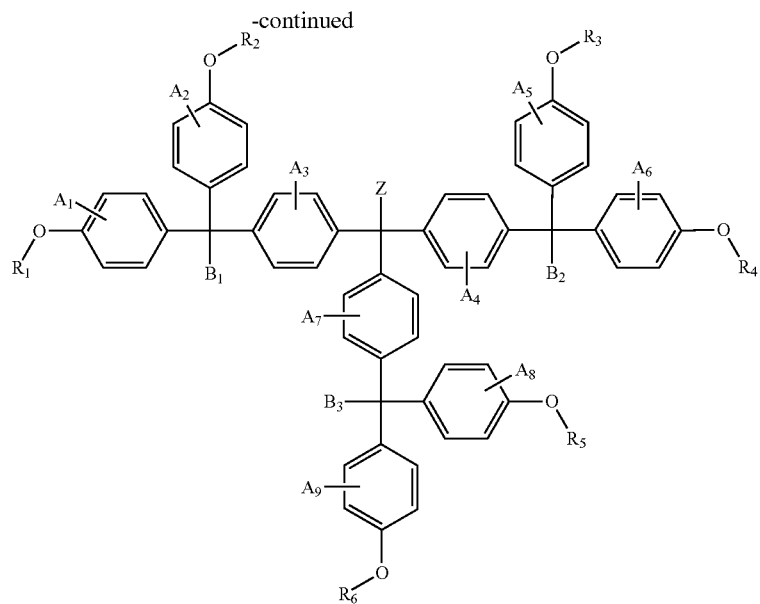

In Reaction Formulas 2-1 and 2-2, $A_1$, $A_2$, $A_3$, $A_4$, $A_5$, $A_6$, $A_7$, $A_8$, $A_9$, $B_1$, $B_2$, $B_3$, Z, $R_1$, $R_2$, $R_3$, $R_4$, $R_5$, and $R_6$ may be the same as defined in Formula 1. DMF may be dimethylformamide.

According to an embodiment, more specific examples of Reaction Formula 2-1 are Reaction Formula 2A, Reaction Formula 2B, or Reaction Formula 2C below. A first resist compound may be produced by Reaction Formula 2A, Reaction Formula 2B, or Reaction Formula 2C.

[Reaction Formula 2A]

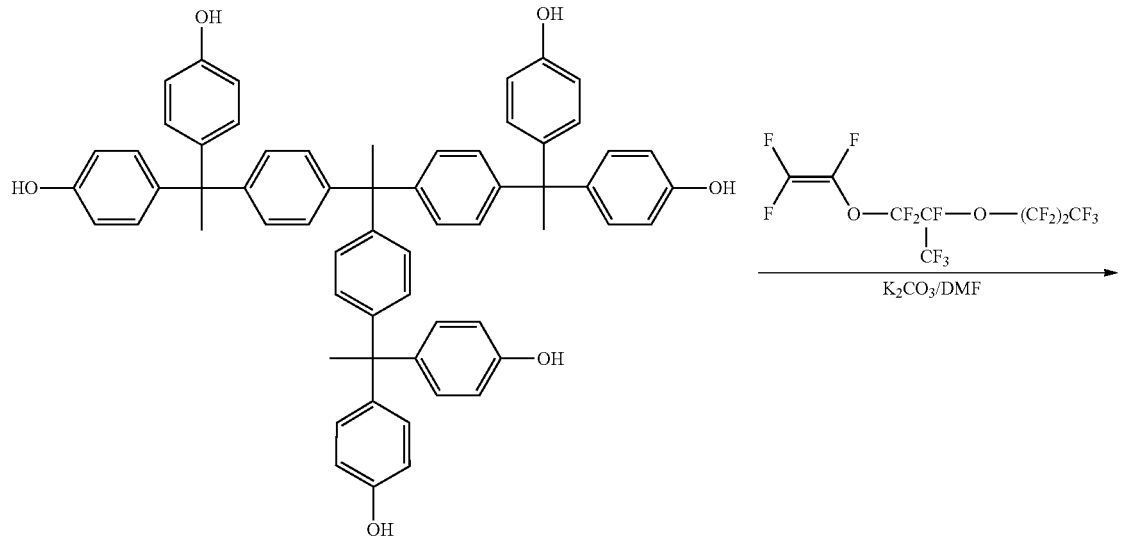

-continued
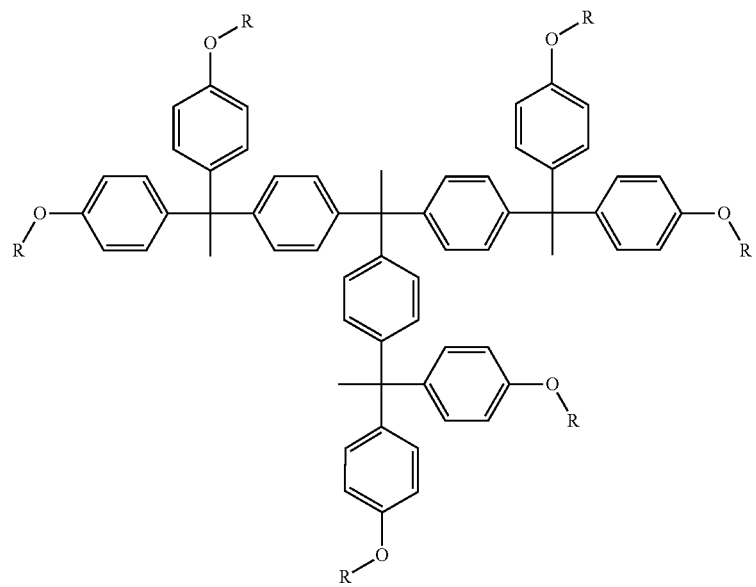
$R = -CF_2CHF-O-CF_2CF-O-(CF_2)_2CF_3$
$\phantom{R = -CF_2CHF-O-CF_2}|$
$\phantom{R = -CF_2CHF-O-CF_2}CF_3$
[Reaction Formula 2B]
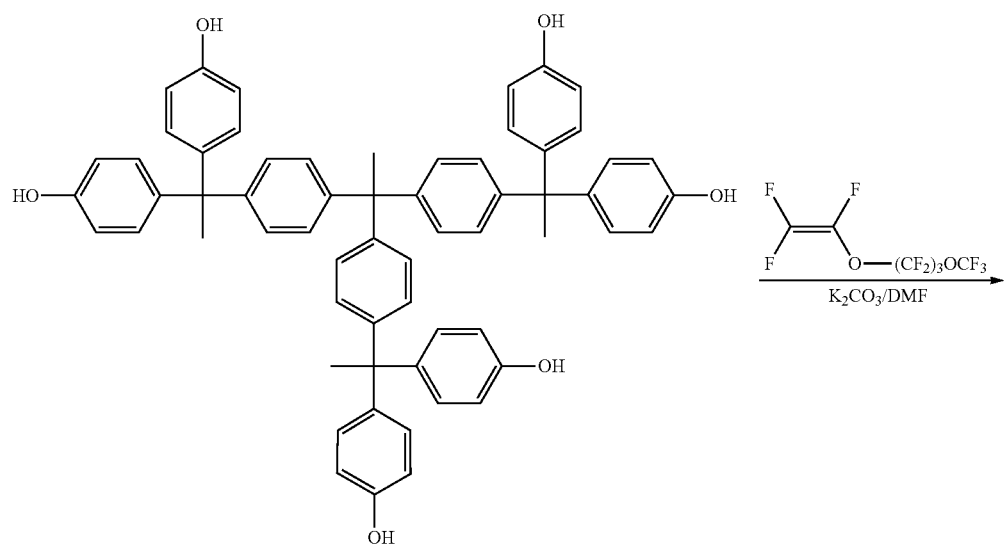

-continued
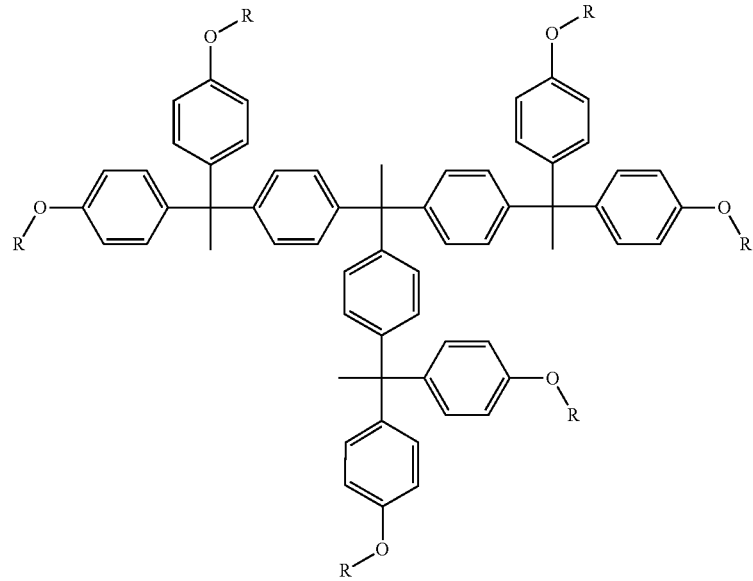
R = —CF$_2$CHFO(CF$_2$)$_3$OCF$_3$
[Reaction Formula 2C]
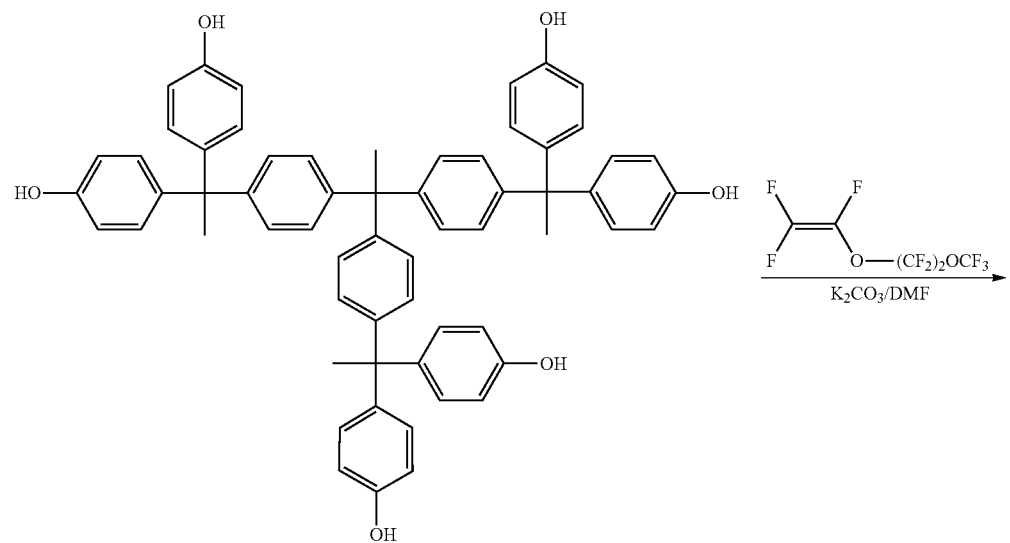

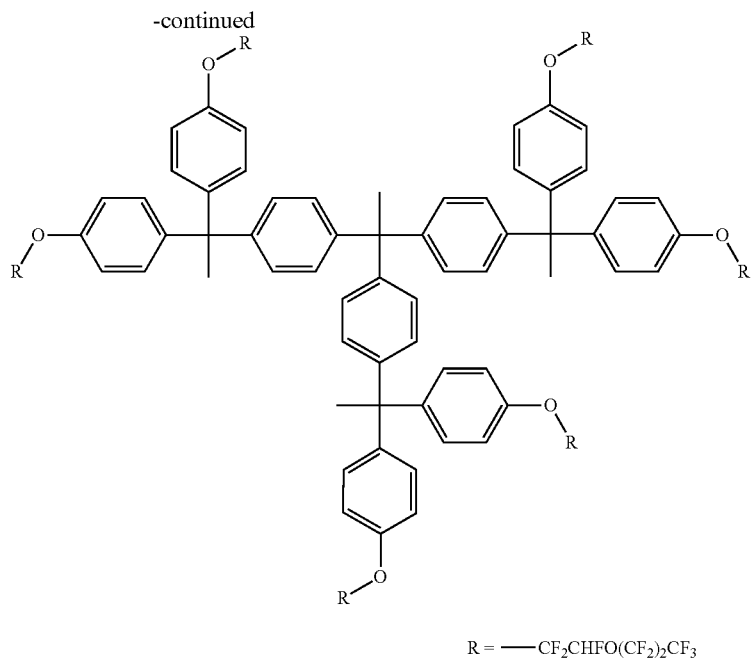
R = —CF$_2$CHFO(CF$_2$)$_2$CF$_3$
In Reaction Formula 2A to 2C, DMF may be dimethylformamide.
According to other embodiments, more specific examples of Reaction Formula 2-2 are Reaction Formula 2D or Reaction Formula 2E below.
[Reaction Formula 2D]
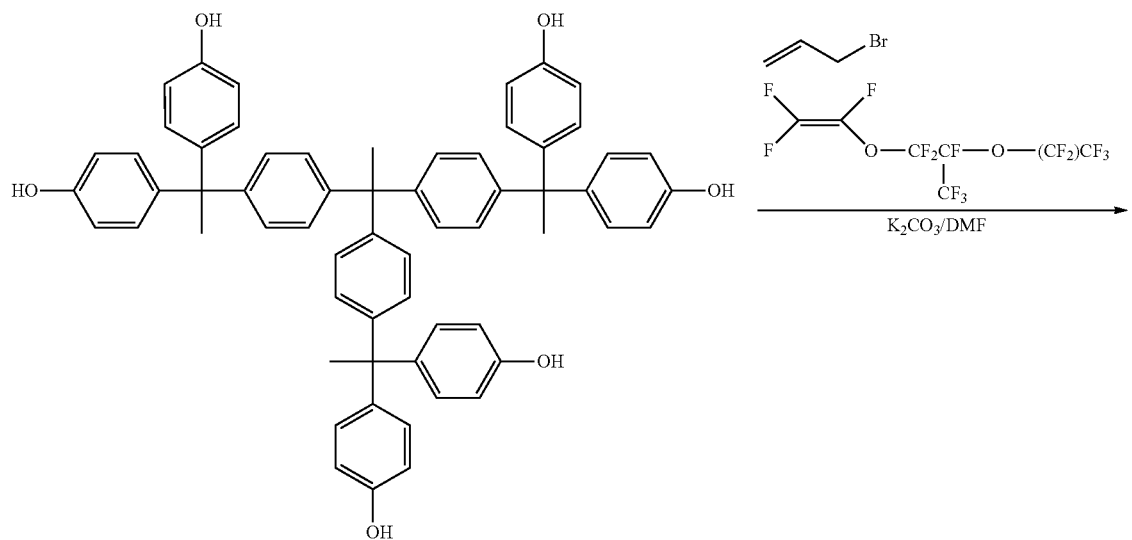

-continued

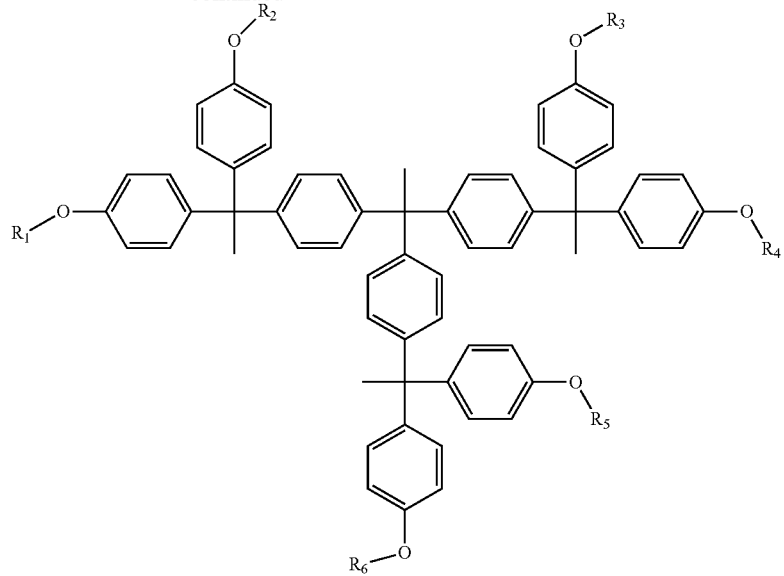

In Reaction Formula 2D, $R_1$, $R_2$, $R_3$, $R_4$, $R_5$, and $R_6$ may be each independently represented by Formula 2-1 and Formula 3-1. In this case, at least one of $R_1$, $R_2$, $R_3$, $R_4$, $R_5$, or $R_6$ may include a functional group represented by Formula 2-1, and another one of $R_1$, $R_2$, $R_3$, $R_4$, $R_5$, or $R_6$ may include a functional group represented by Formula 3-1. DMF may be dimethylformamide.

[Reaction Formula 2E]

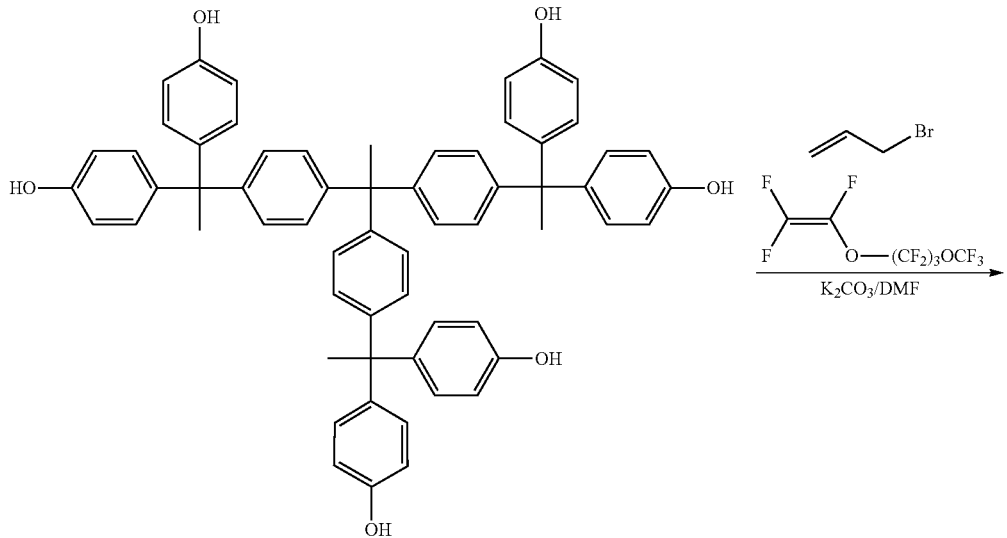

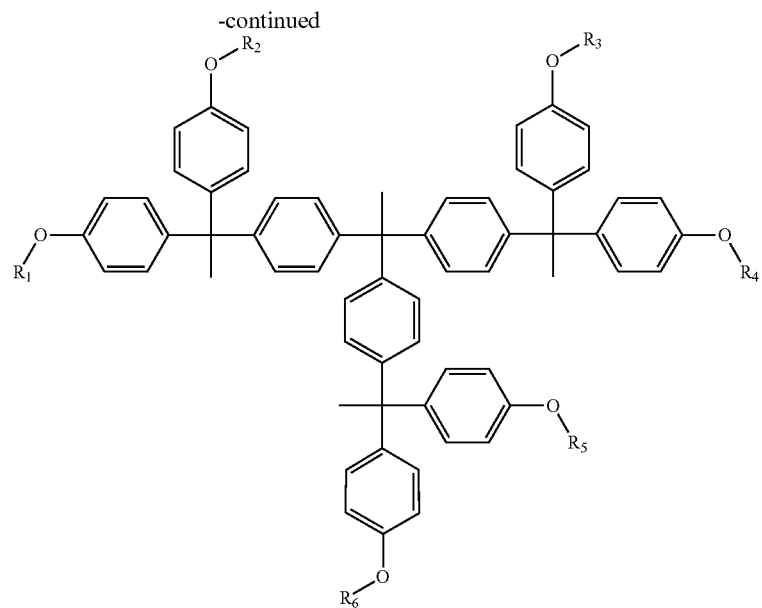

In Reaction Formula 2E, $R_1$, $R_2$, $R_3$, $R_4$, $R_5$, and $R_6$ may be each independently represented by Formula 2-2 and Formula 3-1. In this case, at least one of $R_1$, $R_2$, $R_3$, $R_4$, $R_5$, or $R_6$ may include a functional group represented by Formula 2-2, and another one of $R_1$, $R_2$, $R_3$, $R_4$, $R_5$, or $R_6$ may include a functional group represented by Formula 3-1. DMF may be dimethylformamide.

According to other embodiments, bonding functional groups to the core may be performed by Reaction Formula 2F, Reaction Formula 2G, Reaction Formula 2H, or Reaction Formula 2I below.

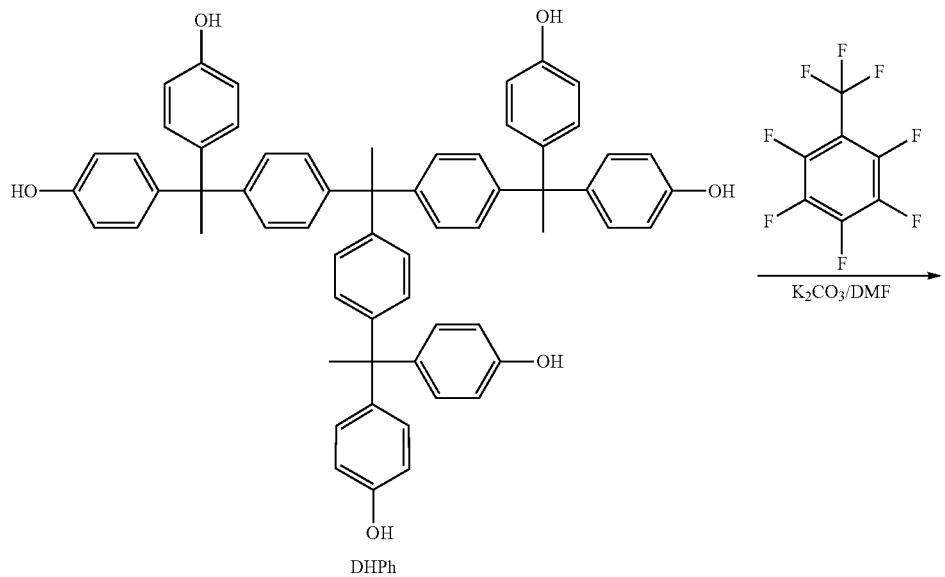

-continued
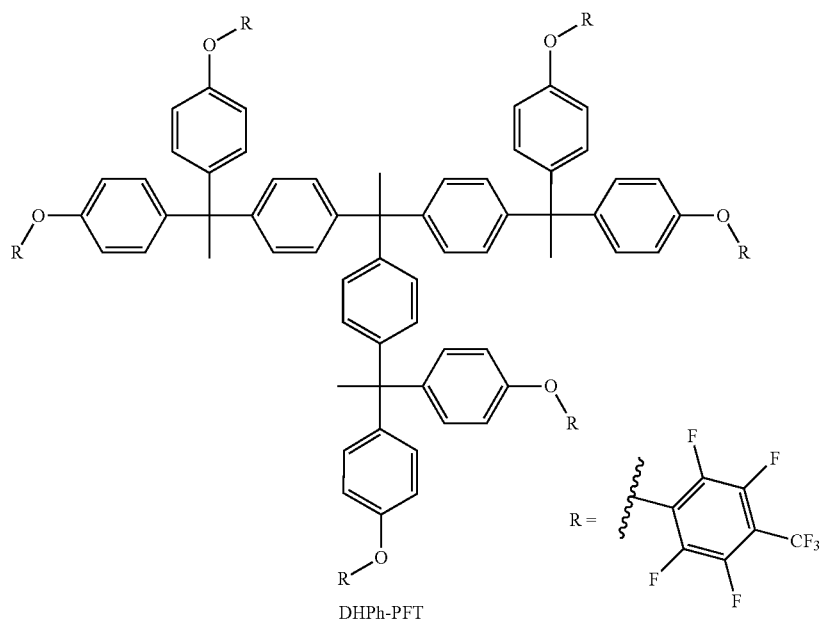
DHPh-PFT
[Reaction Formula 2G]
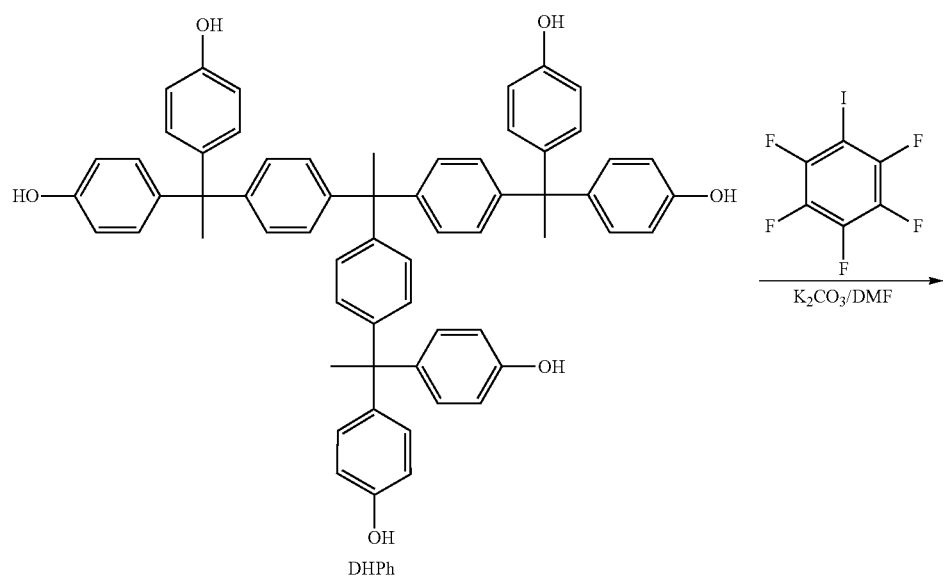
DHPh

-continued
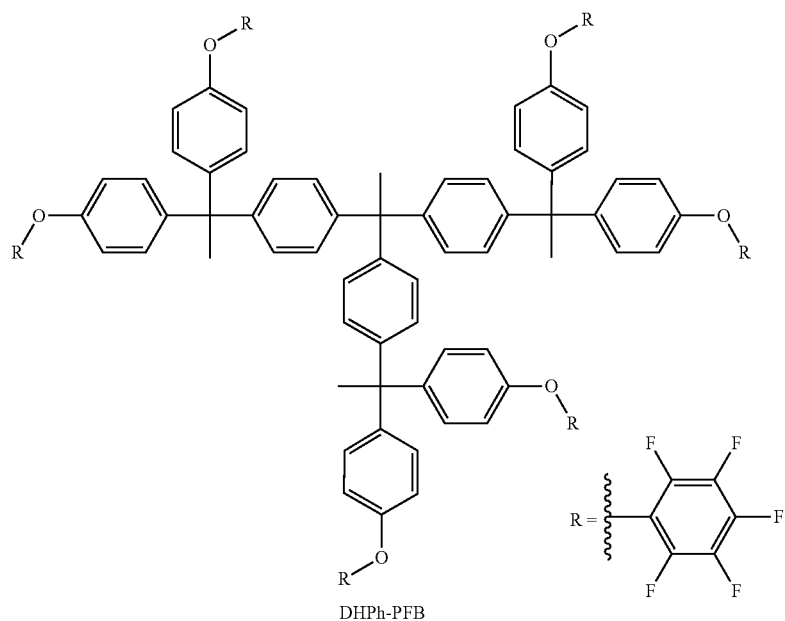
DHPh-PFB
[Reaction Formula 2H]
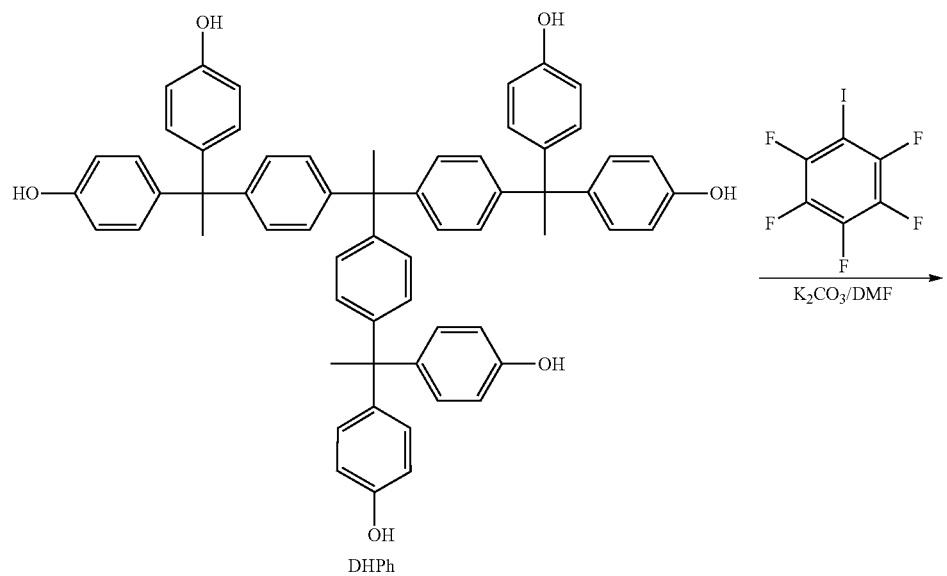
DHPh

-continued
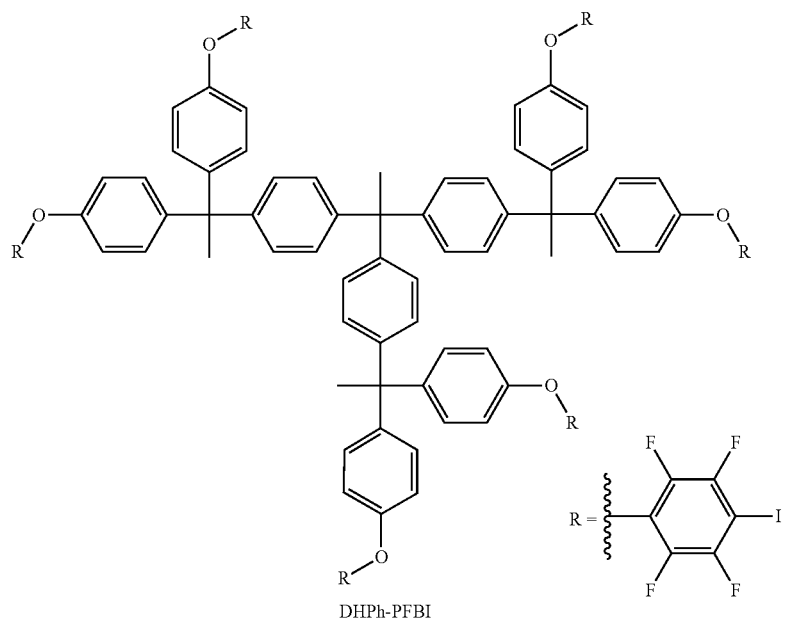
DHPh-PFBI
[Reaction Formula 2I]
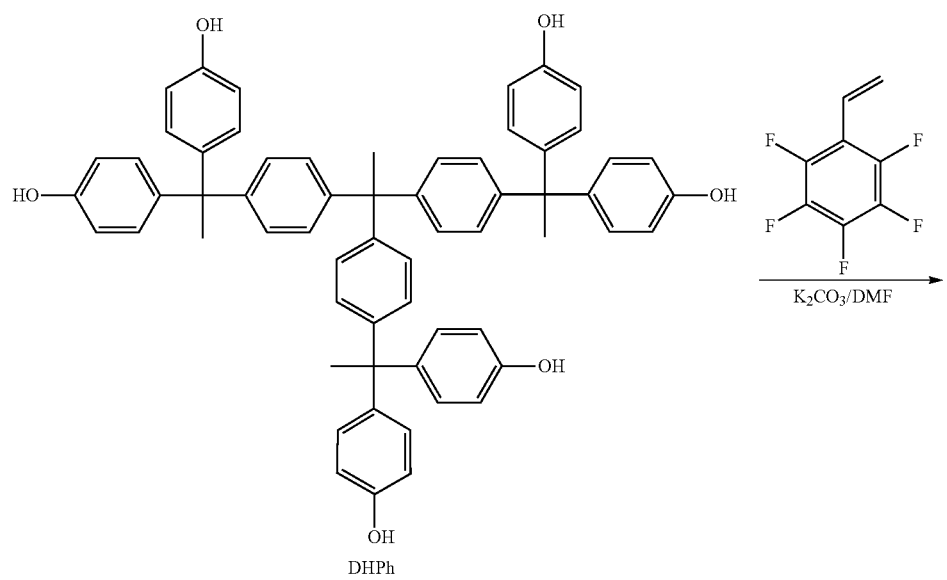
DHPh

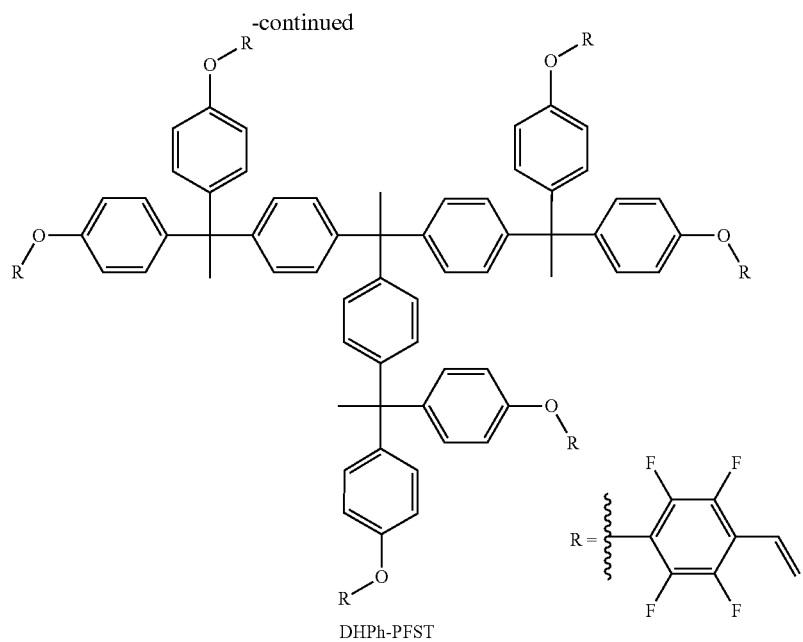
DHPh-PFST
According to other embodiments, bonding functional groups to the core may be performed by Reaction Formula 2J below.
[Reaction Formula 2J]
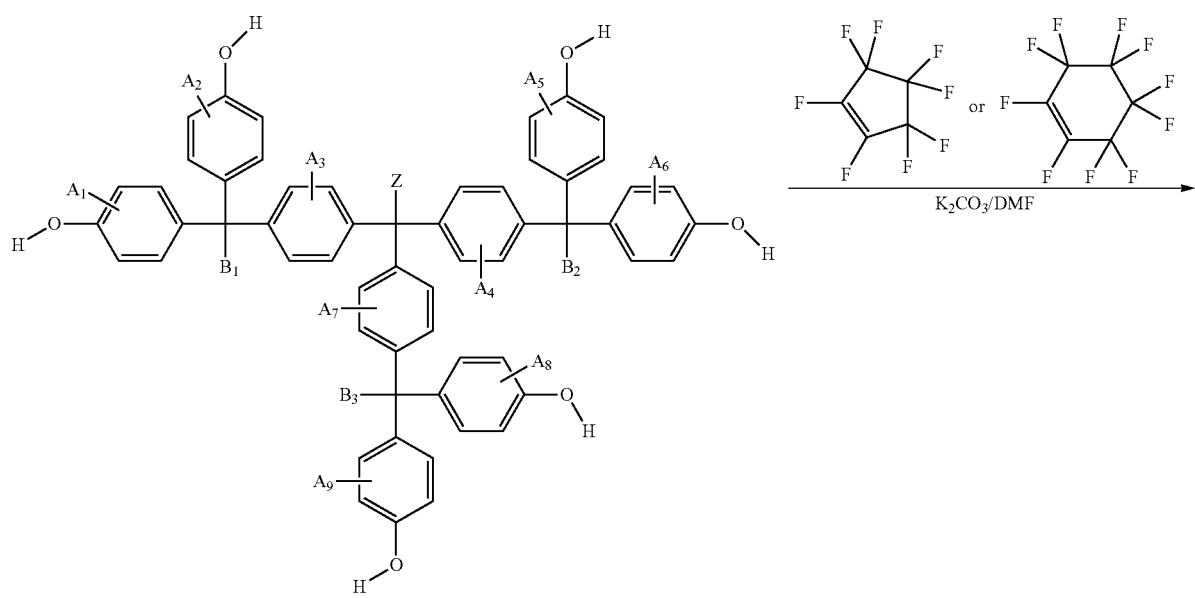

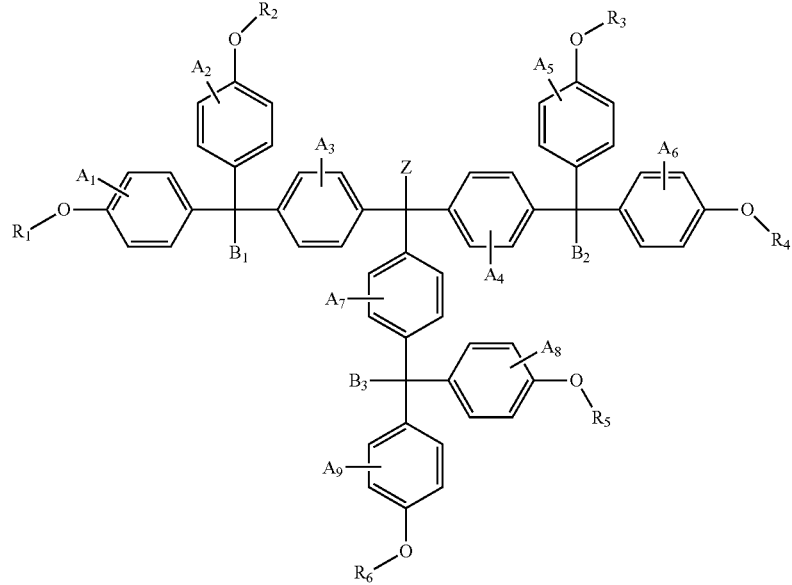

In Reaction Formula 2F to 2J, DMF may be dimethylformamide.

According to another embodiment, manufacturing a resist compound may include preparing a first preliminary resist compound, synthesizing a core from the first preliminary resist compound, preparing a second preliminary resist compound, and bonding functional groups to the second preliminary resist compound.

The first preliminary resist compound may include a preliminary core and functional groups bonded to the preliminary core. Preparing the first preliminary resist compound may be performed by Reaction Formulas 3 and 4. The preliminary core of the first preliminary resist compound may be prepared by Reaction Formula 3.

[Reaction Formula 3]

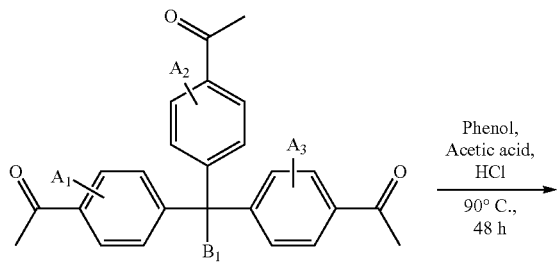

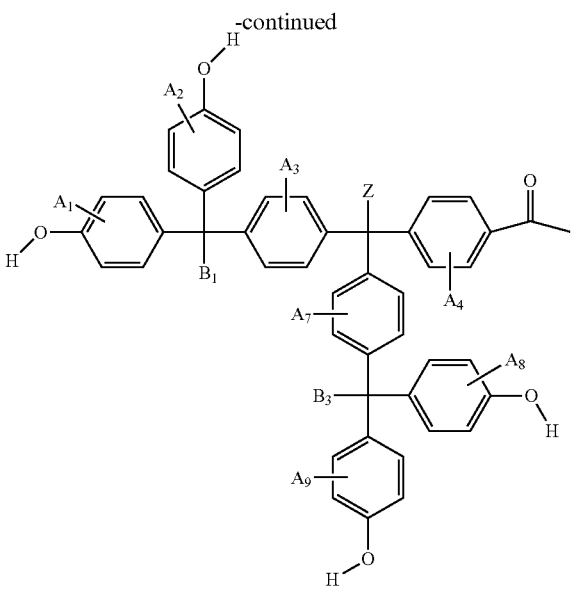

In Reaction Formula 3, $A_1$, $A_2$, $A_3$, $A_4$, $A_5$, $A_6$, $A_7$, $A_8$, and $A_9$ may be each independently any one of hydrogen, deuterium, and an alkyl group having 1 to 5 carbon atoms, $B_1$, $B_2$, and $B_3$ may be each independently any one of hydrogen, deuterium, and an alkyl group having 1 to 5 carbon atoms, and Z may be any one of hydrogen, deuterium, an alkyl group having 1 to 5 carbon atoms, and a substituted or unsubstituted hydrocarbon ring having 5 to 15 carbon atoms.

A specific example of Reaction Formula 3 is Reaction Formula 3-1.

[Reaction Formula 3-1]
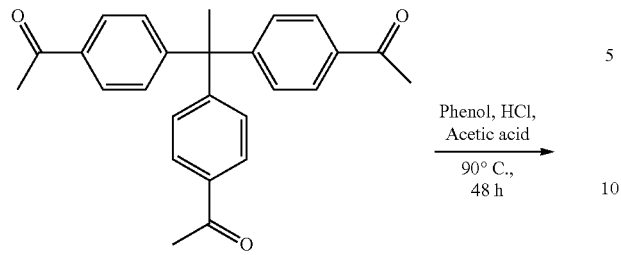
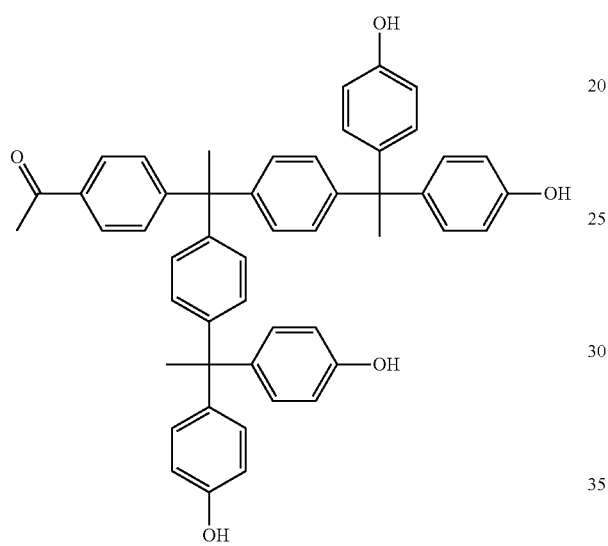
A second resist core precursor A may be formed by Reaction Formula 3-1.
[Reaction Formula 4]
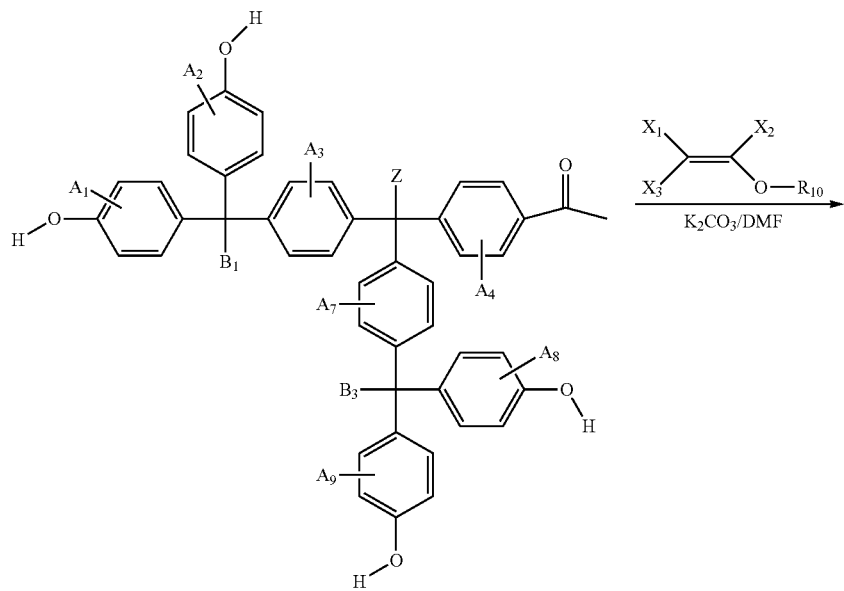

-continued

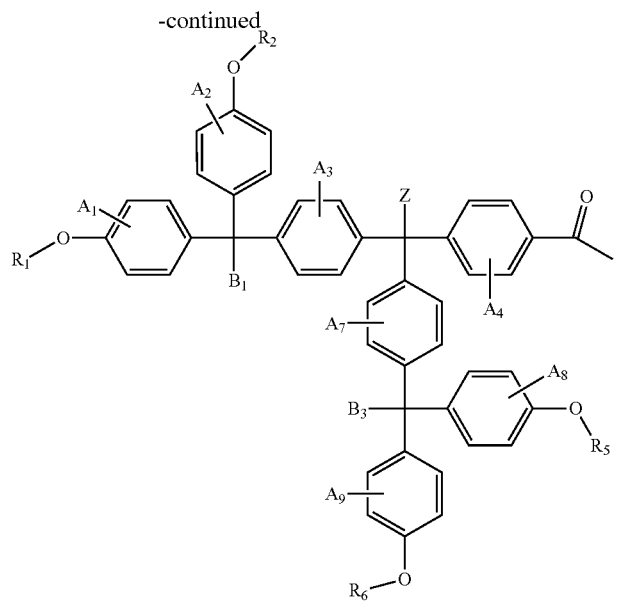

In Reaction Formula 4, $A_1$, $A_2$, $A_3$, $A_4$, $A_5$, $A_6$ $A_7$, $A_8$, $A_9$, $B_1$, $B_2$, $B_3$, and Z are the same as defined in Reaction Formula 3, $X_1$, $X_2$, and $X_3$ are each independently halogen, $R_{10}$ is perhalogenated alkyl having 1 to 18 carbon atoms or perhalogenated alkyl ether halogenated alkyl having 1 to 18 carbon atoms, and $R_1$, $R_2$, $R_5$, and $R_6$ may be the same as defined in Formula 1.

The functional groups may be bonded to the preliminary core by Reaction Formula 4.

A specific example of Reaction Formula 4 is Reaction Formula 4-1.

[Reaction Formula 4-1]

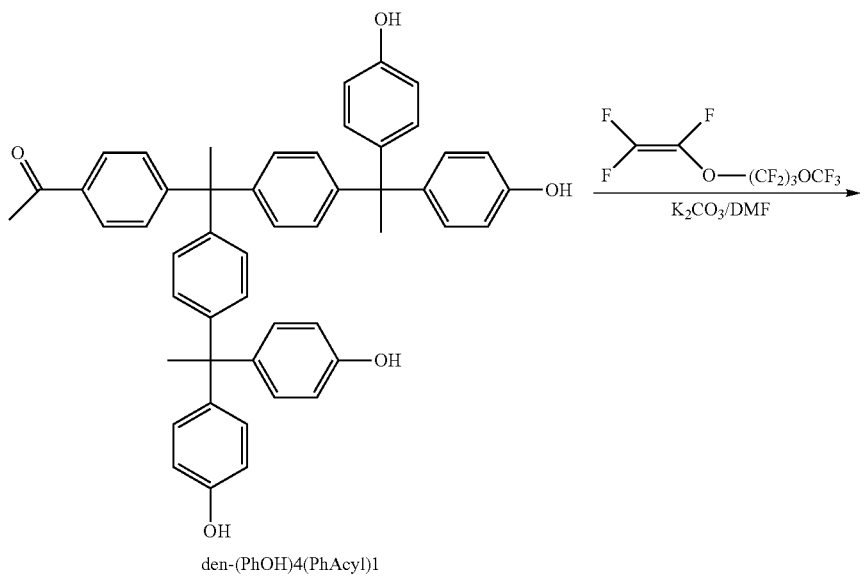

den-(PhOH)4(PhAcyl)1

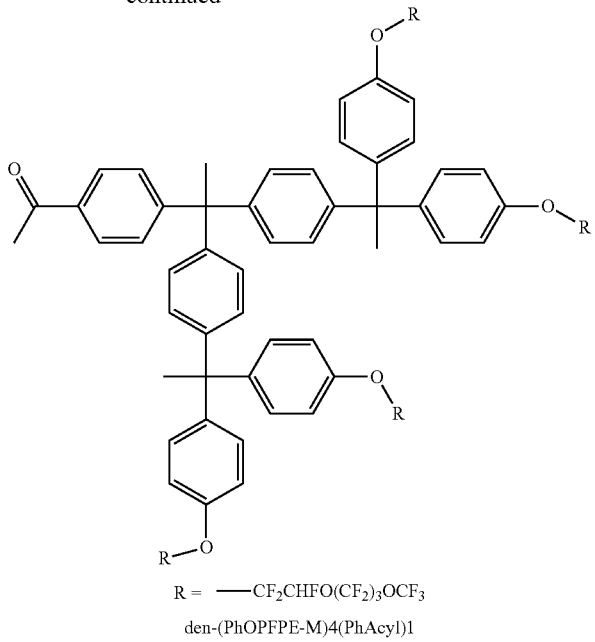

R = —CF$_2$CHFO(CF$_2$)$_3$OCF$_3$
den-(PhOPFPE-M)4(PhAcyl)1

A second resist core precursor B may be prepared by Reaction Formula 4-1.

Preparing a second preliminary resist compound from the first preliminary resist compound may be performed by Reaction Formula 5. The second preliminary resist compound may include a core.

[Reaction Formula 5]

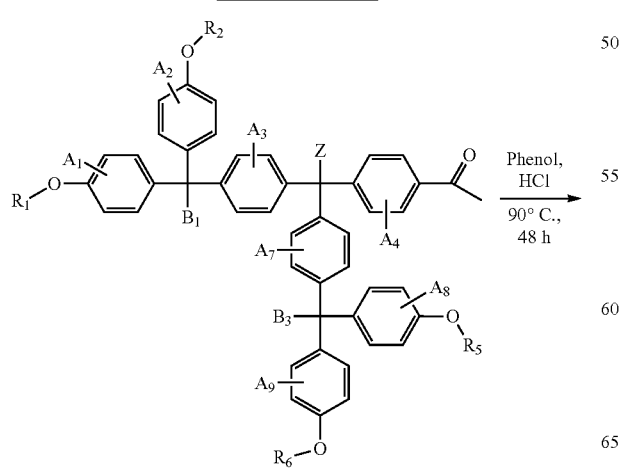

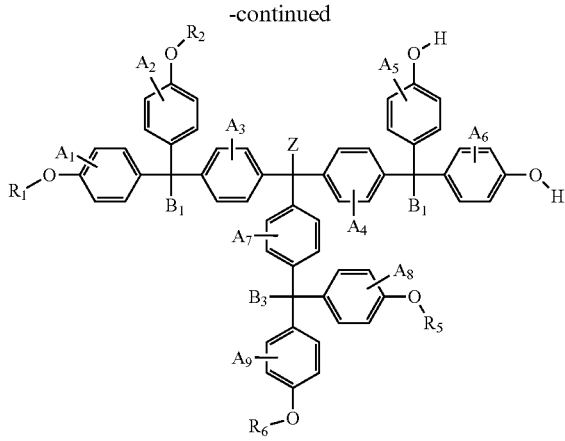

A specific example of Reaction Formula 5 is Reaction Formula 5-1.

[Reaction Formula 5-1]
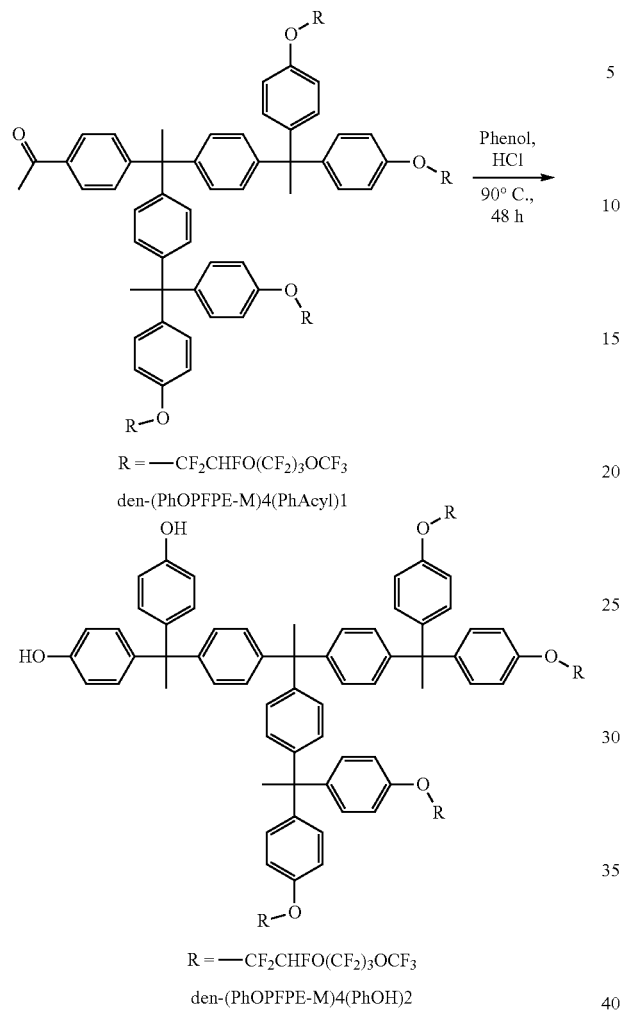
A second resist core may be prepared by Reaction Formula 5-1.
Manufacturing a resist compound may be completed by bonding functional groups to the second preliminary resist compound. Bonding the functional groups to the second preliminary resist compound may be performed by Reaction Formula 6 below.
[Reaction Formula 6]
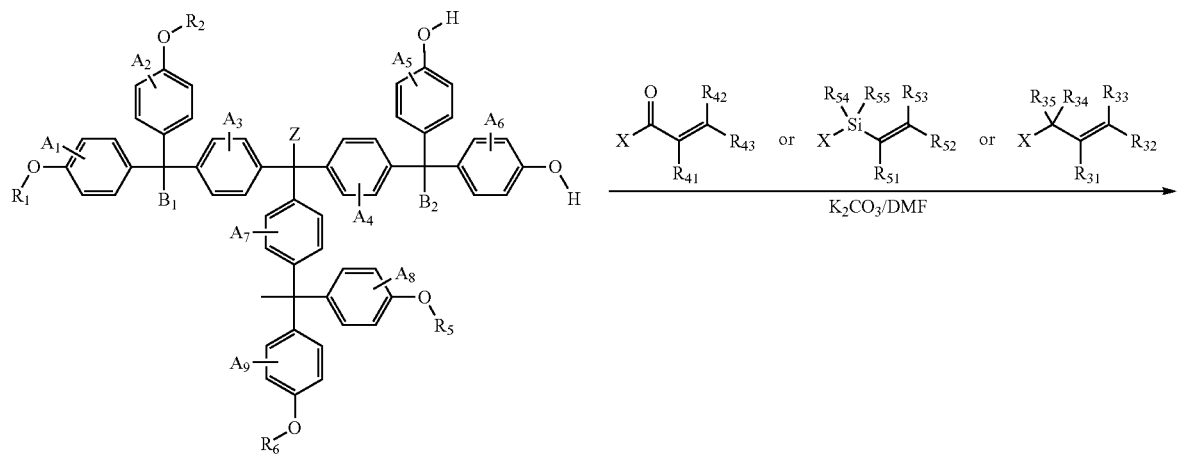

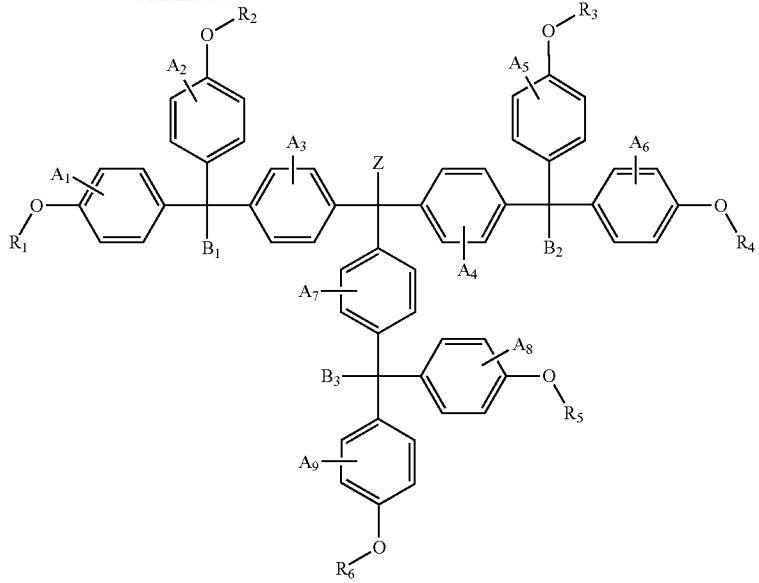

In Reaction Formula 6, $A_1$, $A_2$, $A_3$, $A_4$, $A_5$, $A_6$ $A_7$, $A_8$, $A_9$, $B_1$, $B_2$, $B_3$, and Z are the same as defined in Reaction Formula 3, $X_1$, $X_2$, and $X_3$ are each independently halogen, $R_{41}$, $R_{42}$, $R_{43}$, $R_{51}$, $R_{52}$, $R_{53}$, $R_{54}$, and $R_{55}$ are each independently hydrogen, deuterium, or an alkyl group having 1 to 3 carbon atoms, and $R_1$, $R_2$, $R_3$, $R_4$, $R_5$, and $R_6$ may be the same as defined in Formula 1.

Specific examples of Reaction Formula 6 are Reaction Formula 6-1, Reaction Formula 6-2, and Reaction Formula 6-3.

[Reaction Formula 6-1]

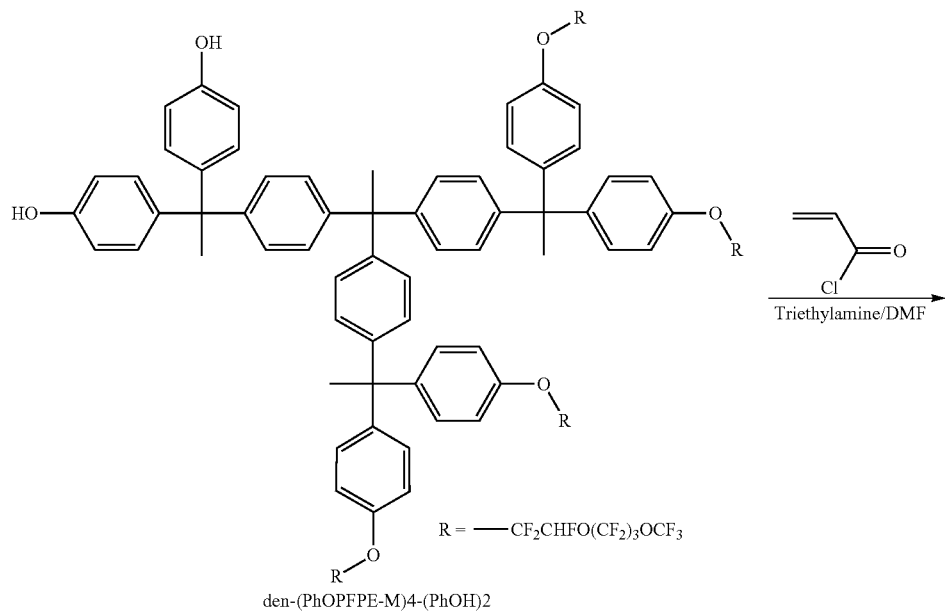

-continued
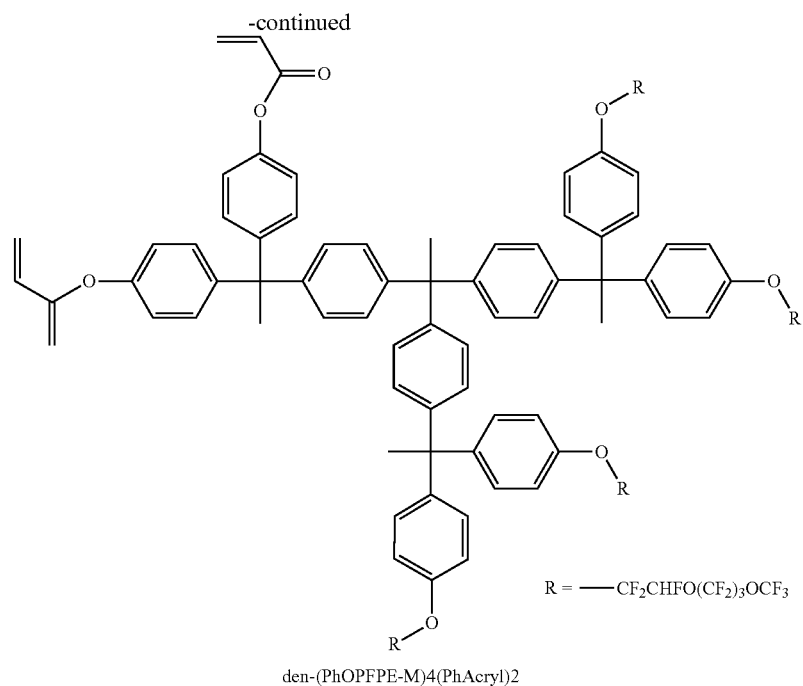
den-(PhOPFPE-M)4(PhAcryl)2
[Reaction Formula 6-2]
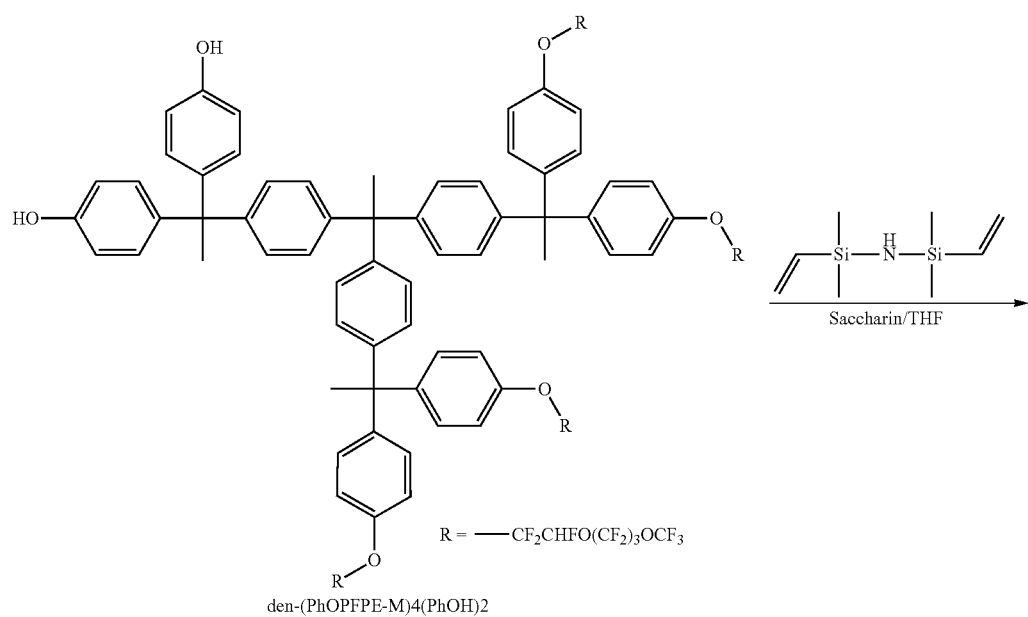
den-(PhOPFPE-M)4(PhOH)2

-continued
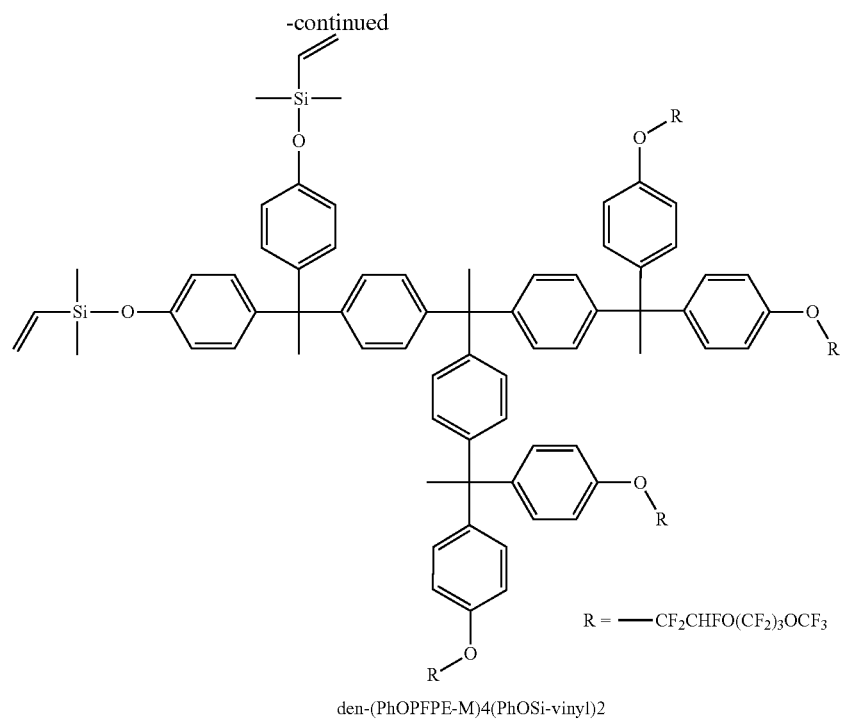
den-(PhOPFPE-M)4(PhOSi-vinyl)2
[Reaction Formula 6-3]
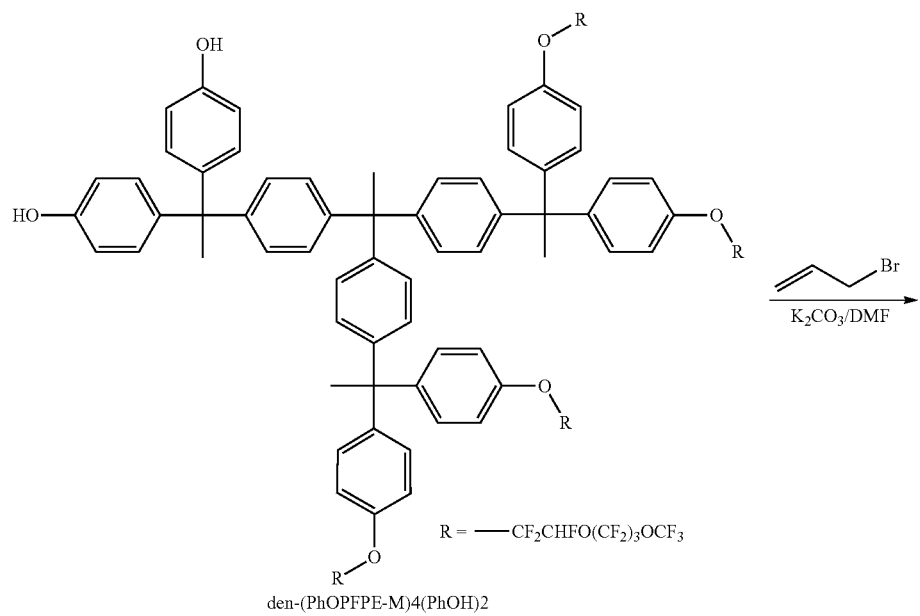
den-(PhOPFPE-M)4(PhOH)2

-continued

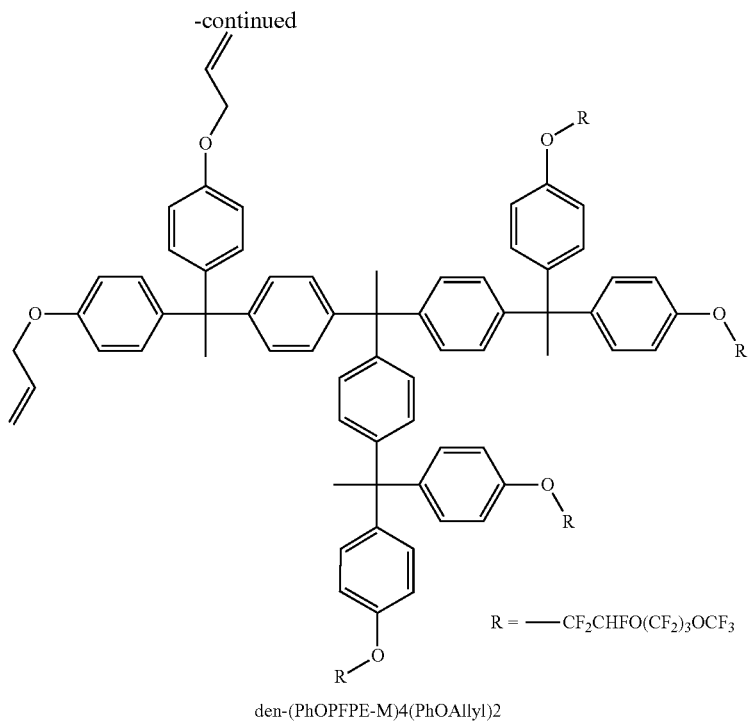

den-(PhOPFPE-M)4(PhOAllyl)2

When the resist compound is manufactured by Reaction Formulas 3 to 6, the molecules represented by Formula 1 may have different substituents. In this case, the ratio of the different substituents of each of the molecules represented by Formula 1 may be the same. For example, in Formula 1, $R_1$, $R_2$, $R_3$, and $R_4$ may be represented by Formula 2, and $R_5$ and $R_6$ may be represented by Formula 3, Formula 4, or Formula 5. In this case, in the molecules represented by Formula 1, the ratio of the total number of substituents represented by Formula 2 to the total number of substituents represented by Formula 3, Formula 4, or Formula 5 may be the same. Accordingly, the sensitivity of the exposure process using the resist compound may be improved. The resist layer including the resist compound may be uniformly dissolved in a developing process.

According to other embodiments, manufacturing a resist compound may include synthesizing a core and bonding functional groups to the core, and synthesizing the core may be performed by Reaction Formula 7 below.

Reaction Formula 7]

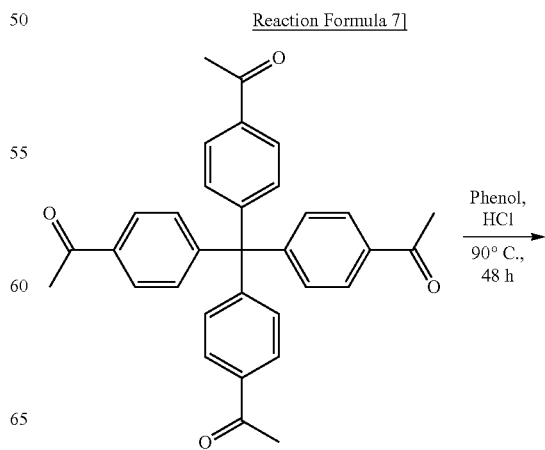

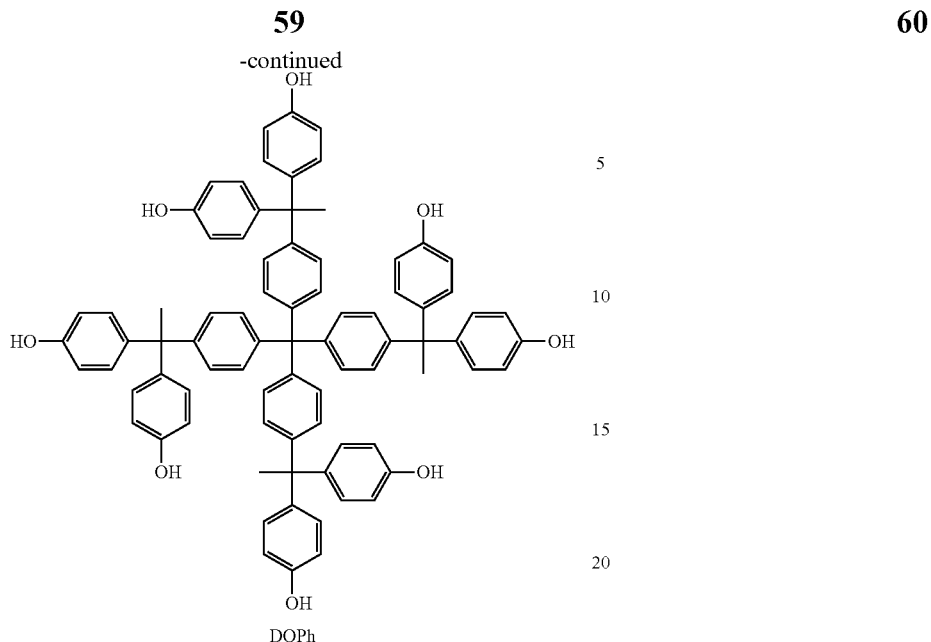
DOPh
Bonding the functional groups to the core may be performed by Reaction Formula 8-1, Reaction Formula 8-2, Reaction Formula 8-3, or Reaction Formula 8-4 below.
[Reaction Formula 8-1]
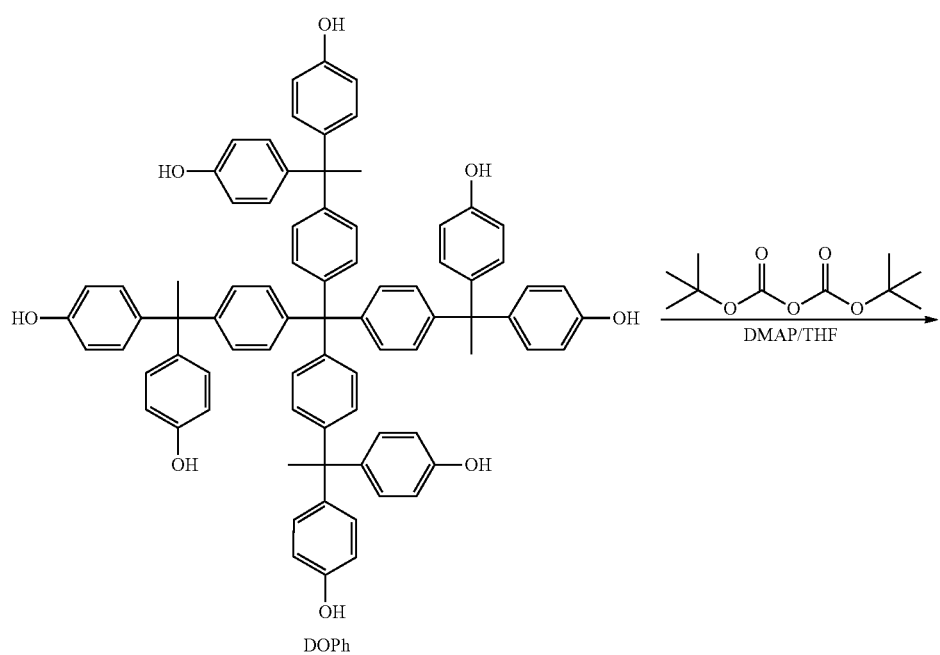
DOPh -continued
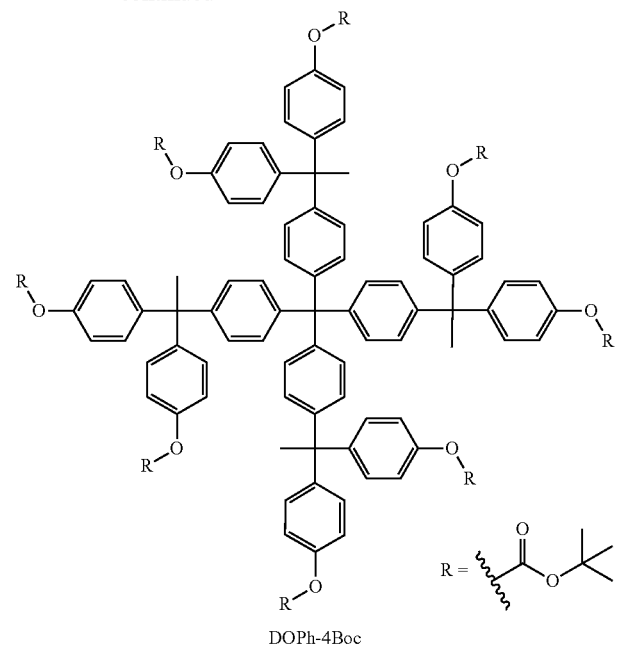
DOPh-4Boc
[Reaction Formula 8-2]
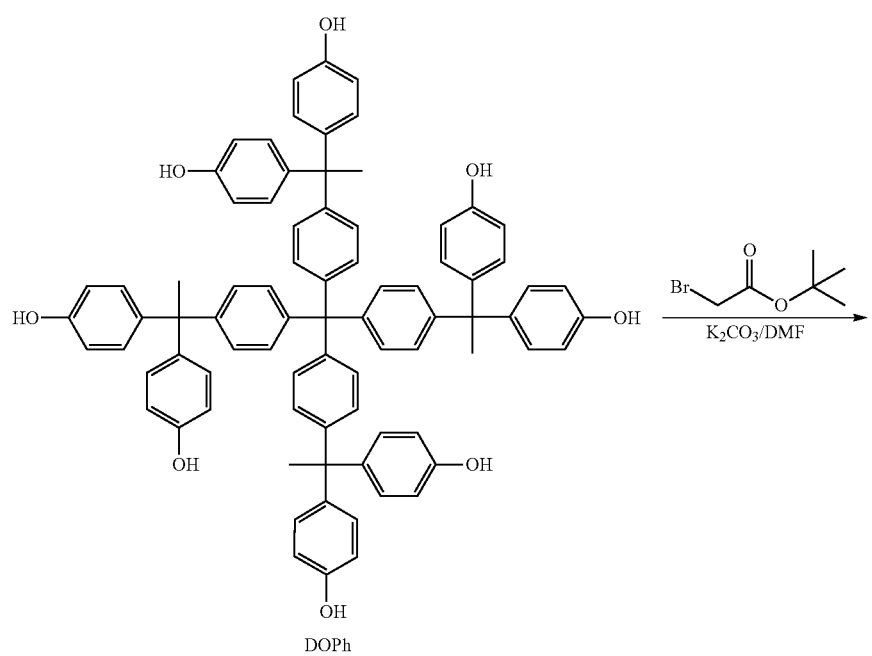
DOPh -continued
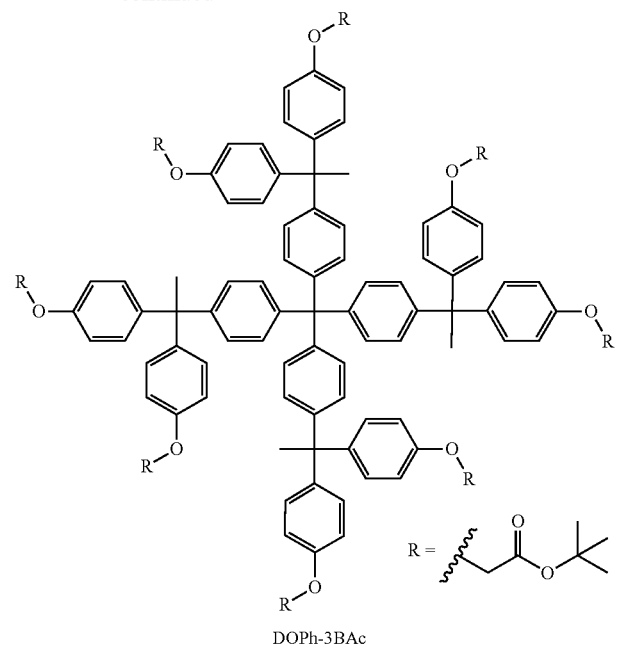
DOPh-3BAc
[Reaction Formula 8-3]
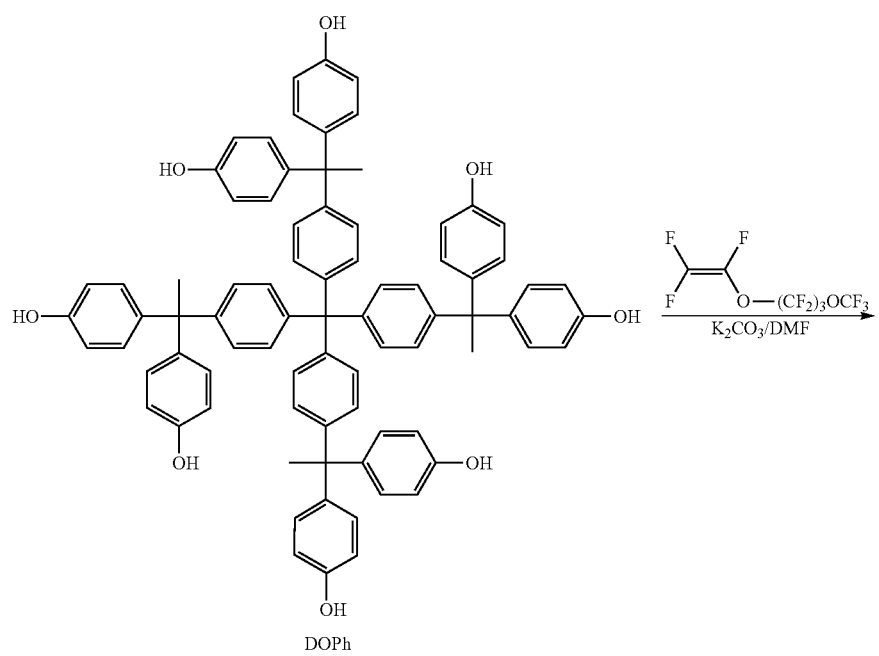
DOPh -continued
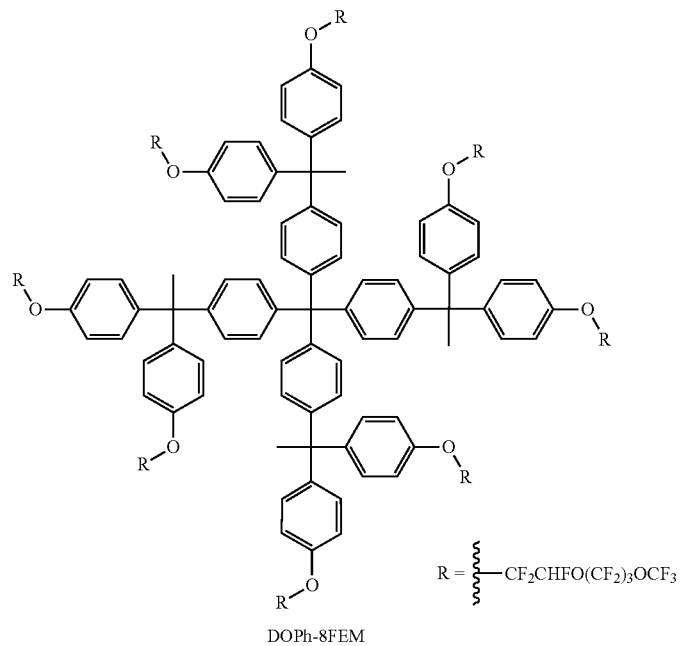
DOPh-8FEM
[Reaction Formula 8-4]
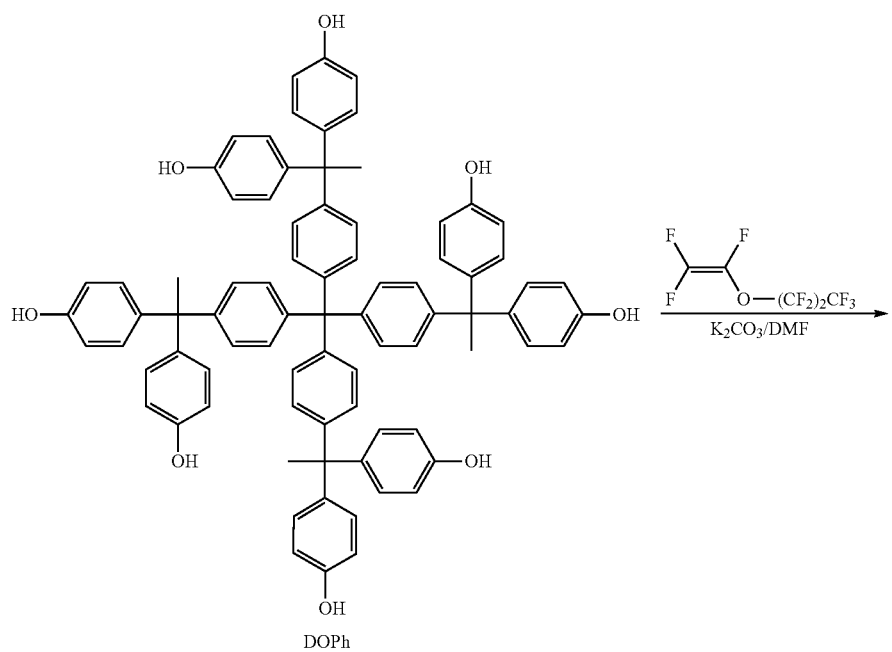
DOPh -continued

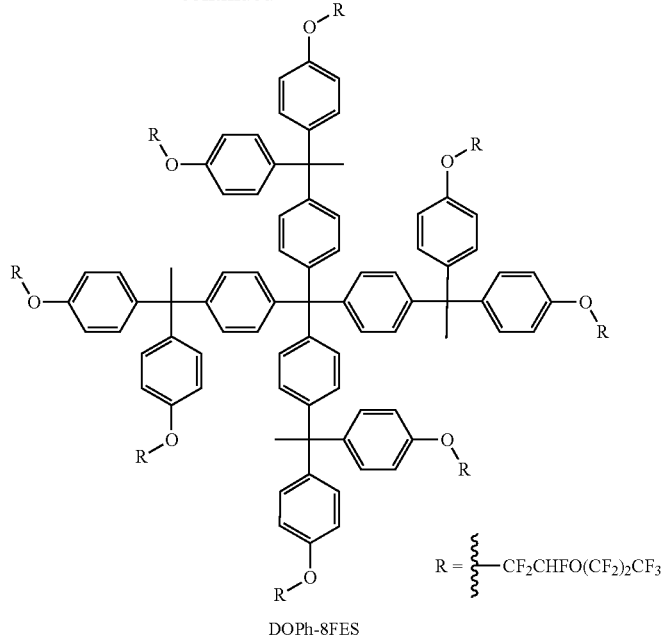

$R = \xi\text{—}CF_2CHFO(CF_2)_2CF_3$

DOPh-8FES

In Reaction Formula 8-1, DMAP may refer to 4-dimethylaminopyridine, THF may refer to tetrahydrofuran, and DMF in Reaction Formulas 8-2 to 8-4 may refer to dimethylformamide.

Functional groups may affect the properties of a compound. According to an embodiment, when a core is prepared by Reaction Formula 7, the core may include a large number of hydroxyl groups. For example, the core may have eight hydroxyl groups. The hydroxyl groups of the core may be substituted with functional groups respectively. Resist compounds include a large number of functional groups, so that the properties of the resist compound may be easily controlled. When the resist compound is represented by Formula 8i, the resist compound may have a high glass transition temperature.

Hereinafter, a method for forming a pattern using a resist compound and a method for manufacturing a semiconductor device according to an embodiment will be described.

FIG. 1 is a plan view illustrating a resist pattern according to an embodiment. FIGS. 2 to 5 are views describing forming a lower pattern according to an embodiment, and correspond to cross-sections taken along the line I-II of FIG. 1.

Figure 2:
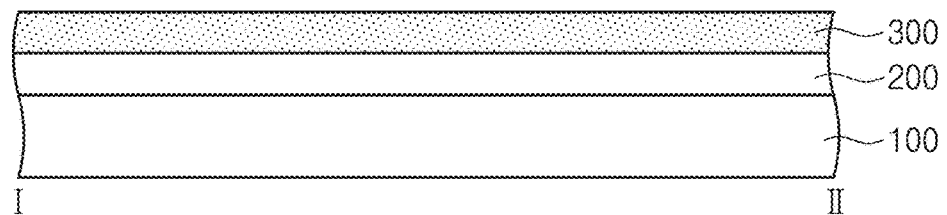
FIGS. 2 to 5 are views describing a method for forming a lower pattern according to an embodiment of the inventive concept.

Referring to FIGS. 1 and 2, a substrate 100 may be prepared. A lower layer 200 and a resist layer 300 may be sequentially formed on the substrate 100. The lower layer 200 may be an etching target film. The lower layer 200 may be formed of any one or a combination selected from semiconductor materials, conductive materials, and insulating materials. In addition, the lower layer 200 may be formed of a single film or a plurality of stacked films. Although not shown, layers may be further provided between the substrate 100 and the lower layer 200.

The resist compound represented by the Formula 1 may be applied onto the lower layer 200 to form a resist layer 300. The resist compound may be applied by spin coating. A heat treatment process may be further performed on the applied resist compound. The heat treatment process may be performed at about 80° C. to about 200° C. The heat treatment process may correspond to a baking process of the resist layer 300.

Figure 3:
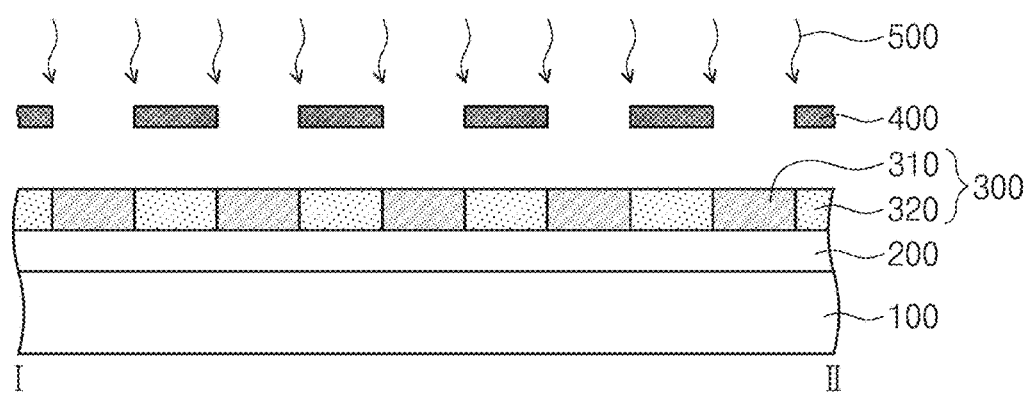

Referring to FIGS. 1 and 3, the resist layer 300 may be exposed by light 500. The light 500 may be electron beams or extreme ultraviolet rays. Before the light 500 is irradiated, a photo mask 400 may be disposed on the resist layer 300. The light 500 may be irradiated on a first portion 310 of the resist layer 300 exposed by the photo mask 400. When the light 500 is exposed to the resist layer 300, the chemical bond of the resist compound represented by Formula 1 may be broken to form radicals. The radicals may be free radicals. The resist compound may include halogen and oxygen. For example, in Formula 1, $R_1$, $R_2$, $R_3$, $R_4$, $R_5$, and $R_6$ may each independently include a halogen-substituted alkyl group having 3 to 20 carbon atoms. More specifically, at least one of $R_1$, $R_2$, $R_3$, $R_4$, $R_5$, or $R_6$ may include perhalogenated alkyl and perhalogenated alkyl ether halogenated alkyl. In this case, oxygen and halogen may be bonded to the same carbon atom. In this case, halogen and oxygen may have high absorbance for electron beams and extreme ultraviolet rays. As the content of halogen and oxygen in the resist compound increases, more radicals may be formed by irradiation of the light 500. The resist compound includes a carbon-oxygen bond, so that more radicals may be formed.

Due to the radicals, intermolecular bond-forming reactions between the materials of Formula 1 may occur. The resist compound includes an alkenyl group, and thus an intermolecular bond-forming reaction between molecules may occur. For example, in Formula 1, at least one of $R_1$, $R_2$, $R_3$, $R_4$, $R_5$, or $R_6$ may include an alkenyl group having 3 to 20 carbon atoms. Accordingly, the chemical structure of the resist compound in the first portion 310 of the resist layer 300 exposed to the light 500 may change.

A second portion 320 of the resist layer 300 may not be exposed to the light 500. The chemical structure of the resist compound in the second portion 320 of the resist layer 300 may not change. Accordingly, after the irradiation of the light 500 is completed, the first portion 310 of the resist layer 300 may have a different chemical structure from the second portion 320. Thereafter, the photo mask 400 may be removed.

Figure 4:
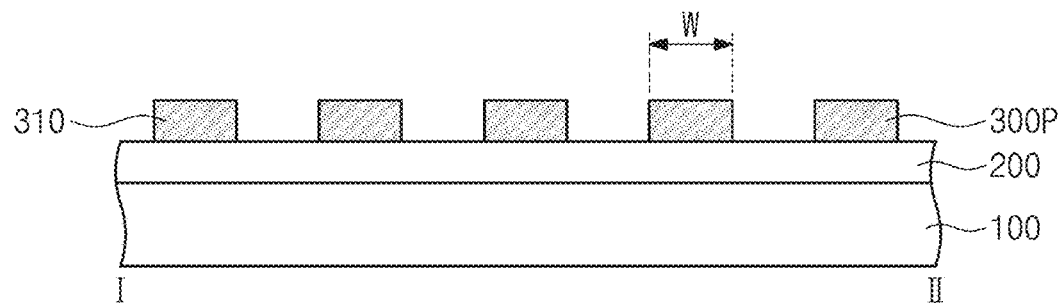

Referring to FIGS. 1 and 4, the second portion 320 of the resist layer 300 may be removed by a developing solution to form a resist pattern 300P. The resist pattern 300P may be formed by a patterning process including an exposure and development process of the resist layer 300. The resist pattern 300P may correspond to the first portion 310 of the resist layer 300. The developing solution may include a high fluorine-based solution. The high fluorine-based solution may refer to a solution having high fluorine content. For example, the developing solution may include at least one of hydrofluoroether (HFE) and perfluorocarbon (PFC). When using the high fluorine-based solution as a developing solution, the developing solution may have a low surface tension. Accordingly, pattern collapse of the resist pattern 300P may be prevented in the development process. The pattern collapse may indicate that a portion of the developed resist layer 300 (e.g., the first portion 310) is collapsed while drying. The development process of the resist pattern 300P may be chemically stable. Therefore, the resist pattern 300P may be formed to have a fine width W and pitch.

When the resist compound includes a polymer or a resin, the resist compound may have a relatively large molecular weight. Accordingly, the exposed portion of the resist layer manufactured using the resist compound may have low solubility with respect to a developing solution. In addition, in the development process, chain entanglement may occur due to polymers of the resist compounds, so that the exposed portion of the resist layer may have low solubility with respect to a developing solution. Polymers or resins may have a relatively wide molecular weight distribution (polydispersity index). Thus, the exposed portion of the resist layer including the polymers or resins may be dissolved relatively unevenly with respect to a developing solution.

According to an embodiment, the resist compound may include a single molecule to have a relatively small molecular weight. The second portion 320 of the resist layer 300 may have high solubility with respect to a developing solution. The resist compound may have a functional group containing a halogen element (e.g., fluorine), and the developing solution may include a high fluorine-based solution. Accordingly, the second portion 320 of the resist layer 300 may have higher solubility with respect to a developing solution. The resist compound has a relatively narrow molecular weight distribution (polydispersity index), and thus the second portion 320 of the resist layer 300 may be uniformly dissolved in a developing solution. Accordingly, the resist pattern 300P formed from the resist compound may have a narrow width. For example, the resist pattern 300P may have a width W of about 300 nm to about 30 nm.

According to an embodiment, the resist compound of Formula 1 may be a non-chemically amplified resist (non-CAR) type resist compound. For example, as described in FIG. 3, the structure of the first portion 310 of the resist layer 300 may be directly changed by light. The resist layer 300 may not include a separate photoacid generator. Therefore, deformation of the shape of the resist pattern 300P due to the photoacid generator may be prevented.

As shown in FIG. 1, the resist pattern 300P may have a linear planar shape. For example, the resist pattern 300P may include portions extending in one direction. However, the planar shape of the resist pattern 300P may be variously modified, such as a zigzag shape, a honeycomb shape, or a circular shape. The resist pattern 300P may expose the lower layer 200.

Figure 5:
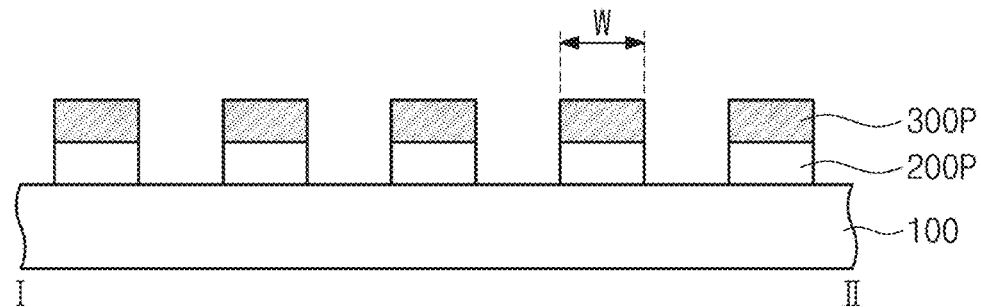

Referring to FIGS. 1 and 5, the lower layer 200 exposed by the resist pattern 300P may be removed to form a lower pattern 200P. The lower layer 200 may be removed by an etching process. The lower layer 200 may have an etching selectivity with respect to the resist pattern 300P. The lower pattern 200P may expose the substrate 100. For another example, the lower pattern 200P may expose another layer interposed between the substrate 100 and the lower pattern 200P. According to an embodiment, since the resist compound has a high glass transition temperature, the durability and strength of the resist pattern 300P may increase. The resist pattern 300P may include materials of Formula 1 bonded to each other as described in FIG. 4. The bonding may allow an increase in the durability and strength of the resist pattern 300P. Accordingly, the shape of the resist pattern 300P may be maintained during the etching process of the lower layer 200. Thereafter, the resist pattern 300P may be removed. Accordingly, forming the pattern may be completed. The pattern may refer to a lower pattern 200P. The width of the lower pattern 200P may correspond to the width W of the resist pattern 300P. Since the resist pattern 300P has a narrow width W, the lower pattern 200P may be formed in a narrow width.

According to an embodiment, the lower pattern 200P may be a component of a semiconductor device. For example, the lower pattern 200P may be a semiconductor pattern, a conductive pattern, or an insulating pattern in a semiconductor device. The resist compound according to an embodiment may not include a metal element (e.g., hafnium or zirconium). Accordingly, contamination caused by the metal element in the manufacturing process of a semiconductor device may be prevented.

Figure 6:
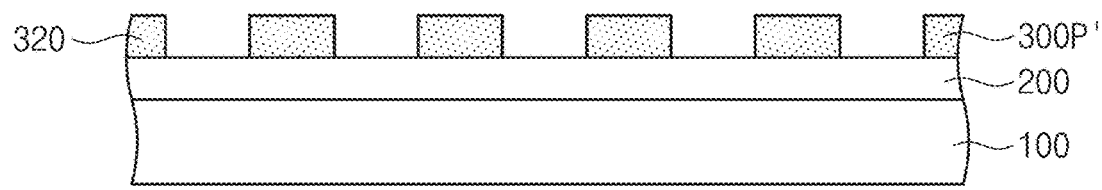
FIGS. 6 and 7 are views describing forming a lower pattern according to other embodiments of the inventive concept.
Figure 7:
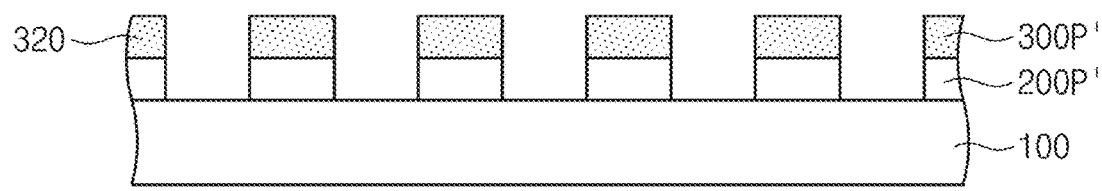

FIGS. 6 and 7 are views describing forming a lower pattern according to other embodiments.

Referring to FIG. 6, a resist layer 300 and a lower layer 200 may be formed on a substrate 100. Light 500 may be irradiated onto a first portion 310 of a resist layer 300. The substrate 100, the lower layer 200, and the resist layer 300 may be substantially the same as those described in FIG. 2. Irradiation of the light 500 may be substantially the same as that described in FIG. 3. For example, after the irradiation of the light 500 is completed, the material of the first portion 310 of the resist layer 300 may have a different chemical structure from that of the second portion 320. Thereafter, the first portion 310 of the resist layer 300 may be removed by a developing solution to form a resist pattern 300P'. The second portion 320 of the resist layer 300 may not be removed by the developing solution. The resist pattern 300P' may correspond to the second portion 320 of the resist layer 300.

Referring to FIG. 7, the lower layer 200 may be etched to form a lower pattern 200P'. However, the lower pattern 200P' may be formed at a position corresponding to the second portion 320 of the resist pattern 300P'. The etching of the lower layer 200 may be substantially the same as that described in FIG. 5. Thereafter, the resist pattern 300P' may be removed.

Referring to FIG. 7, the lower layer 200 may be etched to form the lower pattern 200P'. However, the lower pattern 200P' may be formed at a position corresponding to the second portion 320 of the resist pattern 300P'. The etching of the lower layer 200 may be substantially the same as that described in FIG. 5. Thereafter, the resist pattern 300P' may be removed.

Hereinafter, the synthesis of a resist compound and the manufacture of a resist pattern will be described with reference to experimental examples of the inventive concept.

1. Synthesis of Resist Compound 1

Synthesis of a First Resist Core_Dendritic Hexaphenol [Den-(PhOH)$_6$]

1,1,1-tris (4-acetylphenyl) ethane (0.20 g, 0.52 mmol), phenol (2.0 g), and hydrochloric acid (12 M aqueous solution, 2 cm$^3$) were added to a pressure reactor (seal tube, 10 cm$^3$) to form a mixture at room temperature. The mixture was stirred at 90° C. for 48 hours to perform the reaction represented by Reaction Formula 1-1. Thereafter, the mixture was cooled to room temperature (about 25° C.) and filtered to obtain the precipitated solid. The crude product was washed with water and dried out. The crude product was purified using column chromatography (stationary phase: silica gel, mobile phase: tetrahydrofuran:hexane=2:1) to obtain a white solid, dendrimer type phenol (dendritic hexaphenol, hereinafter den-(PhOH)$_6$).

[Yield Analysis]

The mass of the final product ([den-(PhOH)$_6$]) is 0.21 g. The yield was 45% according to the analysis.

[Nuclear Magnetic Resonance (NMR) Analysis]

The chemical shift values (δ) of the synthesized material measured by $^1$H NMR (400 MHz, DMSO-d6) were 1.97 (s, 9H, CH$_3$), 2.03 (s, 3H, CH$_3$), 6.63 (d, J=8 Hz, 12H, Ar—H), 6.81 (d, J=8 Hz, 12H, Ar—H), 6.90 (s, 12H, Ar—H), and 9.24 ppm (br s, 6H, Ar—OH). (In the experimental examples herein, Ar refers to a benzene ring, and DMSO-d6 refers to deuterated dimethyl sulfoxide.)

(1) Experimental Example 1A_Synthesis of First Resist Compound of Formula 8A (Reaction Formula 2A)

The pre-synthesized den-(PhOH)$_6$ (0.3 g, 0.34 mmol), 2-(heptafluoropropoxy) hexafluoropropyl trifluorovinyl ether (1.30 g, 3.02 mmol), K$_2$CO$_3$ (0.42 g, 3.02 mmol), and anhydrous dimethylformamide (hereinafter referred to as DMF, 5 cm$^3$) were added to a round flask (100 cm$^3$). The mixture was stirred at 70° C. for 2 hours to perform the reaction represented by Reaction Formula 2A. After the reaction was complete, the product was added to methanol (100 cm$^3$) to form a solid precipitate. The solid precipitate was filtered, and purified by column chromatography (stationary phase: silica gel, mobile phase: ethyl acetate: hexane=1:6) to obtain a white solid, final product.

[Yield Analysis]

The final product is 0.65 g. The yield was 55% according to the analysis.

[Nuclear Magnetic Resonance (NMR) Analysis]

The chemical shift values (δ) of the final product measured by $^1$H NMR (400 MHz, CDCl$_3$) were 2.13 (s, 12H, CH$_3$), 6.02 (d, 6H, J=54 Hz, CF$_2$CFHO), 7.26-7.32 (m, 9H, Ar—H), 6.94 (dd, 12H, J=12, 28 Hz, Ar—H), and 7.05 ppm (t, 24H, J=10 Hz, Ar—H).

Therefore, it can be confirmed that the synthesized Experimental Example 1A is a compound represented by Formula 8A.

(2) Experimental Example 1B_Synthesis of First Resist Compound of Formula 8B (Reaction Formula 2B)

The pre-synthesized den-(PhOH)$_6$ (1.0 g, 1.12 mmol), K$_2$CO$_3$ (1.85 g, 13.41 mmol), and anhydrous DMF (20 cm$^3$) were added to a round flask (50 cm$^3$). The mixture was stirred at 60° C. for 30 minutes. 1,1,2,2,3,3-hexafluoro-1-(trifluoromethoxy)-3-[(1,2,2-trifluorovinyl)oxy]propane (2.60 g, 7.82 mmol) was added to the mixture at 60° C. and the reaction represented by Reaction Formula 2B was performed for 3 hours. The mixture was cooled to room temperature (about 25° C.) and extracted using diethyl ether. After washing the extract with water and saturated sodium chloride aqueous solution, the product was treated with anhydrous MgSO$_4$ to remove residual water and concentrated under reduced pressure. The concentrated product was purified by column chromatography (stationary phase: silica gel, mobile phase: ethyl acetate:hexane=1:5) to obtain a white solid, final product.

[Yield Analysis]

The final product is 2.6 g. The yield was 80% according to the analysis.

[Nuclear Magnetic Resonance (NMR) Analysis]

The chemical shift values (δ) of the final product measured by $^1$H NMR (400 MHz, CDCl$_3$) were 2.17 (s, 12H, CH$_3$), 6.07 (d, 6H, J=54 Hz, CF$_2$CFHO), and 6.94-7.14 ppm (m, 36H, Ar—H)

Therefore, it can be confirmed that the final product of Experimental Example 1B is a compound represented by Formula 8B.

(3) Experimental Example 1C_Synthesis of First Resist Compound of Formula 8C (Reaction Formula 2C)

Den-(PhOH)$_6$ (1.0 g, 1.12 mmol), K$_2$CO$_3$ (2.32 g, 16.76 mmol), and anhydrous DMF (18 cm$^3$) were added to a round flask (50 cm$^3$). The mixture was stirred at 60° C. for 30 minutes and then cooled to 35° C. A solution of perfluoropropoxyethylene (2.08 g, 7.82 mmol) dissolved in tetrahydrofuran (hereinafter THF) (2 cm$^3$) was prepared. A solution of perfluoropropoxyethylene was added to the mixture at 35° C. and the reaction was performed for 3 hours. The reaction mixture was extracted using ethyl acetate to obtain an organic layer and the organic layer was washed with water and saturated sodium chloride aqueous solution. The washed organic layer was treated with anhydrous MgSO$_4$ to remove residual water and concentrated under reduced pressure. The concentrated product was purified by column chromatography (stationary phase: silica gel, mobile phase: ethyl acetate: hexane=1:5) to obtain a white solid, final product.

[Yield Analysis]

The final product is 2.4 g. The yield was 86% according to the analysis.

[Nuclear Magnetic Resonance (NMR) Analysis]

The chemical shift values (δ) of the final product, determined by $^1$H NMR (400 MHz, CDCl$_3$), were 2.18 (s, 12H, CH$_3$), 6.07 (d, 6H, J=54 Hz, CF$_2$CFHO), 7.00 (dd, 12H, J=20, 8.5 Hz, Ar—H), and 7.07-7.15 ppm (mm, 24H, Ar—H).

Therefore, it can be confirmed that the final product of Experimental Example 1C is a compound represented by Formula 8C.

(4) Experimental Example 1D_Synthesis of First Resist Compound of Formula 8D (Reaction Formula 2D)

The pre-synthesized den-(PhOH)$_6$ (0.30 g, 0.34 mmol), allyl bromide (0.12 g, 1.00 mmol), potassium carbonate (0.14 g, 1.00 mmol), and anhydrous dimethylformaide (DMF, 5 cm$^3$) were added to a pressure reactor (seal tube).

The mixture was stirred at 70° C. for 2 hours. Thereafter, 2-(heptafluoropropoxy) hexafluoropropyl trifluorovinyl ether (0.87 g, 2.00 mmol) and potassium carbonate (0.28 g, 2.00 mmol) were further added to the mixture. The mixture was stirred at 70° C. for 2 hours to perform the reaction represented by Reaction Formula 2D. The mixture was cooled to room temperature (about 25° C.) and poured into methanol to precipitate the product. The precipitated product was filtered, and washed again with methanol. The washed solid product was completely dissolved in benzotrifluoride and then passed through a short-pass column (silica) to remove a solvent. After removing the solvent, the solid product was precipitated and filtered using methanol to obtain a white solid, final product.

[Yield Analysis]

The final product is 0.63 g. The yield was 70% according to the analysis.

[Nuclear Magnetic Resonance (NMR) Analysis]

The chemical shift values ($\delta$) of the final product, measured by $^1$H NMR (400 MHz, CDCl$_3$), were 2.16 (s, 9H, CH$_3$), 4.53 (d, 4H, Allyl-H), 5.36 (dd, 4H, J=50 Hz, 14 Hz, Allyl-H), 6.00-6.14 (d, 4H, CF$_2$CFHO), 6.06 (m, 2H, Allyl-H), and 6.78-7.17 (m, 36H, Ar—H).

Therefore, it can be confirmed that the final product of Experimental Example 1D is a compound represented by Formula 8D.

(5) Experimental Example 1E_Synthesis of First Resist Compound of Formula 8E (Reaction Formula 2E)

Den-(PhOH)$_6$ (1.0 g, 1.12 mmol), K$_2$CO$_3$ (2.32 g, 16.76 mmol), and anhydrous DMF (18 cm$^3$) were added to a round flask (50 cm$^3$). 1,1,2,2,3,3-hexafluoro-1-(trifluoromethoxy)-3-[(1,2,2-trifluorovinyl)oxy]propane (2.08 g, 7.82 mmol) and allyl bromide were added to the mixture at 60° C. and reacted for 3 hours. A product was extracted using ethyl acetate and washed with water and saturated sodium chloride aqueous solution. As a result, a separated organic layer was obtained. The separated organic layer was treated with anhydrous MgSO$_4$ to remove residual water and concentrated under reduced pressure. Thereafter, the crude product was dissolved again in ethyl acetate. The crude product was precipitated and filtered using methanol to obtain a white solid, final product.

[Yield Analysis]

The final product is 1.2 g. The yield was 48% according to the analysis.

[Nuclear Magnetic Resonance (NMR) Analysis]

The chemical shift values ($\delta$) of the final product, measured by $^1$H NMR (400 MHz, CDCl$_3$), were 2.18 (s, 12H, CH$_3$), 6.07 (d, 6H, J=54 Hz, CF$_2$CFHO), 7.00 (dd, 12H, J=20, 8.5 Hz, Ar—H), and 7.07-7.15 ppm (mm, 24H, Ar—H).

Therefore, it can be confirmed that the synthesized Experiment Example 1E is a compound represented by Formula 8E.

(6) Experimental Example 1F_Synthesis of Resist Compound with Functional Group of Formula 7-1 (Reaction Formula 2F)_DHPh-PFT The pre-synthesized den-(PhOH)$_6$ (0.50 g, 0.56 mmol), octafluorotoluene (2.0 g, 8.4 mmol), K$_2$CO$_3$ (0.85 g, 6.1 mmol), and anhydrous dimethylformamide (hereinafter referred to as anhydrous DMF, 7 cm$^3$) were added to a Schlenk tube (25 cm$^3$). The mixture was stirred at 65° C. for 3 hours to perform the reaction represented by Reaction Formula 2F. After the reaction was complete, the product was cooled to room temperature (about 25° C.). The reaction mixture(product) was extracted using ethyl acetate and washed with water and saturated sodium chloride aqueous solution. As a result, a separated organic layer was obtained. The separated organic layer was treated with anhydrous MgSO$_4$ to remove residual water and concentrated under reduced pressure. The concentrated product was purified by column chromatography (stationary phase: silica gel, mobile phase: ethyl acetate:hexane=1:7) to obtain a final product, DHP-PFT. The final product was a white solid.

[Yield Analysis]

The final product is 1.1 g. The yield was 90% according to the analysis.

[Nuclear Magnetic Resonance (NMR) Analysis]

The chemical shift values ($\delta$) of the final product, measured by $^1$H NMR (400 MHz, CDCl$_3$), were 7.05 (d, J=8.0 Hz, Ar-12H), 6.99-6.92 (m, J=17.6, 7.6 Hz, Ar-12H), 6.89 (d, J=8.1 Hz, Ar-12H), and 2.13 (s, ArCH3-12H).

Therefore, it can be seen that the final product (DHPh-PFT) of Experimental Example 1F is a monomolecular resist including six functional groups (octafluorotoluene) represented by Formula 7-1, and 1,1,1-tris(4-(1,1-bis(4-(2,3,5,6-tetrafluoro-4-(trifluoromethyl) phenoxy) phenyl) ethyl) phenyl)ethane.

(7) Experimental Example 1G_Synthesis of Resist Compound Bonded with Functional Group of Formula 7-2 (Reaction Formula 2G)_DHPh-PFB Den-(PhOH)$_6$ (0.50 g, 0.56 mmol), hexafluorobenzene (1.6 g, 8.4 mmol), K$_2$CO$_3$ (0.85 g, 6.1 mmol), and anhydrous DMF (7 cm$^3$) were added to a Schlenk tube (25 cm$^3$). The mixture was stirred at 70° C. for 24 hours to perform the reaction represented by Reaction Formula 2G. After the reaction was complete, the product was cooled to room temperature (about 25° C.). The reaction mixture(product) was extracted using ethyl acetate and washed water and saturated sodium chloride aqueous solution. As a result, a separated organic layer was obtained. The separated organic layer was treated with anhydrous MgSO$_4$ to remove residual water and concentrated under reduced pressure. The concentrated product was purified by column chromatography (stationary phase: silica gel, mobile phase: ethyl acetate:hexane=1:7) to obtain a final product, DHPh-PFB. The final product was a white solid.

[Yield Analysis]

The final product is 0.50 g. The yield was 47% according to the analysis.

[Nuclear Magnetic Resonance (NMR) Analysis]

The chemical shift values ($\delta$) of the final product, measured by $^1$H NMR (400 MHz, CDCl$_3$), were 7.02 (d, J=7.8 Hz, Ar-12H), 6.98-6.88 (m, Ar-12H), 6.83 (d, J=7.8 Hz, Ar-12H), and 2.08 (d, J=27.0 Hz, ArCH3-12H).

Therefore, it can be seen that the final product (DHPh-PFB) of Experimental Example 1G is a monomolecular resist including six functional groups (hexafluorobenzene) represented by Formula 7-2, and 1,1,1-tris (4-(1,1-bis(4-(perfluorophenoxy) phenyl) ethyl) phenyl) ethane).

(8) Experimental Example 1H_Synthesis of Resist Compound Bonded with Functional Group of Formula 7-3 (Reaction Formula 2H)_DHPh-PFBI Den-(PhOH)$_6$ (0.50 g, 0.56 mmol), iodopentafluorobenzene (1.5 g, 5.0 mmol), K$_2$CO$_3$ (0.93 g, 6.7 mmol), and anhydrous DMF (7 cm$^3$) were added to a Schlenk tube (25 cm$^3$). The mixture was stirred at 70° C. for 12 hours to perform the reaction represented by Reaction Formula 2H. After the reaction was complete, the mixture was cooled to room temperature (about 25° C.) and diluted in ethyl acetate and washed with water and saturated sodium chloride aqueous solution. As a result, a separated organic layer was obtained. The separated organic layer was treated with anhydrous MgSO$_4$ to remove residual water and concentrated under reduced pressure. The concentrated product was purified by column chromatography (stationary phase: silica gel, mobile phase: dichloromethane:hexane=1:1) to obtain a final product, DHPh-PFBI. The final product was a white solid.

[Yield Analysis]

The final product is 0.80 g. The yield was 59% according to the analysis.

[Nuclear Magnetic Resonance (NMR) Analysis]

The chemical shift values (δ) of the final product (DHPh-PFBI), measured by $^1$H NMR (400 MHz, CDCl$_3$), were 7.02 (d, J=8.3 Hz, Ar-12H), 6.98-6.89 (m, Ar-12H), 6.86 (d, J=8.2 Hz, Ar-12H), and 2.11 (s, ArCH3-12H).

Therefore, the final product (DHPh-PFBI) of Experimental Example 1H is a monomolecular resist bonded with six functional groups represented by Formula 7-3, and 1,1,1-tris(4-(1,1-bis(4-(2,3,5,6-tetrafluoro-4-iodophenoxy)phenyl) ethyl) phenyl) ethane.

(9) Experimental Example 1I_Synthesis of Resist Compound Bonded with Functional Group of Formula 7-4 (Reaction Formula 2I)_DHPh-PFSt Den-(PhOH)$_6$ (0.50 g, 0.56 mmol), 2,3,4,5,6-pentafluorostyrene (0.98 g, 5.0 mmol), K$_2$CO$_3$ (0.93 g, 6.7 mmol), and anhydrous dimethylformamide (hereafter anhydrous DMF) (7 cm$^3$) were added to a Schlenk tube (25 cm$^3$). The mixture was stirred at 70° C. for 12 hours to perform the reaction represented by Reaction Formula 2I. After the reaction was complete, the product was cooled to room temperature (about 25° C.). A product was extracted using ethyl acetate and washed water and saturated sodium chloride aqueous solution. As a result, a separated organic layer was obtained. The separated organic layer was treated with anhydrous MgSO$_4$ to remove residual water and concentrated under reduced pressure. The concentrated product was purified by column chromatography (stationary phase: silica gel, mobile phase: ethyl acetate:hexane=1:4) to obtain a final product, DHPh-PFSt. The final product was a white solid.

[Yield Analysis]

The final product is 0.90 g. The yield was 83% according to the analysis.

[Nuclear Magnetic Resonance (NMR) Analysis]

The chemical shift values (δ) of the final product (DHPh-PFSt), measured by $^1$H NMR (400 MHz, CDCl$_3$), were 7.03 (d, J=8.4 Hz, Ar-12H), 6.99-6.90 (m, Ar-12H), 6.87 (d, J=8.2 Hz, Ar-12H), 6.67 (dd, J=17.8, 12.0 Hz, Vinyl-6H), 6.10 (d, J=18.0 Hz, Vinyl-6H), 5.70 (d, J=11.8 Hz, Vinyl-6H), and 2.12 (s, ArCH3-12H).

Therefore, the final product (DHPh-PFSt) of Experimental Example 1I is a monomolecular resist bonded with six functional groups (pentafluorostyrene) represented by Formula 7-4 and 1,1,1-tris(4-(1,1-bis(4-(2,3,5,6-tetrafluoro-4-vinylphenoxy) phenyl) ethyl) phenyl) ethane.

2. Synthesis of Second Resist Core (1) Synthesis of Precursor A of the Second Resist Core (Reaction Formula 3-1)

A dendrimer-type phenol den-(PhOH)$_4$(PhAcyl)1 with an acyl group (Reaction Formula 3-1)

Den-(PhOAcyl)$_3$ (4.0 g, 10.4 mmol), phenol (23.5 g, 250 mmol), acetic acid (24 cm$^3$), and hydrochloric acid (12 M aqueous solution, 70 cm$^3$) were added to a round flask (250 cm$^3$) and reacted at 90° C. for 48 hours. After the reaction was complete, the product was precipitated in water to obtain a precipitated solid. The obtained solid was dissolved in ethyl acetate, washed with water, and treated with anhydrous MgSO$_4$ to remove residual water. Thereafter, the product obtained by concentration was purified by column chromatography (stationary phase: silica gel, mobile phase: tetrahydrofuran:hexane=2:1) to obtain precursor A (hereinafter, den-(PhOH)4(PhAcyl)1) of the white solid, second resist core.

[Yield Analysis]

The mass of precursor A den-(PhOH)$_4$(PhAcyl)1 of the second resist core of the product was 1.47 g. The yield was 20% according to the analysis.

[Nuclear Magnetic Resonance (NMR) Analysis]

The chemical shift values (δ) of the synthesized material measured by $^1$H NMR (400 MHz, DMSO-d6) were 1.98 (s, 9H, CH$_3$), 2.53 (s, 3H, OCOCH$_3$), 6.64 (d, 8H, J=8 Hz, Ar—H), 6.81 (d, 8H, J=8 Hz, Ar—H), 6.93 (d, 8H, Ar—H), 7.20 (d, 8H, J=8 Hz, Ar—H), 7.87 (d, 2H, J=8 Hz, Ar—H), and 9.22 (d, 2H, Ar—H).

Therefore, it can be confirmed that the product is the product of Reaction Formula 3-1.

(2) Synthesis of Precursor B of the Second Resist Core (Reaction Formula 4-1)

Synthesis of a dendrimer-type phenol [den-(PhOPFPE-M)$_4$(PhAcyl)1 with an acyl group and a perfluoroalkyl ether PFPE-M chain (Reaction Formula 4-1)

Den-(PhOH)4(PhAcyl)1 (0.7 g, 0.96 mmol), K$_2$CO$_3$ (1.6 g, 4.83 mmol), and dimethylformamide (DMF) (15 cm$^3$) were added to a Schlenk tube (50 cm$^3$), stirred at 60° C. for 10 minutes. Then, 1,1,2,2,3,3-hexafluoro-1-(trifluoromethoxy)-3-[(1,2, 2-trifluorovinyl)oxy]propane (1.60 g, 4.83 mmol) was added to the mixture and reacted at 60° C. for 2 hours. After the reaction was complete, the mixture was extracted using ethyl acetate, and the organic layer was washed with water and treated with MgSO$_4$ to remove residual water. Thereafter, the product was concentrated and dried in a vacuum oven to obtain precursor B den-(PhOPFPE-M)4(PhAcyl) 1 of the pale yellow solid, second resist core.

[Yield Analysis]

The mass of the product den-(PhOPFPE-M)4(PhAcyl)1 was 1.73 g. The yield was 87% according to the analysis

[Nuclear Magnetic Resonance (NMR) Analysis]

The chemical shift values (δ) of the synthesized material measured by $^1$H NMR (400 MHz, CDCl$_3$) were 2.14 (s, 9H, CH$_3$), 2.56 (s, 3H, OCOCH$_3$), 5.97-6.10 (d, 4H, CF$_2$CFHO), 6.95-7.07 (m, 24H, Ar—H), 7.20 (d, 2H, J=8 Hz, Ar—H), and 7.85 (d, 2H, J=8 Hz, Ar—H).

Therefore, it can be confirmed that the product is the product of Reaction Formula 4-1.

(3) Synthesis of Second Resist Core (Reaction Formula 5-1)

Synthesis of dendrimer-type phenol [den-(PhOPFPE-M)$_4$(PhOH)$_2$] with perfluoroalkyl ether (PFPE-M) chain and a phenol group Den-(PhOPFPE-M)$_4$(PhOAcyl)1 (0.4 g, 0.19 mmol), phenol (4.0 g, 42.50 mmol), and hydrochloric acid (12 M aqueous solution, 4 cm$^3$) were added to a pressure reactor, seal tube (14 cm$^3$). The mixture was reacted at 90° C. for 72 hours. The mixture was poured into water. The precipitated crude solid was filtered and dissolved in ethyl acetate. The solution was washed with water, and treated with anhydrous MgSO$_4$ to remove residual water and concentrated under reduced pressure. The concentrated crude product was then purified by column chromatography (stationary phase: silica gel, mobile phase: tetrahydrofuran:hexane=1:3) to obtain ta product, den-(PhOPFPE-M)$_4$(PhOH)$_2$. The product was a white solid.

[Yield Analysis]

The mass of the product, den-(PhOPFPE-M)$_4$(PhOH)$_2$] was 0.08 g. The yield was 20% according to the analysis.

[Nuclear Magnetic Resonance (NMR) Analysis]

The chemical shift values (δ) of the synthesized material measured by $^1$H NMR (400 MHz, CDCl$_3$) were 2.11 (s, 12H, CH$_3$), 6.03 (d, 4H, J=54 Hz, CF$_2$CFHO), and 6.60-7.08 (m, 36H, Ar—H).

Therefore, it can be confirmed that the second resist core is the product of Reaction Formula 5-1.

3. Synthesis of Second Resist Compound (1) Experimental Example 1J_Synthesis of Resist Compound of Formula 8F (Reaction Formula 6-1)

Synthesis of Dendrimer-Type Phenol [Den-(PhOPFPE-M)$_4$(PhOAcryl)$_2$] with Perfluoroalkyl Ether (PFPE-M) Chain and Acryl Group Den-(PhOPFPE-M)$_4$(PhOH)$_2$ (0.4 g, 1.18 mmol), anhydrous dimethylformaide (DMF) (4 cm$^3$), triethylamine (0.29 g, 2.88 mmol), and 4-dimethylaminopyridine (0.002 g, 0.02 mmol) were added to a Schlenk tube (25 cm$^3$) and stirred at 50° C. for 10 minutes to form. Acryloyl chloride (0.07 g, 0.72) were further added to the first mixture at 50° C. and reacted for 2 hours. The reaction product was extracted using ethyl acetate. The organic layer was washed with water and treated with anhydrous MgSO$_4$ to remove residual water and concentrated under reduced pressure. The concentrated product was purified by column chromatography (stationary phase: silica gel, mobile phase: ethyl acetate: hexane=1:3) to obtain a final product, den-(PhOPFPE-M)$_4$ (PhOAcryl)$_2$. Den-(PhOPFPE-M)$_4$(PhOAcryl)$_2$ was a white solid.

[Yield Analysis]

The mass of product den-(PhOPFPE-M)$_4$(PhOAcryl)$_2$ was 0.2 g. The yield was 48% according to the analysis.

[Nuclear Magnetic Resonance (NMR) Analysis]

The chemical shift values (δ) of the synthesized material measured by $^1$H NMR (400 MHz, CDCl$_3$) were 2.17 (s, 12H, CH$_3$), 6.01 (m, 2H, Acryl-H), 6.09 (d, 4H, CF$_2$CFHO), 6.27-6.41 (m, 2H, Acryl-H), 6.61 (d, 2H, J=18 Hz, Acryl-H), 6.91-7.18 (m, 36H, Ar—H), 2.11 (s, 12H, CH$_3$), 6.03 (d, 4H, J=54 Hz, CF$_2$CFHO), and 6.60-7.08 (m, 36H, Ar—H).

Therefore, it can be confirmed that the synthesized product of Experimental Example 1J is the compound represented by Formula 8F.

(2) Experimental Example 1K_Synthesis of Resist Compound of Formula 8G (Reaction Formula 6-2)

Synthesis of dendrimer-type phenol [den-(PhOPFPE-M)$_4$ (PhOSi-vinyl)$_2$] with perfluoroalkyl ether (PFPE-M) chain and a silyl vinyl group.

Den-(PhOPFPE-M)$_4$(PhOH)$_2$ (0.2 g, 0.09 mmol), 1-dioxo-1,2-benzothiazol-3-one (saccharin) (0.002 g, 0.01 mmol) and tetrahydrofuran (3 cm$^3$) were added to a Schlenk tube (25 cm$^3$) and stirred at 50° C. for 10 minutes. 1,3-divinyl-1,1,3,3,-tetramethyldisilazane (0.05 g, 0.27 mmol) was added to the mixture at 50° C. and reacted for 2 hours. After the reaction was complete, the mixture was cooled to room temperature and extracted using ethyl acetate to form an organic layer. The organic layer was washed with water and treated with anhydrous MgSO$_4$ to remove residual water concentrated under reduced pressure. The concentrated product is then dissolved in ethyl acetate and precipitated in methanol to obtain a final product, den-(PhOPFPE-M)$_4$ (PhOSilylvinyl)$_2$. The final product was a pale yellow solid.

[Yield Analysis]

The mass of product, den-(PhOPFPE-M)$_4$(PhOSilylvinyl)$_2$ was 0.22 g. The yield was 93% according to the analysis.

[Nuclear Magnetic Resonance (NMR) Analysis]

The chemical shift values (δ) of the synthesized materials measured by $^1$H NMR (400 MHz CDCl$_3$) were 6.10-6.65 (m, 12H, Ar—H), 6.27-5.76 (m, 10H, CF$_2$CFHO, Vinyl-H), 2.11 (s, 12H, CH$_3$), and 0.29 (s, 12H, Si—CH$_3$).

Therefore, it can be confirmed that the synthesized product of Experimental Example 1K is the compound represented by Formula 8G.

(3) Experimental Example 1H_Synthesis of Resist Compound of Formula 8H (Reaction Formula 6-3)

Synthesis of dendrimer type phenol [den-(PhOPFPE-M)$_4$ (PhOAllyl)$_2$] with perfluoroalkyl ether (PFPE-M) chain and an allyl group.

Den-(PhOPFPE-M)$_4$(PhOH)$_2$ (0.5 g, 0.23 mmol), K$_2$CO$_3$ (0.19 g, 1.35 mmol), and anhydrous DMF (5.0 cm$^3$) were added to a Schlenk tube (25 cm$^3$) and stirred at 60° C. for 30 minutes. Allyl bromide (0.11 g, 0.90 mmol) and DMF (0.5 cm$^3$) were further added to the first mixture at 60° C. to form a second mixture. The second mixture was reacted for 12 hours. The reaction mixture was extracted using ethyl acetate. The extracted product solution was washed with water and saturated sodium chloride aqueous solution and then treated with anhydrous MgSO$_4$ to remove residual water. The product obtained by concentration was then dissolved in a small amount of ethyl acetate and precipitated in methanol. The precipitate was filtered to obtain a white solid, final product, [den-(PhOPFPE-M)$_4$(PhOAllyl)$_2$].

[Yield Analysis]

The mass of the product [den-(PhOPFPE-M)$_4$ (PhOAllyl)$_2$] was 0.26 g. The yield was 50% according to the analysis.

[Nuclear Magnetic Resonance (NMR) Analysis]

The chemical shift values (δ) of the synthesized material measured by $^1$H NMR (400 MHz, CDCl$_3$) were 2.13 (s, 12H, CH$^3$), 4.50 (d, 4H, J=5 Hz, Allyl-H), 5.33 (dd, 4H, J=51 Hz, 14 Hz, Allyl-H), 5.99 (s, 2H, CF$_2$CFHO), 6.01-6.10 (m, 2H, Allyl-H), 6.12 (s, 2H, CF$_2$CFHO), 6.80 (d, 4H, J=8 Hz, Ar—H), and 6.90-7.15 (m, 32H, Ar—H).

Therefore, it can be confirmed that the second resist core is the product of Reaction Formula 6-3.

3. Formation of Resist Pattern 1_Lithography

Experimental Example 2A

A resist compound solution (5 wt/vol %) of Experimental Example 1A dissolved in PF-7600 (obtained from 3M) was prepared. The resist compound solution was spin-coated on a silicon (Si) substrate at 3000 rpm for 60 seconds. Thereafter, the silicon substrate was heated at 130° C. for 1 minute to form a resist layer (thickness: 120 nm). The resist film was irradiated by electron beam of 10 µC/cm$^2$ to 3,000 µC/cm$^2$ at an accelerating voltage of 80 keV. Using FC-3283 (obtained from 3M) as a developing solution, the development process of the resist layer was performed for 20 seconds to form a negative resist pattern.

Experimental Example 2B

The resist compound solution (5 wt/vol %) of Example 1B dissolved in HFE-7500 (obtained from 3M) was prepared. The resist compound solution was spin-coated on a silicon (Si) substrate at 3000 rpm for 60 seconds. Thereafter, the silicon substrate was heated at 130° C. for 1 minute to form a resist layer (thickness: 120 nm). The resist film was irradiated by electron beam of 10 µC/cm$^2$ to 3,000 µC/cm$^2$ at an accelerating voltage of 80 keV. Using Gladen HT-110 (obtained from Solvay) as a developing solution, the development process of the resist layer was performed for 40 seconds to form a negative resist pattern.

Experimental Example 2C

The resist compound solution (2 wt/vol %) of Example 1D dissolved in PF-7600 (obtained from 3M) was prepared. The resist compound solution was spin-coated on a silicon (Si) substrate at 3000 rpm for 60 seconds. Thereafter, the silicon substrate was heated at 130° C. for 1 minute to form a resist layer (thickness: 100 nm). The resist film was irradiated by electron beam of 10 µC/cm$^2$ to 3,000 µC/cm$^2$ at an accelerating voltage of 80 keV. Using HFE-7300 (obtained from 3M) as a developing solution, the development process of the resist layer was performed for 30 seconds to form a negative resist pattern.

Experimental Example 2D

A resist compound solution (5 wt/vol %) of Example 1E dissolved in a mixed solvent of HFE-7500 and PGMEA(1-Methoxy-2-Propyl Acetate was prepared. The resist compound solution was spin-coated on a silicon (Si) substrate at 3000 rpm for 60 seconds. Thereafter, the silicon substrate was heated at 130° C. for 1 minute to form a resist layer (thickness: 100 nm). The resist film was irradiated by electron beam of 10 µC/cm$^2$ to 3,000 µC/cm$^2$ at an accelerating voltage of 80 keV. Using HFE-7100 (obtained from 3M) as a developing solution, the development process of the resist layer was performed for 30 seconds to form a negative resist pattern.

Experimental Example 2E

A resist compound solution (2.5 wt/vol %) in which the final product DHPh-PFT of Experimental Example 1F was dissolved in a mixture of n-butyl acetate (nBA) and methyl isobutyl ketone (MIBK) was prepared. The resist compound solution was spin-coated on a silicon (Si) substrate at 2500 rpm for 60 seconds. Thereafter, the silicon substrate was heated at 130° C. for 1 minute to form a resist layer (thickness: 100 nm). The resist film was irradiated by electron beam of 50 µC/cm$^2$ to 1,500 µC/cm$^2$ at an accelerating voltage of 80 keV. Using HFE-7300 (obtained from 3M) as a developing solution, the development process of the resist layer was performed for 10 seconds to form a negative resist pattern.

Experimental Example 2F

A resist compound solution (2.5 wt/vol %) in which the final product DHPh-PFB of Experimental Example 1G was dissolved in a mixture of n-butyl acetate (nBA) and methyl isobutyl ketone (MIBK) was prepared. The resist compound solution was spin-coated on a silicon (Si) substrate at 2500 rpm for 60 seconds. Thereafter, the silicon substrate was heated at 130° C. for 1 minute to form a resist layer (thickness: 100 nm). The resist film was irradiated by electron beam of 50 µC/cm$^2$ to 1,500 µC/cm$^2$ at an accelerating voltage of 80 keV. Using HFE-7200 (obtained from 3M) as a developing solution, the development process of the resist layer was performed for 30 seconds to form a negative resist pattern.

Experimental Example 2G

A resist compound solution (2.5 wt/vol %) in which the final product DHPh-PFBI of Experimental Example 1H was dissolved in a mixture of n-butyl acetate (nBA) and methyl isobutyl ketone (MIBK) was prepared. The resist compound solution was spin-coated on a silicon (Si) substrate at 2500 rpm for 60 seconds. Thereafter, the silicon substrate was heated at 130° C. for 1 minute to form a resist layer (thickness: 100 nm). The resist film was irradiated by electron beam of 50 µC/cm$^2$ to 1,500 µC/cm$^2$ at an accelerating voltage of 80 keV. Using HFE-7200 (obtained from 3M) as a developing solution, the development process of the resist layer was performed for 30 seconds to form a negative resist pattern.

Experimental Example 2H

A resist compound solution (2.5 wt/vol %) in which the final product DHPh-PFSt of Experimental Example 1I was dissolved in n-butyl acetate (nBA) was prepared. The resist compound solution was spin-coated on a silicon (Si) substrate at 2500 rpm for 60 seconds. Thereafter, the silicon substrate was heated at 130° C. for 1 minute to form a resist layer (thickness: 100 nm). The resist film was irradiated by electron beam of 50 µC/cm$^2$ to 1,500 µC/cm$^2$ at an accelerating voltage of 80 keV. Using benzotrifluoride (obtained from Sigma-Aldrich) as a developing solution, the development process of the resist layer was performed for 5 seconds to form a negative resist pattern.

Experimental Example 3A

A resist compound solution (2 wt/vol %) of Example 1A dissolved in HFE-7500 was prepared. The resist compound solution was spin-coated on a silicon (Si) substrate at 3000 rpm for 60 seconds. Thereafter, the silicon substrate was heated at 130° C. for 1 minute to form a resist layer (thickness: 150 nm). The resist film was irradiated by extreme ultraviolet (EUV) exposure doses of 30 mJ/cm$^2$ to 7000 mJ/cm$^2$ extracted from 4 A beamline of the Pohang Accelerator Laboratory (PAL). Using FC-3283 as a developing solution, the development process of the resist layer was performed for 20 seconds to form a negative resist pattern. The resist pattern was observed to have a width ranging from 10 µm to 900 µm.

Experimental Example 3B

A resist compound solution (2.5 wt/vol %) in which the final product DHPh-PFT of Experimental Example 1F was dissolved in a mixture of n-butyl acetate (nBA) and methyl isobutyl ketone (MIBK) was prepared. The resist compound solution was spin-coated on a silicon (Si) substrate at 2500 rpm for 1 minute. Thereafter, the silicon substrate was heated at 130° C. for 1 minute to form a resist layer (thickness: 100 nm). The resist film was irradiated by EUV exposure doses of 10 mJ/cm$^2$ to 250 mJ/cm$^2$ extracted from 4 A beamline of the PAL. Using HFE-7300 (obtained from 3M) as a developing solution, the development process of the resist layer was performed for 10 seconds to form a negative resist pattern.

Comparative Example 1

CYTOP (obtained from AGC) polymer and FC-40 were mixed in a volume ratio of 1:3 to prepare a CYTOP polymer solution. The CYTOP polymer solution was spin-coated on a silicon substrate at 3000 rpm for 60 seconds. Thereafter, the silicon substrate was heated at 130° C. for 1 minute to form a resist layer (thickness: 130 nm). The resist film was irradiated by electron beam of 100 μC/cm$^2$ to 500 μC/cm$^2$ at an accelerating voltage of 80 keV. Using HFE-7200 (obtained from 3M) as a developing solution, the development process of the resist layer was performed for 30 seconds to form a positive resist pattern.

Comparative Example 2

Hyflon AD (obtained from Solvay) and FC-40 (obtained from 3M) were mixed in a volume ratio of 1:3 to prepare a Hyflon AD solution. The Hyflon AD solution was spin-coated on a silicon substrate at 3000 rpm for 60 seconds. Thereafter, the silicon substrate was heated at 110° C. for 1 minute to form a resist layer (thickness: 120 nm). The resist film was irradiated by electron beam of 300 μC/cm2 to 600 μC/cm$^2$ at an accelerating voltage of 80 keV. Using PF-7600 as a developing solution, the development process of the resist layer was performed for 10 seconds to form a positive resist pattern.

Comparative Example 3

A Teflon AF (obtained from DuPont) polymer solution (1 wt %) dissolved in FC-40 (obtained from 3M) was prepared. The Teflon AF polymer solution was spin-coated on a silicon substrate at 3000 rpm for 60 seconds. Thereafter, the silicon substrate was heated at 130° C. for 1 minute to form a resist layer (thickness: 130 nm). The resist film was irradiated by electron beam of 500 μC/cm2 to 700 μC/cm$^2$ at an accelerating voltage of 80 keV. Using PF-7600 as a developing solution, the development process of the resist layer was performed for 30 seconds to form a positive resist pattern.

4. Synthesis of Resist Compound 2

(1) Experimental Example 4_Core Synthesis (Reaction Formula 7)_DOPh 1,1,1,1-tetrakis(4-acetylphenyl) methane (0.11 g, 0.23 mmol), phenol (1.5 g), and hydrochloric acid (12 M aqueous solution, 1.5 cm$^3$) were added to a pressure reactor (Seal tube, 10 cm$^3$). The mixture was stirred at 90° C. for 48 hours and reacted. After cooling to room temperature, the mixture was filtered to obtain a solid product. The solid product was washed with water. The product was dried and purified by column chromatography (stationary phase: silica gel, mobile phase: tetrahydrofuran:hexane=3:1). After the purification process using chromatography was complete, a light orange solid product, dendritic octaphenol (hereinafter referred to as DOPh) was obtained.

[Yield Analysis]
The final product is 0.06 g. The yield was 23% according to the analysis.

[Nuclear Magnetic Resonance (NMR) Analysis]
The chemical shift values (δ) of the final product, measured by $^1$H NMR (400 MHz, CDCl$_3$), were 1.97 (s, 12H, CH$_3$), 6.62 (d, J=8.2 Hz, 16H, Ar—H), 6.78 (d, J=8.1 Hz, 16H, Ar—H), 6.88-6.99 (m, 16H, Ar—H), and 9.21 ppm (s, 8H, Ar—OH).

Therefore, it can be confirmed that the final product (DOPh) of Experimental Example 4 is the product of Reaction Formula 7.

(2) Experimental Example 4A_Synthesis of Resist Compound Bonded with Functional Group of Formula 6-1 (Reaction Formula 8-1)_DOPh-6Boc DOPh (0.19 g, 0.162 mmol) and 4-dimethylaminopyridine (0.010 g, 0.081 mmol) were added to a one-neck round flask (50 cm$^3$). Anhydrous THF (3 cm$^3$) was added to the mixture and dissolved. Di-tert-butyl dicarbonate (0.213 g, 0.975 mmol) solution in anhydrous THF (1.5 cm$^3$) was added to the mixture. The mixture was reacted at room temperature (25° C.) for 1 hour. After the reaction, the reaction mixture was extracted using ethyl acetate. As a result, an organic layer was obtained. The organic layer was washed with water and saturated sodium chloride aqueous solution and then treated with anhydrous MgSO$_4$ to remove residual water. The crude product was dissolved in THF and then precipitated in methanol and filtered to obtain the product. The product was dried to obtain a yellow solid, final product, DOPh-6Boc.

[Yield Analysis]
The final product is 0.16 g. The yield was 56% according to the analysis.

[Nuclear Magnetic Resonance (NMR) Analysis]
The chemical shift values (δ) of the final product, measured by $^1$H NMR (400 MHz, (CD$_3$)$_2$CO), were 1.51 (s, 50H, (CH$_3$)$_3$C), 2.08-2.21 (m, 12H, CH$_3$), and 6.67-7.17 (m, 48H, Ar—H).

Therefore, it can be confirmed that the final product (DOPh-6Boc) of Experimental Example 4A is the compound represented by Formula 8I. In addition, it can be seen that six of $R_1$, $R_2$, $R_3$, $R_4$, $R_5$, $R_6$, $R_7$, and $R_8$ are represented by Formula 6-1, and the remaining two are hydrogen.

(3) Experimental Example 4B_Synthesis of Resist Compound Bonded with Functional Group of Formula 6-1 (Reaction Formula 8-1)_DOPh-4Boc DOPh (0.3 g, 0.257 mmol) and 4-dimethylaminopyridine (0.016 g, 0.13 mmol) were added to a one-neck round flask (50 cm$^3$). Anhydrous THF (3 cm$^3$) was added to the mixture and dissolved. Di-tert-butyl dicarbonate (0.224 g, 1.03 mmol) solution in anhydrous THF (1.5 cm$^3$) was added to the mixture. Thereafter, the mixture was reacted at room temperature for 1 hour. The mixture was extracted using ethyl acetate, and an extracted organic layer was obtained. The extracted organic layer was washed with water and saturated sodium chloride aqueous solution and treated with anhydrous MgSO$_4$ to remove residual water. The crude product was precipitated in methanol, filtered, and dried. A yellow solid, final product (DOPh-4Boc) was obtained.

[Yield Analysis]
The final product is 0.24 g. The yield was 59% according to the analysis.

[Nuclear Magnetic Resonance (NMR) Analysis]
The chemical shift values (δ) of the final product, measured by $^1$H NMR (400 MHz, (CD$_3$)$_2$CO), were 1.51 (s, 40H, (CH$_3$)$_3$C), 2.08-2.21 (m, 12H, CH$_3$), and 6.67-7.20 (m, 48H, Ar—H).

Therefore, it can be confirmed that the final product (DOPh-4Boc) of Experimental Example 4B is the compound represented by Formula 8I. In addition, it can be seen that four of $R_1$, $R_2$, $R_3$, $R_4$, $R_5$, $R_6$, $R_7$, and $R_8$ are represented by Formula 6-1, and the remaining four are hydrogen.

(4) Experimental Example 4C_Synthesis of Resist Compound Bonded with Functional Group of Formula 6-2 (Reaction Formula 8-2)_DOPh-3BAc DOPh (0.4 g, 0.34 mmol), $K_2CO_3$ (0.71 g, 5.13 mmol), and anhydrous DMF (5 cm$^3$) were added to a one-neck round flask (50 cm$^3$) to form a mixture. The mixture was stirred at 70° C. for 30 minutes. Thereafter, tert-butyl bromoacetate (0.267 g, 1.368 mmol) was added at 70° C. and reacted for 3 hours. The reaction mixture was cooled to room temperature and extracted using ethyl acetate. As a result, an extracted organic layer was obtained. The extracted organic layer was washed with water and saturated sodium chloride aqueous solution and then treated with anhydrous $MgSO_4$ to remove residual water. Thereafter, the product was precipitated in methanol, filtered, and dried. A yellow solid, final product, DOPh-3Bac was obtained.

[Yield Analysis]

The final product is 0.19 g. The yield was 36% according to the analysis.

[Nuclear Magnetic Resonance (NMR) Analysis]

The chemical shift values ($\delta$) of the final product, measured by $^1$H NMR (400 MHz, $(CD_3)_2CO$), were 1.43 (s, 27H, $(CH_3)_3C$), 2.06-2.10 (m, 12H, $CH_3$), 4.55 (s, 6H, $CH_2$), and 6.67-7.12 (m, 48H, Ar—H).

Therefore, it can be confirmed that the final product (DOPh-3BAc) of Experimental Example 4C is the compound represented by Formula 8I. In addition, it can be seen that three of $R_1$, $R_2$, $R_3$, $R_4$, $R_5$, $R_6$, $R_7$, and $R_8$ are represented by Formula 6-2, and the remaining five are hydrogen.

(5) Experimental Example 4D_Synthesis of Resist Compound Bonded with Functional Group of Formula 2-2 (Reaction Formula 8-3)_DOPh-8FEM DOPh (0.22 g, 0.188 mmol), $K_2CO_3$ (0.39 g, 2.822 mmol), and anhydrous DMF (5 cm$^3$) were added to a one-neck round flask (50 cm$^3$) to form a mixture. The mixture was stirred at 50° C. for 30 minutes. Thereafter, 1,1,2,2,3,3-hexafluoro-1-[(trifluoroethenyl)oxy]-3-trifluoromethoxy-propane (0.625 g, 1.881 mmol) was added to the mixture at 60° C. and reacted for 3 hours. The mixture was cooled to room temperature, and the cooled mixture was extracted using ethyl acetate to obtain an extracted organic layer. As a result, an extracted organic layer was obtained. The extracted organic layer was washed with water and saturated sodium chloride aqueous solution and treated with anhydrous $MgSO_4$ to remove residual water. The concentrated product was then purified by column chromatography (stationary phase: silica gel, mobile phase: ethyl acetate: hexane=1:5). A white solid, final product, DOPh-8FEM was obtained.

[Yield Analysis]

The final product is 0.56 g. The yield was 78% according to the analysis.

[Nuclear Magnetic Resonance (NMR) Analysis]

The chemical shift values ($\delta$) of the final product measured by $^1$H NMR (400 MHz, $CDCl_3$) were 2.12 (s, 12H, $CH_3$), 6.02 (d, 8H, J=53.4 Hz, $CF_2CFHO$), 6.91 (d, 8H, J=7.8 Hz, Ar—H), and 6.99-7.08 ppm (m, 40H, Ar—H).

Therefore, it can be confirmed that the final product (DOPh-8FEM) of Experimental Example 4D is the product of Reaction Formula 8-3. In addition, in the product of Reaction Formula 8-3, it can be seen that all eight R's are compounds represented by Formula 2-2.

(6) Experimental Example 4E_Synthesis of Resist Compound Bonded with Functional Group of Formula 2-3 (Reaction Formula 8-4)_DOPh-8FES DOPh (0.40 g, 0.342 mmol), $K_2CO_3$ (0.71 g, 5.131 mmol), and anhydrous DMF (5 cm$^3$) were added to a one-neck round flask (50 cm$^3$) to form a mixture. The mixture was stirred at room temperature for 30 minutes. Thereafter, 1,1,1,2,2,3,3-heptafluoro-3-[trifluoroethenyloxy]propane (0.91 g, 3.421 mmol) was added to the mixture at room temperature and reacted for 3 hours. The reaction mixture was extracted using ethyl acetate to obtain an extracted organic layer. As a result, an extracted organic layer was obtained. The extracted organic layer was washed with water and saturated sodium chloride aqueous solution and then treated with anhydrous $MgSO_4$ to remove residual water. The concentrated product was then purified by column chromatography (stationary phase: silica gel, mobile phase: ethyl acetate:hexane=1:5). A white solid, final product (DOPh-8FES) was obtained.

[Yield Analysis]

The final product is 0.59 g. The yield was 52% according to the analysis.

[Nuclear Magnetic Resonance (NMR) Analysis]

The chemical shift values ($\delta$) of the final product measured by $^1$H NMR (400 MHz, $CDCl_3$) were 2.13 (s, 12H, $CH_3$), 6.03 (d, 8H, J=53.3 Hz, $CF_2CFHO$), 6.91 (d, 8H, J=7.4 Hz, Ar—H), and 6.99-7.09 ppm (m, 40H, Ar—H).

Therefore, it can be seen that the final product (DOPh-8FES) of Experimental Example 4E is a product of Reaction Formula 8-4. In addition, in the product of Reaction Formula 8-4, it can be seen that all eight R's are compounds represented by Formula 2-2.

5. Formation of Resist Pattern 2_Lithography

<Experimental Example 5A>_Photolithography Using i-Line UV (365 nm)

Using the DOPh-4Boc compound synthesized according to the Experimental Example 4B, photolithography patterning was performed under the condition of ultraviolet irradiation (365 nm wavelength). A mixed solvent of PGMEA (1-Methoxy-2-Propyl acetate) and PGME (propylene glycol methyl ether) in a 1:1 ratio was prepared. DOPh-4Boc (20 mg) and CGI-1907 (available from BASF) (1 mg) as a photoacid generator were dissolved in the mixed solvent (0.4 cm$^3$) to prepare a resist solution. A silicon substrate treated with hexamethyl disilazane (HMDS) was prepared. A resist solution (5 wt/vol %) was spin-coated on the silicon substrate at 3000 rpm for 60 seconds and then heated at 110° C. for 1 minute to form a resist thin film. Thereafter, the resist thin film was irradiated with ultraviolet rays of exposure dose of 0.56 J cm$^{-2}$ to 4.0 J cm$^{-2}$. The resist thin film was heated at 140° C. for 1 minute and then developed with 0.26 M TMAH (tetramethylammonium hydroxide) aqueous solution. It was confirmed that a positive pattern was formed.

<Experimental Example 5B>_Photolithography Using i-Line UV (365 nm)

Using the DOPh-3BAc compound synthesized according to Experimental Example 4C, photolithography patterning was performed under the condition of ultraviolet irradiation (365 nm wavelength). A mixed solvent of PGMEA (1-Methoxy-2-Propyl acetate) and PGME (propylene glycol methyl ether) in a 1:1 ratio was prepared. DOPh-4Boc (20 mg) and nonafluorobutanesulfonyloxy-1,8-naphthalimide (1 mg) as a photoacid generator were dissolved in the mixed solvent (0.4 cm3) to prepare a resist solution. A silicon substrate treated with hexamethyl disilazane (HMDS) was prepared. A resist solution (5 wt/vol %) was spin-coated on the silicon substrate at 3000 rpm for 60 seconds and then heated at 110° C. for 1 minute to form a resist thin film. Thereafter, the resist thin film was irradiated with ultraviolet rays of doses of 0.08 J cm$^{-2}$ to 4.0 J cm$^{-2}$. The resist thin film was heated at 110° C. for 1 minute and then developed with 0.26 M TMAH (tetramethylammonium hydroxide) aqueous solution. It was confirmed that a positive pattern was formed.

<Experimental Example 5C>_Photolithography 1 Using an Electron Beam

The resist compound DOPh-8FEM of Example 4D was dissolved in HFE-7500 to prepare a resist solution (5 wt/vol %). Using the resist solution, spin coating was performed on a silicon substrate at 3000 rpm for 60 seconds, and the substrate coated with the resist solution was heated at 130° C. for 1 minute to form a resist thin film (thickness: 100 nm). The thickness of the resist thin film was formed to 100 nm. Thereafter, the resist film was irradiated by electron beam of doses of 450 μC/cm$^2$ to 1,500 μC/cm$^2$ at an accelerating voltage of 80 keV. The development process was performed on the resist thin film using FC-3283 for 5 seconds. A negative resist pattern of several tens of nanometers in size was formed. The negative resist pattern was observed to have a width of 30 nm to 100 nm.

<Experimental Example 5D>_Photolithography 2 Using Electron Beams

The resist compound DOPh-8FES of Example 4E was dissolved in PF-7600 to prepare a resist solution (5 wt/vol %). The resist solution was spin coated on the silicon substrate at 3000 rpm for 60 seconds. The silicon substrate coated with the resist solution was heated at 130° C. for 1 minute to form a resist thin film (thickness: 100 nm). Thereafter, the resist film was irradiated by electron beam of doses of 850 μC/cm$^2$ to 1,500 μC/cm$^2$ at an accelerating voltage of 80 keV. The development process was performed on the resist thin film using FC-770 (obtained from 3M) for 35 seconds. A negative resist pattern having a width of 30 nm to 100 nm was formed.

<Experimental Example 5E>_Lithography Using Extreme Ultraviolet Rays

The resist compound DOPh-8FEM of Example 4E was dissolved in HFE-7500 to prepare a resist solution (5 wt/vol %). The resist solution was spin coated on a silicon substrate at 3000 rpm for 60 seconds. Thereafter, the silicon substrate coated with the resist solution was heated at 130° C. for 1 minute to form a resist thin film (thickness: 100 nm). The resist film was irradiated by EUV exposure doses of 10 mJ/cm$^2$ to 200 mJ/cm$^2$ extracted from 4 A beamline at the PAL. The development process was performed on the resist thin film using FC-3283 for 5 seconds to prepare a negative resist pattern.

Table 1 shows the results of evaluating the fail of success of the pattern formation of Comparative Examples 1 to 3 and Experimental Examples 2A to 2H. The pattern formation of Comparative Examples 1 to 3 and Experimental Examples 2A to 2D was analyzed by scanning electron microscopy. The pattern formation of Experimental Example 2E was analyzed by a microscope.

TABLE 1

|  | Fail or Success of Pattern Formation | Pattern width |
|---|---|---|
| Comparative Example 1 | ○ | 100 nm |
| Comparative Example 2 | ○ | 70 nm |
| Comparative Example 3 | ○ | 100 nm |
| Experimental Example 2A | ○ | 50 nm |
| Experimental Example 2B | ○ | 70 nm |
| Experimental Example 2C | ○ | 50 nm |
| Experimental Example 2D | ○ | 50 nm |
| Experimental Example 2E | ○ | 50 nm-100 nm |
| Experimental Example 2F | ○ | 50 nm-100 nm |
| Experimental Example 2G | ○ | 50 nm-100 nm |
| Experimental Example 2H | ○ | 50 nm-100 nm |
| Experimental Example 3A | ○ | 400 μm-800 μm |
| Experimental Example 3B | ○ | 200 μm-300 μm |

Referring to Table 1 and FIG. 4, for Experimental Examples 2A to 2H, it can be confirmed that the resist pattern 300P was formed. The resist pattern 300P of Experimental Examples 2A to 2H has a relatively small width. According to Experimental Examples 3A and 3B, it was observed that the resist pattern 300P was formed using extreme ultraviolet rays.

The resist layer 300 of Experimental Examples 2A to 2H, Experimental Example 3A and 3B may be patterned by electron beams and extreme ultraviolet rays to form a resist pattern 300P. Each of the resist patterns 300P of Experimental Examples 2A to 2G, Experimental Example 3A and 3B has a narrow width. For example, each of the resist patterns 300P of Experimental Examples 2A to 2G, Experimental Example 3A and 3B has a width of several tens of nanometers.

Table 2 shows the results of evaluating the glass transition temperature of the resist compound of Experimental Example 1A and the product of Experimental Example 4. The glass transition temperature was evaluated by differential scanning calorimetry.

TABLE 2

|  | Glass transition temperature (Tg) |
|---|---|
| Resist compound of Experimental Example 1A | 130° C. |
| Product of Experimental Example 4 | 150° C. |

Referring to Table 2 and FIG. 4, the resist compound of Experimental Example 1A and the product of Experimental Example 4 were evaluated to have a relatively high glass transition temperature. For example, the resist compound of Experimental Example 1A has a glass transition temperature of 130° C. or higher. The product of Experimental Example 4 has a glass transition temperature of 150° C. Accordingly, the resist pattern 300P formed using the resist compound may have high durability and stability.

Table 3 shows the results of evaluating the fail or success of the pattern formation of Experimental Examples 5A to 5E. The pattern formation process was observed after the development process.

TABLE 3

|  | Fail or Success of Pattern Formation |
|---|---|
| Experimental Example 5A | ○ |
| Experimental Example 5B | ○ |
| Experimental Example 5C | ○ |
| Experimental Example 5D | ○ |
| Experimental Example 5E | ○ |

Referring to Table 3 and FIG. 5, for Experimental Examples 5A to 5E, it can be confirmed that the resist pattern 300P was formed.

According to the present disclosure, a resist compound may be used to form a resist pattern having a narrow width. The resist compound may have high absorbance for electron beams and/or extreme ultraviolet rays.

The foregoing detailed description is not intended to limit the inventive concept to the disclosed embodiments, and may be used in various other combinations, modifications, and environments without departing from the spirit of the inventive concept. The attached claims should be construed to include other embodiments.

What is claimed is:

1. A compound represented by Formula 1 below:

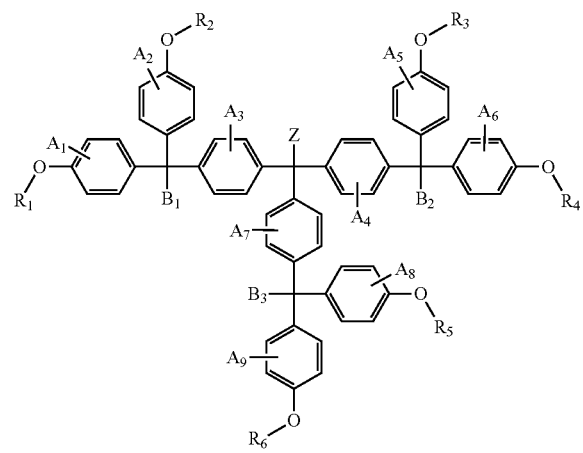

[Formula 1]

wherein in Formula 1, $A_1$, $A_2$, $A_3$, $A_4$, $A_5$, $A_6$, $A_7$, $A_8$, and $A_9$ are each independently one of hydrogen, deuterium, and an alkyl group having 1 to 5 carbon atoms, $B_1$, $B_2$, and $B_3$ are each independently one of hydrogen, deuterium, and an alkyl group having 1 to 5 carbon atoms, Z is one of hydrogen, deuterium, an alkyl group having 1 to 5 carbon atoms, and a substituted or unsubstituted hydrocarbon ring having 5 to 30 carbon atoms, and $R_1$, $R_2$, $R_3$, $R_4$, $R_5$, and $R_6$ each independently comprise one of deuterium, a halogen-substituted alkyl group having 3 to 20 carbon atoms, an alkenyl group having 3 to 20 carbon atoms, a silyl group having 1 to 10 carbon atoms, a carbonyl group having 2 to 10 carbon atoms, and a halogen-substituted hydrocarbon ring having 5 to 20 carbon atoms; provided that when at least one of $R_1$, $R_2$, $R_3$, $R_4$, $R_5$, and $R_6$ is comprise a carbonyl group having 2 to 10 carbon atoms, Z is a substituted or unsubstituted hydrocarbon ring having 5 to 30 carbon atoms.

2. The compound of claim 1, wherein in the Formula 1, at least one of $R_1$, $R_2$, $R_3$, $R_4$, $R_5$, or $R_6$ is represented by Formula 2 below:

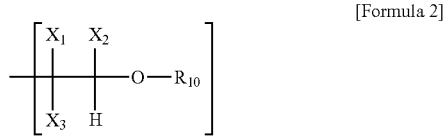

[Formula 2]

wherein in Formula 2, $X_1$, $X_2$, and $X_3$ each independently comprise one of halogen elements, $R_{10}$ comprises perhalogenated alkyl having 1 to 18 carbon atoms or perhalogenated alkyl ether halogenated alkyl having 1 to 18 carbon atoms.

3. The compound of claim 2, wherein the material represented by the Formula 2 comprises at least one of the materials represented by Formula 2-1, Formula 2-2, and Formula 2-3:

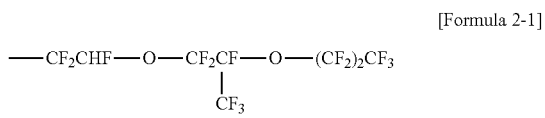

[Formula 2-1]

[Formula 2-2]

[Formula 2-3]

4. The compound of claim 2, wherein in the Formula 1, another one of $R_1$, $R_2$, $R_3$, $R_4$, $R_5$, or $R_6$ is represented by Formula 3, Formula 4, or Formula 5:

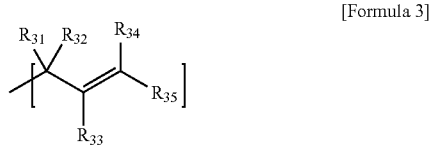

[Formula 3]

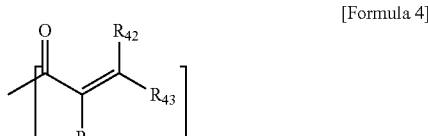

[Formula 4]

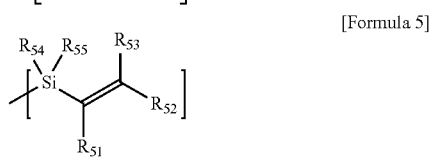

[Formula 5]

wherein in Formula 3, $R_{31}$, $R_{32}$, $R_{33}$, $R_{34}$, and $R_{35}$ are each independently one selected from hydrogen, deuterium, and an alkyl group having 1 to 3 carbon atoms, in Formula 4, $R_{41}$, $R_{42}$, and $R_{43}$ are each independently one selected from hydrogen, deuterium, and an alkyl group having 1 to 3 carbon atoms, and in Formula 5, $R_{51}$, $R_{52}$, $R_{53}$, $R_{54}$, and $R_{55}$ are each independently one selected from hydrogen, deuterium, and an alkyl group having 1 to 3 carbon atoms.

5. The compound of claim 1, wherein in the Formula 1, Z is represented by Formula Z:

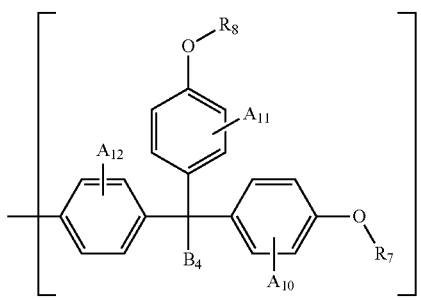

[Formula Z]

wherein in Formula Z, $R_7$ and $R_8$ are each independently one of hydrogen, deuterium, a halogen-substituted alkyl group having 3 to 20 carbon atoms, an alkenyl group having 3 to 20 carbon atoms, a silyl group having 1 to 10 carbon atoms, and a carbonyl group having 1 to 10 carbon atoms, $A_{10}$, $A_{11}$, and $A_{12}$ are each independently one of hydrogen, deuterium, and an alkyl group having 1 to 5 carbon atoms, and $B_4$ is independently hydrogen, deuterium, or an alkyl group having 1 to 5 carbon atoms.

6. The compound of claim 5, wherein in the Formula 1, at least one of $R_1$, $R_2$, $R_3$, $R_4$, $R_5$, or $R_6$ is represented by Formula 6:

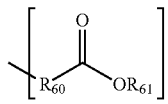

[Formula 6]

wherein in Formula 6, $R_{60}$ is a single bond or an alkyl group having 1 to 3 carbon atoms, and $R_{61}$ is an alkyl group having 1 to 10 carbon atoms.

7. The compound of claim 6, wherein in the Formula 1, Z is one of hydrogen, deuterium, an alkyl group having 1 to 5 carbon atoms, and a substituted or unsubstituted aromatic ring having 5 to 15 carbon atoms.

8. The compound of claim 1, wherein in the Formula 1, at least one of $R_1$, $R_2$, $R_3$, $R_4$, $R_5$, or $R_6$ is represented by Formula 7:

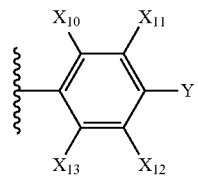

[Formula 7]

wherein in Formula 7, $X_{10}$, $X_{11}$, $X_{12}$, $X_{13}$, and Y each independently comprise one of halogen, substituted or unsubstituted alkyl having 1 to 5 carbon atoms, and a substituted or unsubstituted alkenyl group having 1 to 5 carbon atoms.

9. The compound of claim 8, wherein in the Formula 7, $X_{10}$, $X_{11}$, X12, and $X_{13}$ each independently comprise one of halogen elements, and Y comprises halogen, substituted or unsubstituted alkyl having 1 to 5 carbon atoms, or an alkenyl group having 1 to 5 carbon atoms.

10. The compound of claim 1, wherein in the Formula 1, at least one of $R_1$, $R_2$, $R_3$, $R_4$, $R_5$, or $R_6$ comprises one selected from the materials represented by Formulas 7-1, 7-2, 7-3, and 7-4:

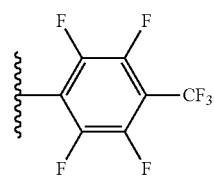

[Formula 7-1]

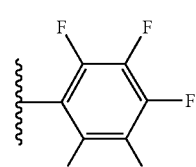

[Formula 7-2]

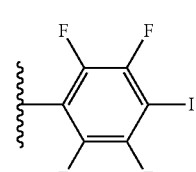

[Formula 7-3]

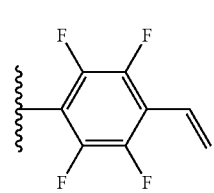

[Formula 7-4]

11. The compound of claim 1, wherein the compound has a glass transition temperature of about 100° C. to about 180° C.

12. A method for forming a pattern, the method comprising:
applying a compound represented by Formula 1 on a substrate to form a resist layer, and
patterning the resist layer,

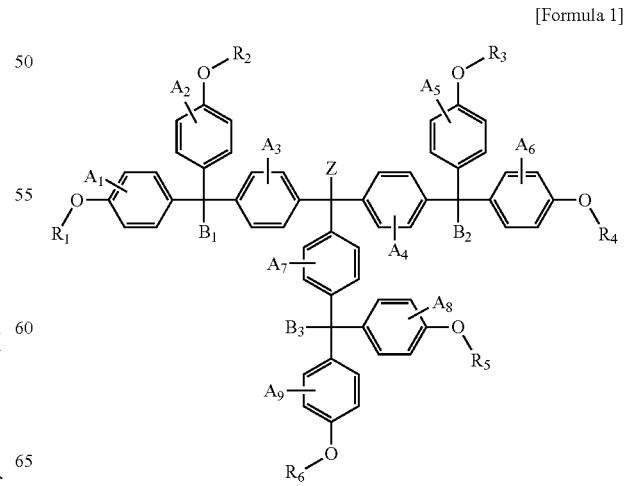

[Formula 1]

wherein in Formula 1, $A_1$, $A_2$, $A_3$, $A_4$, $A_5$, $A_6$ $A_7$, $A_8$, and $A_9$ are each independently one of hydrogen, deuterium, and an alkyl group having 1 to 5 carbon atoms, $B_1$, $B_2$, and $B_3$ are each independently one of hydrogen, deuterium, and an alkyl group having 1 to 5 carbon atoms, Z is one of hydrogen, deuterium, an alkyl group having 1 to 5 carbon atoms, and a substituted or unsubstituted hydrocarbon ring having 5 to 30 carbon atoms, and $R_1$, $R_2$, $R_3$, $R_4$, $R_5$, and $R_6$ each independently comprise one of deuterium, a halogen-substituted alkyl group having 3 to 20 carbon atoms, an alkenyl group having 3 to 20 carbon atoms, a silyl group having 1 to 10 carbon atoms, a carbonyl group having 2 to 10 carbon atoms, and a halogen-substituted hydrocarbon ring having 5 to 20 carbon atoms; provided that when at least one of $R_1$, $R_2$, $R_3$, $R_4$, $R_5$, and $R_6$ is comprise a carbonyl group having 2 to 10 carbon atoms, Z is a substituted or unsubstituted hydrocarbon ring having 5 to 30 carbon atoms.

13. The method of claim 12, wherein at least one of $R_1$, $R_2$, $R_3$, $R_4$, $R_5$, or $R_6$ in the Formula 1 comprises perhalogenated alkyl having 1 to 20 carbon atoms or perhalogenated alkyl ether halogenated alkyl having 1 to 20 carbon atoms.

14. The method of claim 13, wherein another one of $R_1$, $R_2$, $R_3$, $R_4$, $R_5$, or $R_6$ in the Formula 1 comprises an alkenyl group having 3 to 20 carbon atoms.

15. The method of claim 12, wherein the patterning of the resist layer comprises:
irradiating light on the resist layer; and
using a developing solution to remove a portion of the resist layer,
wherein the light comprises electron beams or extreme ultraviolet rays, and
the developing solution comprises a high fluorine-based solution.

16. The method of claim 12, wherein in the Formula 1, at least one of $R_1$, $R_2$, $R_3$, $R_4$, $R_5$, or $R_6$ is represented by Formula 2:

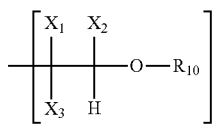

[Formula 2]

wherein in Formula 2, $X_1$, $X_2$, and $X_3$ are each independently halogen, and $R_{10}$ is perhalogenated alkyl having 1 to 18 carbon atoms or perhalogenated alkyl ether halogenated alkyl having 1 to 18 carbon atoms.

17. The method of claim 16, wherein in the Formula 1, another one of $R_1$, $R_2$, $R_3$, $R_4$, $R_5$, or $R_6$ is represented by Formula 3, Formula 4, or Formula 5:

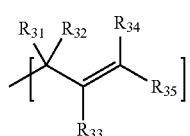

[Formula 3]

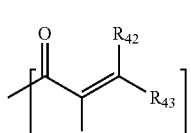

[Formula 4]

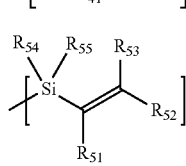

[Formula 5]

wherein in Formula 3, $R_{31}$, $R_{32}$, $R_{33}$, $R_{34}$, and $R_{35}$ are each independently hydrogen, deuterium, or an alkyl group having 1 to 3 carbon atoms, in Formula 4, $R_{41}$, $R_{42}$, and $R_{43}$ are each independently hydrogen, deuterium, or an alkyl group having 1 to 3 carbon atoms, and in Formula 5, $R_{51}$, $R_{52}$, $R_{53}$, $R_{54}$, and $R_{55}$ are each independently hydrogen, deuterium, or an alkyl group having 1 to 3 carbon atoms.

18. The method of claim 12, wherein in the Formula 1, Z is represented by Formula Z:

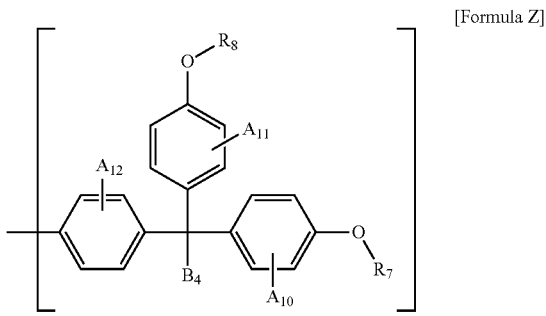

[Formula Z]

wherein in Formula Z, $R_7$ and $R_8$ are each independently one of hydrogen, deuterium, a halogen-substituted alkyl group having 3 to 20 carbon atoms, an alkenyl group having 3 to 20 carbon atoms, a silyl group having 1 to 10 carbon atoms, and a carbonyl group having 1 to 10 carbon atoms, $A_{10}$, $A_{11}$, and $A_{12}$ are each independently one of hydrogen, deuterium, and an alkyl group having 1 to 5 carbon atoms, and $B_4$ is independently hydrogen, deuterium, or an alkyl group having 1 to 5 carbon atoms.

19. The method of claim 18, wherein the material represented by the Formula 1 comprises a material represented by Formula 8I:

[Formula 8I]

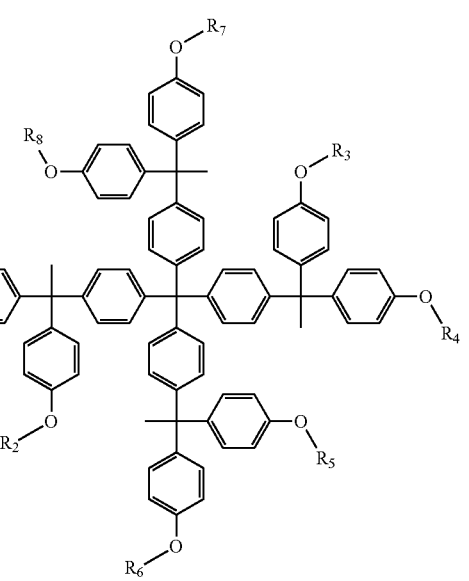

[Formula 8I]

20. The method of claim 12, wherein in the Formula 1, at least one of $R_1$, $R_2$, $R_3$, $R_4$, $R_5$, or $R_6$ is represented by Formula 7:
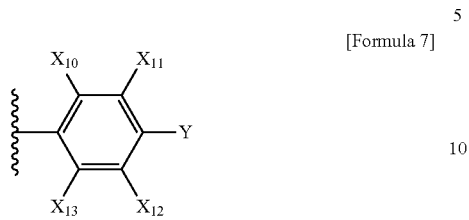
[Formula 7]
wherein in Formula 7, $X_{10}$, $X_{11}$, $X_{12}$, $X_{13}$, and Y each independently comprise one of halogen, substituted or unsubstituted alkyl having 1 to 5 carbon atoms, and a substituted or unsubstituted alkenyl group having 1 to 5 carbon atoms.
* * * * *